(12) United States Patent
Ching et al.

(10) Patent No.: US 9,935,199 B2
(45) Date of Patent: Apr. 3, 2018

(54) FINFET WITH SOURCE/DRAIN STRUCTURE

(71) Applicant: Taiwan Semiconductor Manufacturing Company, Ltd., Hsin-Chu (TW)

(72) Inventors: Kuo-Cheng Ching, Hsinchu County (TW); Ching-Wei Tsai, Hsin-Chu (TW); Chih-Hao Wang, Hsinchu County (TW); Ying-Keung Leung, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 106 days.

(21) Appl. No.: 14/997,372

(22) Filed: Jan. 15, 2016

(65) Prior Publication Data

US 2017/0207126 A1 Jul. 20, 2017

(51) Int. Cl.
*H01L 29/76* (2006.01)
*H01L 29/94* (2006.01)
(Continued)

(52) U.S. Cl.
CPC .......... *H01L 29/785* (2013.01); *H01L 21/764* (2013.01); *H01L 21/823418* (2013.01);
(Continued)

(58) Field of Classification Search
CPC ..... H01L 21/823431; H01L 21/823425; H01L 29/6656; H01L 29/66553; H01L 29/0653;
(Continued)

(56) References Cited

U.S. PATENT DOCUMENTS 7,449,753 B2   11/2008   Wang et al.
8,039,179 B2   10/2011   Shieh et al.
(Continued)

OTHER PUBLICATIONS

U.S. Appl. No. 14/885,115, entitled "Method of Tuning Source/Drain Proximity for Input/Output Device Reliability Enhancement", Kuo-Cheng Ching et al., filed Oct. 16, 2015; 83 pps.
(Continued)

*Primary Examiner* — Shouxiang Hu
(74) *Attorney, Agent, or Firm* — Haynes and Boone, LLP

(57) ABSTRACT

A semiconductor device includes a substrate including a first fin element, a second fin element, and a third fin element. A first source/drain epitaxial feature is disposed over the first and second fin elements. A first portion of the first source/drain epitaxial feature disposed on the first fin element and a second portion of the first source/drain epitaxial feature disposed on the second fin element merge at a merge point. A second source/drain epitaxial feature is disposed over the third fin element. A first sidewall of the second source/drain epitaxial feature interfaces a first third-fin spacer disposed along a first sidewall of the third fin element. A second sidewall of the second source/drain epitaxial feature interfaces a second third-fin spacer disposed along a second sidewall of the third fin element. The merge point has a first height less than a second height of the first third-fin spacer.

20 Claims, 62 Drawing Sheets

(51) Int. Cl.

| | | |
|---|---|---|
| *H01L 29/78* | (2006.01) | |
| *H01L 21/8234* | (2006.01) | |
| *H01L 29/08* | (2006.01) | |
| *H01L 29/417* | (2006.01) | |
| *H01L 29/06* | (2006.01) | |
| *H01L 27/088* | (2006.01) | |
| *H01L 29/66* | (2006.01) | |
| *H01L 29/49* | (2006.01) | |
| *H01L 21/764* | (2006.01) | |
| *H01L 27/12* | (2006.01) | |
| *H01L 27/11* | (2006.01) | |

(52) U.S. Cl.
CPC ........... *H01L 21/823425* (2013.01); *H01L 21/823431* (2013.01); *H01L 27/0886* (2013.01); *H01L 27/1211* (2013.01); *H01L 29/0653* (2013.01); *H01L 29/0847* (2013.01); *H01L 29/41791* (2013.01); *H01L 29/4991* (2013.01); *H01L 29/6656* (2013.01); *H01L 29/66545* (2013.01); *H01L 29/66553* (2013.01); *H01L 29/66795* (2013.01); *H01L 29/7848* (2013.01); *H01L 27/1104* (2013.01)

(58) Field of Classification Search
CPC .......... H01L 29/41791; H01L 29/0847; H01L 29/785; H01L 27/0886; H01L 27/1104; H01L 29/66795; H01L 29/7848; H01L 29/66545; H01L 27/1211; H01L 29/4991
USPC .................................................. 257/401, 623
See application file for complete search history.

(56) References Cited

U.S. PATENT DOCUMENTS

| | | | |
|---|---|---|---|
| 8,202,681 B2 | 6/2012 | Lin et al. | |
| 8,728,332 B2 | 5/2014 | Lin et al. | |
| 8,822,243 B2 | 9/2014 | Yan et al. | |
| 9,153,496 B2* | 10/2015 | Wong | H01L 21/823418 |
| 2006/0091468 A1 | 5/2006 | Liaw | |
| 2011/0073952 A1 | 3/2011 | Kwok et al. | |
| 2011/0281208 A1 | 11/2011 | Lin et al. | |
| 2012/0278776 A1 | 11/2012 | Lei et al. | |
| 2013/0095629 A1* | 4/2013 | Ando | H01L 29/785 438/299 |
| 2013/0181297 A1 | 7/2013 | Liaw | |
| 2013/0295769 A1 | 11/2013 | Lin et al. | |
| 2013/0320451 A1 | 12/2013 | Liu et al. | |
| 2014/0054650 A1 | 2/2014 | Colinge | |
| 2014/0193974 A1 | 7/2014 | Lee et al. | |
| 2014/0215421 A1 | 7/2014 | Chen et al. | |
| 2014/0242794 A1 | 8/2014 | Lin et al. | |
| 2014/0264760 A1 | 9/2014 | Chang et al. | |
| 2014/0264899 A1 | 9/2014 | Chang et al. | |
| 2014/0273442 A1 | 9/2014 | Liu et al. | |
| 2014/0273446 A1 | 9/2014 | Huang et al. | |
| 2015/0029785 A1 | 1/2015 | Liaw | |
| 2015/0079750 A1 | 3/2015 | Wang et al. | |
| 2015/0214366 A1 | 7/2015 | Chang et al. | |
| 2015/0318399 A1* | 11/2015 | Jeong | H01L 29/7853 257/401 |
| 2015/0372144 A1 | 12/2015 | Fang et al. | |
| 2016/0064387 A1* | 3/2016 | Jeong | H01L 27/1104 257/401 |
| 2017/0077222 A1* | 3/2017 | Lee | H01L 21/283 |

OTHER PUBLICATIONS

U.S. Appl. No. 14/832,778, entitled "FinFET With Source/Drain Structure and Methods of Fabrication Thereof", Kuo-Cheng Ching et al., filed Aug. 21, 2015; 60 pps.

* cited by examiner

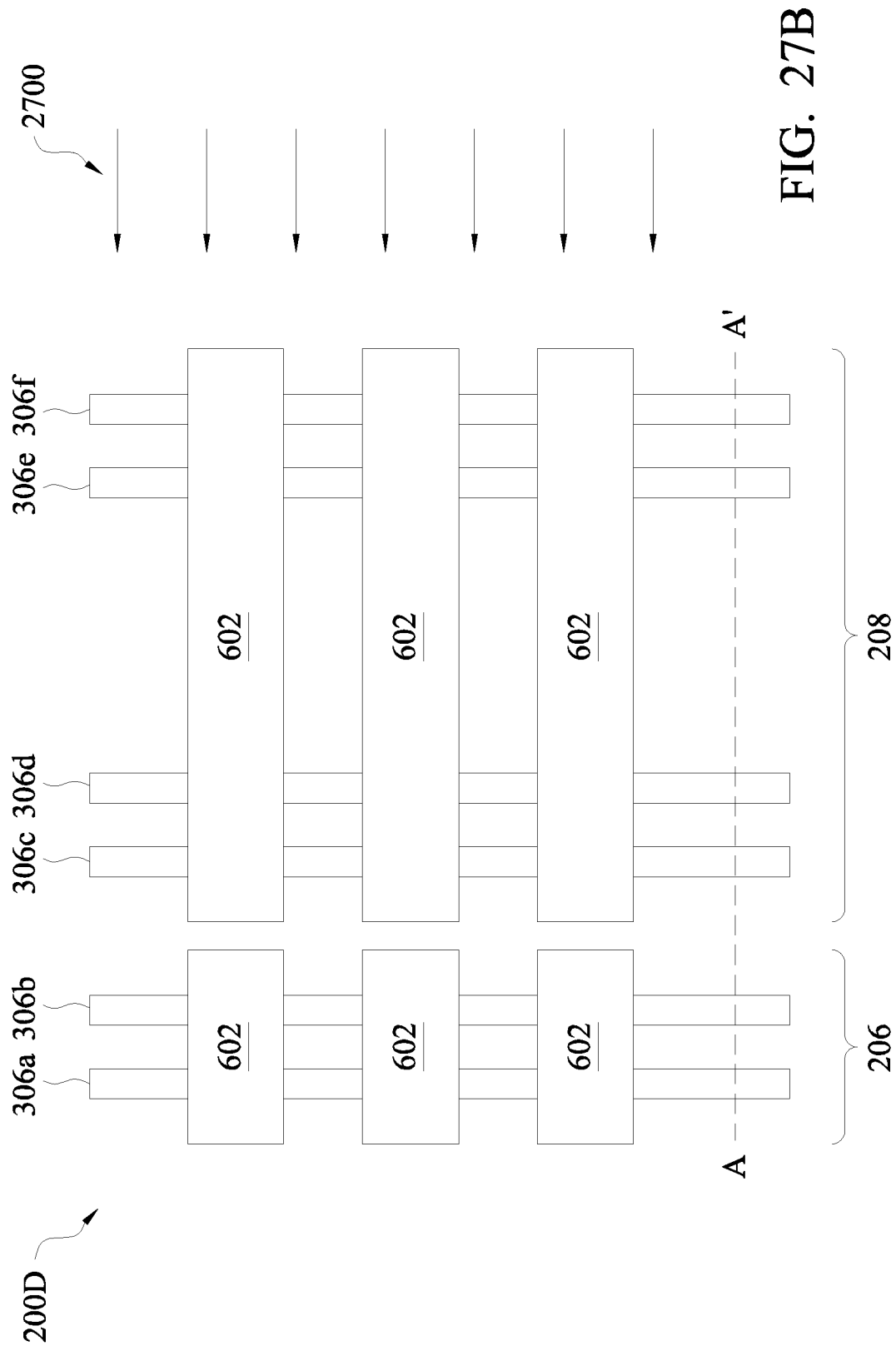

FINFET WITH SOURCE/DRAIN STRUCTURE

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. FinFETs are compatible with conventional complementary metal-oxide-semiconductor (CMOS) processes and their three-dimensional structure allows them to be aggressively scaled while maintaining gate control and mitigating SCEs. However, conventional FinFET devices may still have certain drawbacks. For example, due to lateral growth of epitaxial source/drain features of the FinFET devices, increased distances between neighboring fins may be required in order to avoid shorting with neighboring FinFET devices. In high density static random access memory (SRAM) cells where the distances between neighboring fins may be a dominant factor in determining cell density, the increased distances between neighboring fins may limit the density of the SRAM cells. For further example, the same substrate may include FinFETs using different numbers of fins, or regions having different density requirements, and epitaxial growth control of the source/drain features for FinFETs can be challenging.

Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 27B is a simplified top view, corresponding to the isometric view of FIG. 27A, of an embodiment of the semiconductor structure 200D according to aspects of the method of FIGS. 1A, 1B, 1C, and 1D.

DETAILED DESCRIPTION

Figure 1A:
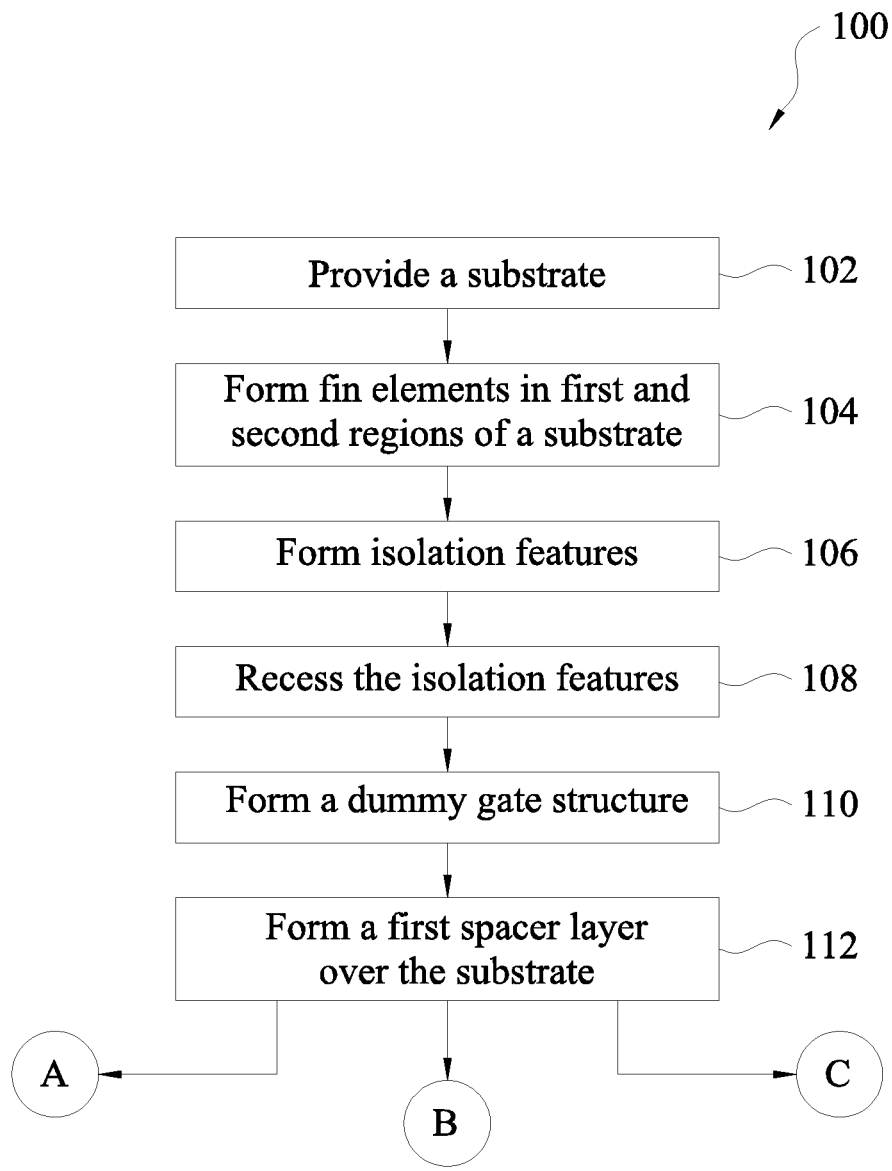
FIGS. 1A, 1B, 1C, and 1D are flow charts of a method of fabricating FinFET devices or portion thereof according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of multi-gate transistors or fin-type multi-gate transistors referred to herein as FinFET devices. Such a device may include a P-type metal-oxide-semiconductor (PMOS) FinFET device or an N-type metal-oxide-semiconductor (NMOS) FinFET device. In various embodiments, a FinFET device may include any number of fin elements. For example, a single-fin FinFET device may include only one fin element, a two-fin FinFET device may include two fin elements, and a multiple-fin FinFET device may include multiple fin elements.

Illustrated in FIGS. 1A, 1B, 1C, and 1D is a method 100 of semiconductor fabrication including fabricating FinFET devices having epitaxy source/drain features. It is understood that the method 100 includes steps having features of a complementary metal-oxide-semiconductor (CMOS) technology process flow and thus, are only described briefly herein. Additional steps may be performed before, after, and/or during the method 100.

Referring to FIG. 1A, the method 100 begins at block 102 where a substrate is provided. Referring to the example of FIG. 2, in an embodiment of block 102, a semiconductor structure including a substrate 202 is provided. In some embodiments, the substrate 202 may be a semiconductor substrate such as a silicon substrate. In some embodiments, the substrate 202 may include various layers, including conductive or insulating layers, formed on a semiconductor substrate. In some embodiments, the substrate 202 is a contiguous silicon substrate. The substrate 202 may include various doping configurations depending on design requirements as is known in the art. The substrate 202 may also include other semiconductors such as germanium, silicon carbide (SiC), silicon germanium (SiGe), or diamond. Alternatively, the substrate 202 may include a compound semiconductor and/or an alloy semiconductor. Further, the substrate 202 may optionally include an epitaxial layer (epi-layer), may be strained for performance enhancement, may include a silicon-on-insulator (SOI) structure, and/or have other suitable enhancement features.

Figure 2:
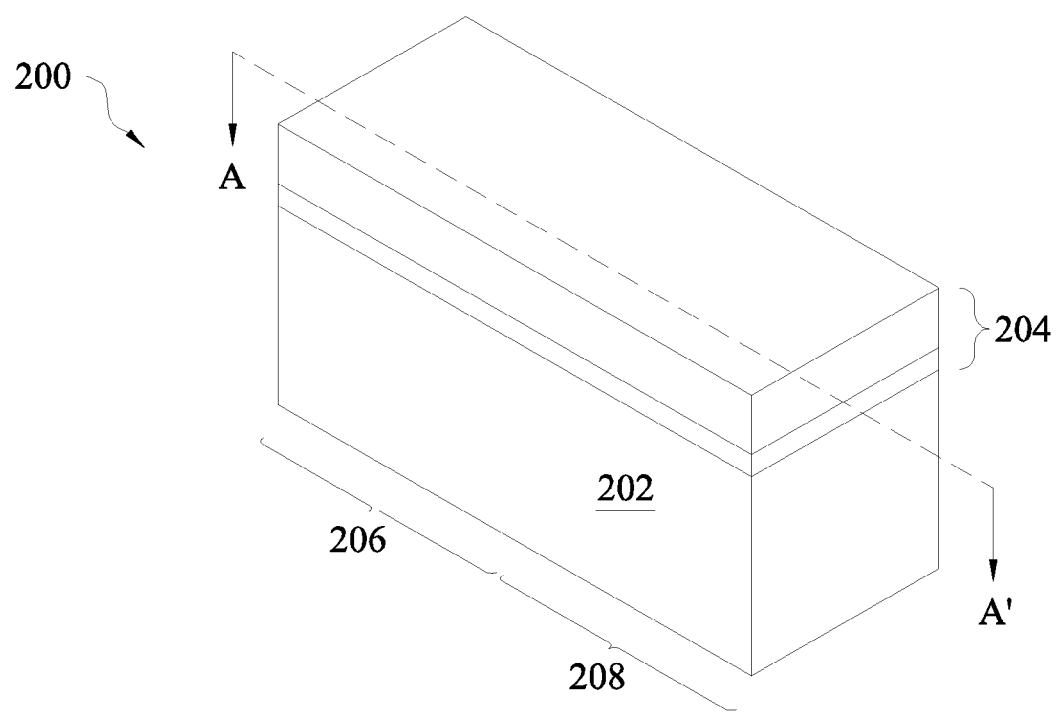
FIGS. 2, 3A, 4A, 5A, 6A, and 7A are isometric views of an embodiment of a semiconductor structure 200 at different stages of fabrication according to aspects of the method of FIGS. 1A, 1B, 1C, and 1D.

In the example of FIG. 2, in an embodiment of block 102, the substrate 202 includes a first region 206 and a second region 208, wherein each of the first region 206 and the second region 208 may include subsequently formed FinFETs. In some embodiments, the first region 206 and the second region 208 may include FinFETs used in different types of devices (e.g., logic devices including a logic gate such as NAND, NOR, and/or inverter, SRAM cells). For example, the first region 206 may be a core region including various logic devices. For further example, the second region 208 may be an SRAM region including SRAM cells. In some embodiments, neighboring fin elements in the first region 206 and the second region 208 may have different fin distances. For example, neighboring fin elements in the first region 206 may have a distance less than the distance between neighboring fin elements in the second region 208.

In some embodiments, the substrate 202 further includes a hard mask layer 204 disposed thereon. The hard mask layer 204 may include an oxide layer (e.g., a pad oxide layer that may include $SiO_2$) and nitride layer (e.g., a pad nitride layer that may include $Si_3N_4$) formed over the oxide layer. In some examples, the hard mask layer 204 includes thermally grown oxide, CVD-deposited oxide, and/or ALD-deposited oxide. In some embodiments, the hard mask layer 204 includes a nitride layer deposited by CVD or other suitable technique. The hard mask layer 204 may be used to protect portions of the substrate 202 and/or used to define a pattern (e.g., fin elements) illustrated below. By way of example, the oxide layer of the hard mask layer 204 may have a thickness of between approximately 5 nanometers (nm) and approximately 40 nm. In some embodiments, the nitride layer of the hard mask layer 204 may have a thickness of between approximately 20 nm and approximately 160 nm.

In an embodiment, the method 100 includes at block 102 performing an anti-punch through (APT) implant(s) and/or other fabrication processes to provide a suitable substrate for transistor formation.

Figure 3A:
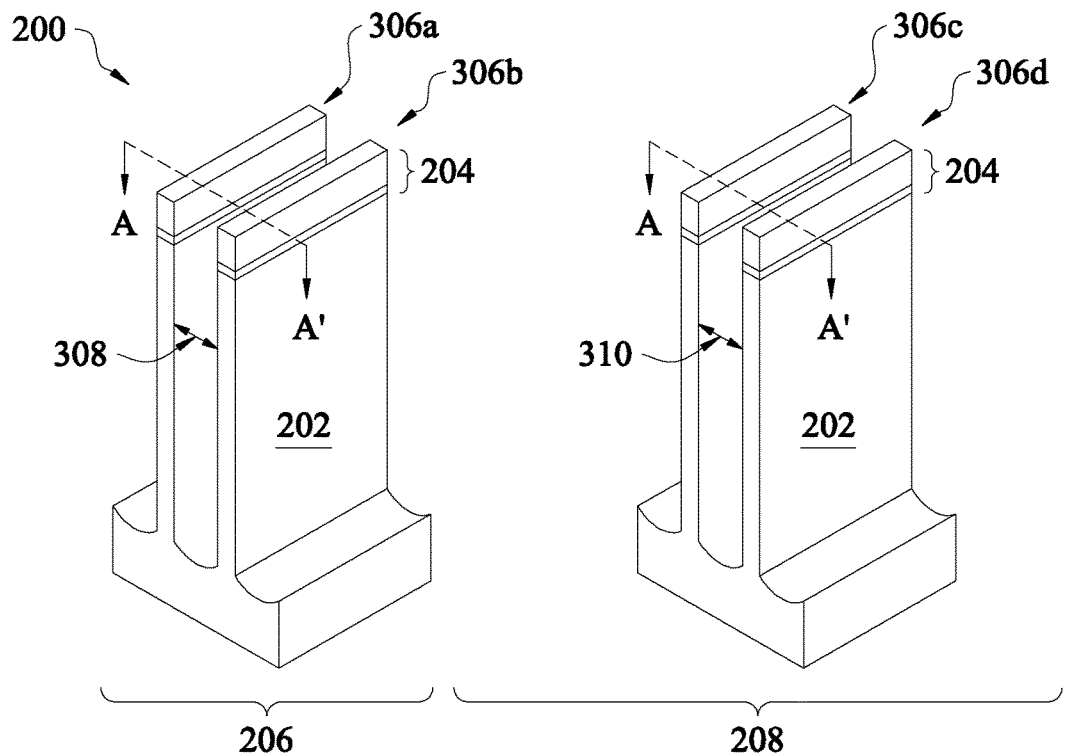
Figure 3B:
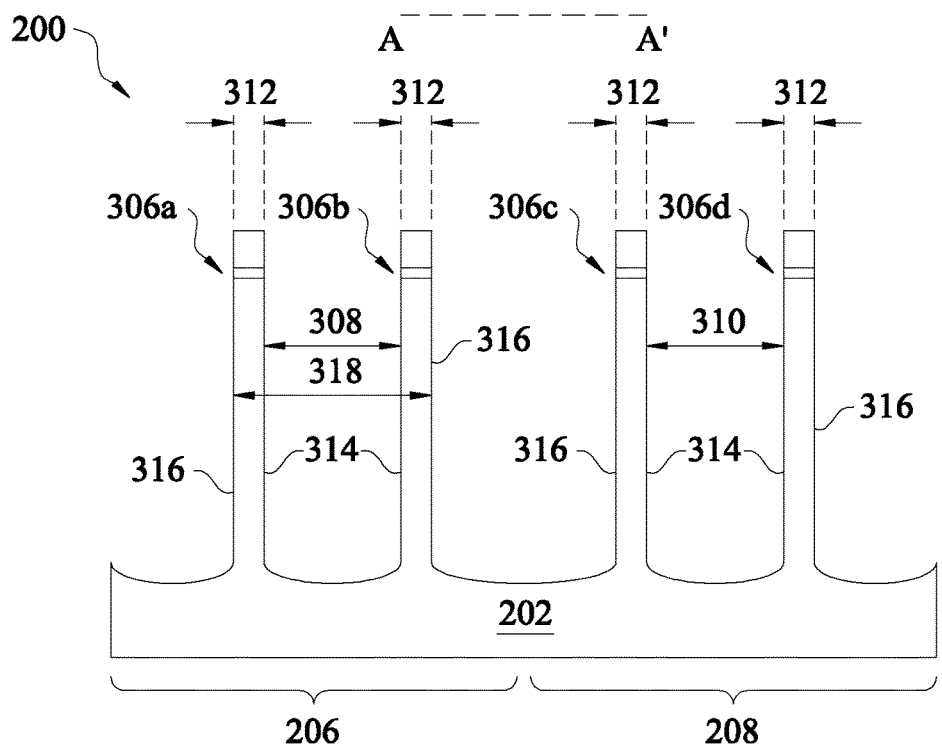
FIGS. 3B, 4B, 5B, 6B, and 7B are cross-sectional views, corresponding to the isometric views of FIGS. 3A, 4A, 5A, 6A, and 7A, of an embodiment of the semiconductor structure 200 according to aspects of the method of FIGS. 1A, 1B, 1C, and 1D.

Referring to FIG. 1A, the method 100 then proceeds to block 104 where fin elements, used for subsequent FinFET formation, are formed on the substrate. With reference to the examples of FIGS. 3A and 3B, in an embodiment of block 104, a plurality of fin elements 306a, 306b, 306c, and 306d extending from the substrate 202 are formed. Specifically, in the example illustrated in FIGS. 3A and 3B, two fin elements 306a and 306b extend from the first region 206, and two fin elements 306c and 306d extend from the second region 208. While the exemplary FIGS. 3A and 3B illustrate two fin elements in the first region 206 and two fin elements in the second region 208, any number of fin elements is possible in each of the first region 206 and the second region 208, and any number of fin elements may be associated with a given gate structure.

In some embodiments, each of the fin elements 306a, 306b, 306c, and 306d may have two sidewalls 314 and 316. For adjacent fin elements (e.g., fin elements 306a and 306b), sidewalls of the adjacent fin elements facing each other (e.g., sidewalls 314 of the fin elements 306a and 306b) may be referred to as inner sidewalls of the adjacent fin elements. Two sidewalls facing away from the adjacent fin elements (e.g., sidewalls 316 of the fin elements 306a and 306b) may be referred to as outer sidewalls of the adjacent fin elements. A distance (also referred to as a fin distance) between the inner sidewalls of two adjacent fin elements may be controlled (e.g., by controlling the pattern in the hard mask layer 204) so as to result in a desired fin distance between the two adjacent fin elements. As illustrated in FIGS. 3A and 3B, in some embodiments, the adjacent fin elements 306a and 306b have a fin distance 308 extending between inner sidewalls 314 of the fin elements 306a and 306b, and the adjacent fin elements 306c and 306d have a fin distance 310 extending between inner sidewalls 314 of the fin elements 306c and 306d. In an embodiment, the fin distance 308 is between approximately 30 nanometers (nm) and approximately 60 nm. In an embodiment, the fin distance 310 is between approximately 30 nm and approximately 60 nm. In an embodiment, the fin distance 310 is substantially equal to the fin distance 308. In an embodiment, the fin distance 310 is greater than the fin distance 308 (e.g., by more than about 20%). In some embodiments, the adjacent fin elements 306a and 306b may have a distance 318 between outer sidewalls 316 of the fin elements 306a and 306b. In an embodiment, the distance 318 is between approximately 40 nm and approximately 90 nm.

In some embodiments, a fin width of each of the fin elements is controlled (e.g., by controlling the pattern in the hard mask layer 204) so as to result in a desired fin width 312 of each of the fin elements 306a, 306b, 306c, and 306d. In an embodiment, the fin width 312 is between approximately 5 nm and approximately 15 nm. The fin elements 306a, 306b, 306c, and 306d may have fin widths substantially similar the same or different from each other.

The fin elements 306a, 306b, 306c and 306d, as described with reference to the substrate 202, may include silicon or another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, InGaAs, GaInP, and/or GaInAsP; or combinations thereof. The fin elements 306a, 306b, 306c, and 306d may be fabricated using suitable processes including photolithography and etching processes. The photolithography process may include forming a photoresist layer over the substrate 202 (e.g., over the hard mask layer 204), exposing the resist to a pattern, performing post-exposure bake processes, and developing the resist to form a masking element including the resist. In some embodiments, patterning the resist to form the masking element may be performed using an electron beam (e-beam) lithography process. The masking element may then be used to protect regions of the substrate 202, and layers formed thereupon, while an etching process forms trenches in unprotected regions through the patterned hard mask layer 204 and into the substrate 202, thereby leaving the plurality of extending fin elements 306a, 306b, 306c and 306d. The trenches between fin elements 306a, 306b, 306c, and 306d may be etched using a dry etching (e.g., reactive ion etching), a wet etching, and/or other suitable processes. Numerous other embodiments of methods to form the fin elements on the substrate may also be used.

Figure 4A:
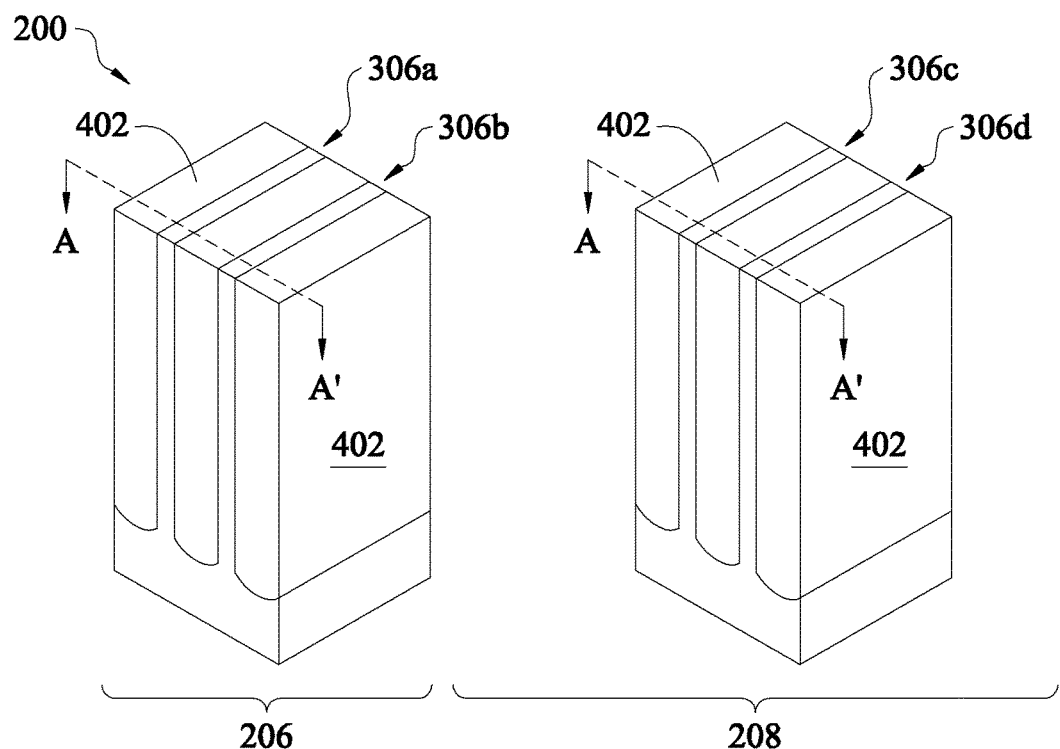
Figure 4B:
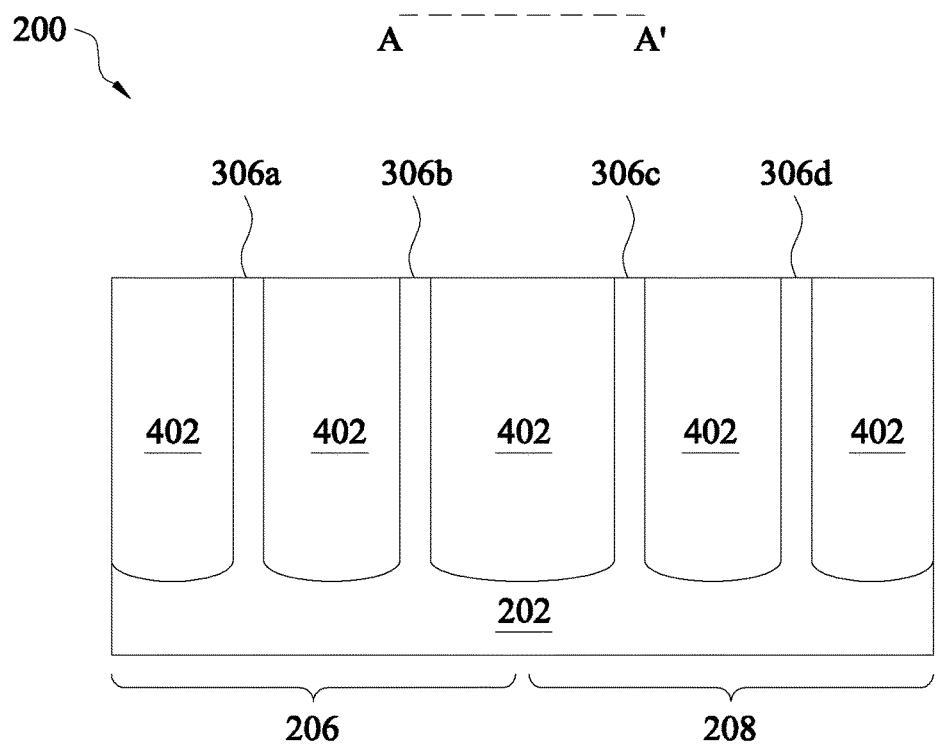

Referring to FIGS. 1A, 4A, and 4B, the method 100 then proceeds to block 106 where isolation features are formed between the fin elements. The isolation features may be shallow trench isolation (STI) features. With reference to the example of FIGS. 4A and 4B, STI features 402 are disposed between the fin elements 306a, 306b, 306c, and 306d. By way of example, in some embodiments, a dielectric layer is first deposited over the substrate 202, filling the trenches interposing the fin elements 306a, 306b, 306c, and 306d with the dielectric material. In some embodiments, the dielectric layer may include SiO$_2$, silicon nitride, silicon oxynitride, fluorine-doped silicate glass (FSG), a low-k dielectric, combinations thereof, and/or other suitable materials known in the art. In various examples, the dielectric layer may be deposited by a chemical vapor deposition (CVD) process, a subatmospheric CVD (SACVD) process, a flowable CVD process, an atomic layer deposition (ALD) process, a physical vapor deposition (PVD) process, and/or other suitable process. In some embodiments, after deposition of the dielectric layer, the semiconductor structure 200 may be annealed, for example, to improve the quality of the dielectric layer. In some embodiments, the dielectric layer (and subsequently formed STI features 402) may include a multi-layer structure, for example, having one or more liner layers.

In forming the STI features, after deposition of the dielectric layer(s), the deposited dielectric layer(s) may be thinned and planarized, for example by a chemical mechanical polishing (CMP) process. The CMP process may planarize the top surface thereby forming STI features 402 as illustrated in FIGS. 4A and 4B. As illustrated in FIGS. 4A and 4B, in some embodiments, the CMP process used to planarize the top surface of the semiconductor structure 200 and form the STI features 402 may also serve to remove the hard mask layer 204 from each of fin elements 306a, 306b, 306c and 306d. In some embodiments, removal of the hard mask layer 204 may alternately be performed by using a suitable etching process (e.g., dry or wet etching).

Figure 5A:
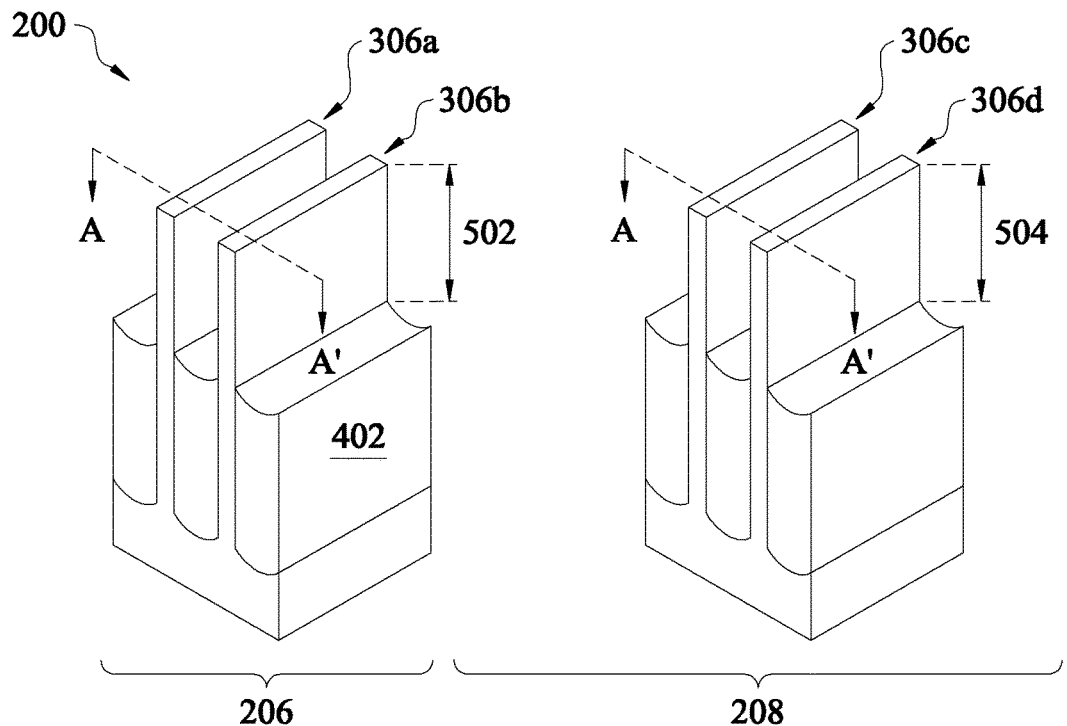
Figure 5B:
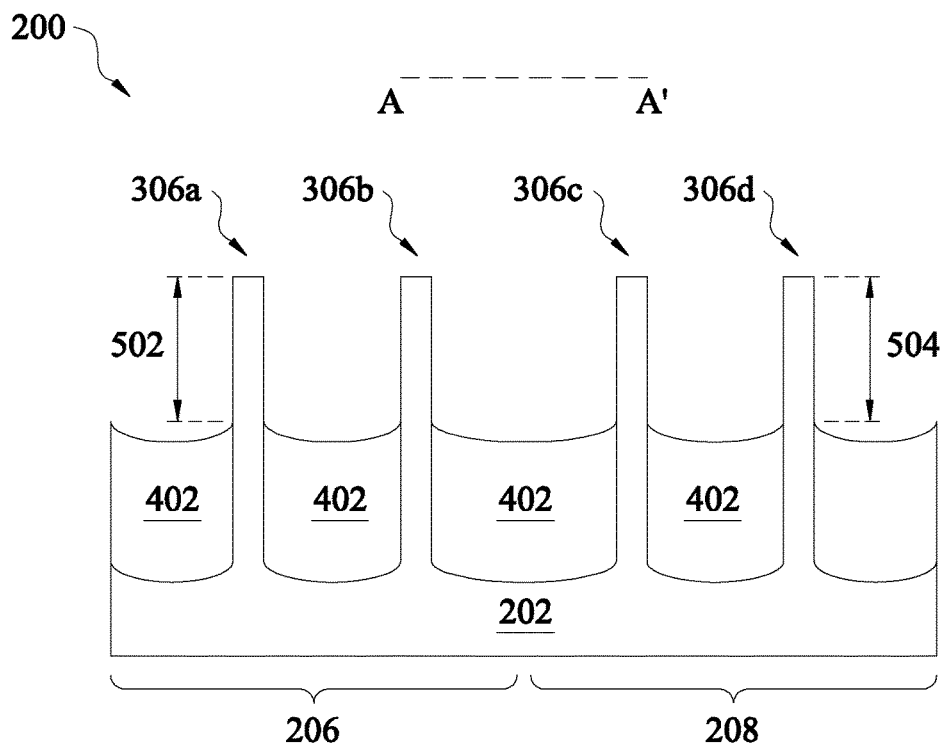

Referring to FIGS. 1A, 5A, and 5B, the method 100 then proceeds to block 108 where the STI features are recessed to expose the fin elements. Referring to the example of FIGS. 5A and 5B, the STI features 402 have been recessed to provide fin elements 306a, 306b, 306c, and 306d respectively, extending above a top surface of the STI features 402. In some embodiments, the recessing process may include a dry etching process, a wet etching process, and/or a combination thereof. In some embodiments, a recessing depth is controlled (e.g., by controlling an etching time) so as to result in a desired height of the exposed upper portion of the fin elements 306a, 306b, 306c, and 306d respectively. For example, the fin elements 306a and 306b in the first region 206 may have a height 502, and the fin elements 306c and 306d in the second region 208 may have a height 504. In an embodiment, the height 502 is between approximately 30 nm and approximately 60 nm. In an embodiment, the height 504 is between approximately 30 nm and approximately 60 nm. The height 504 may be substantially equal to the height 502.

Figure 6A:
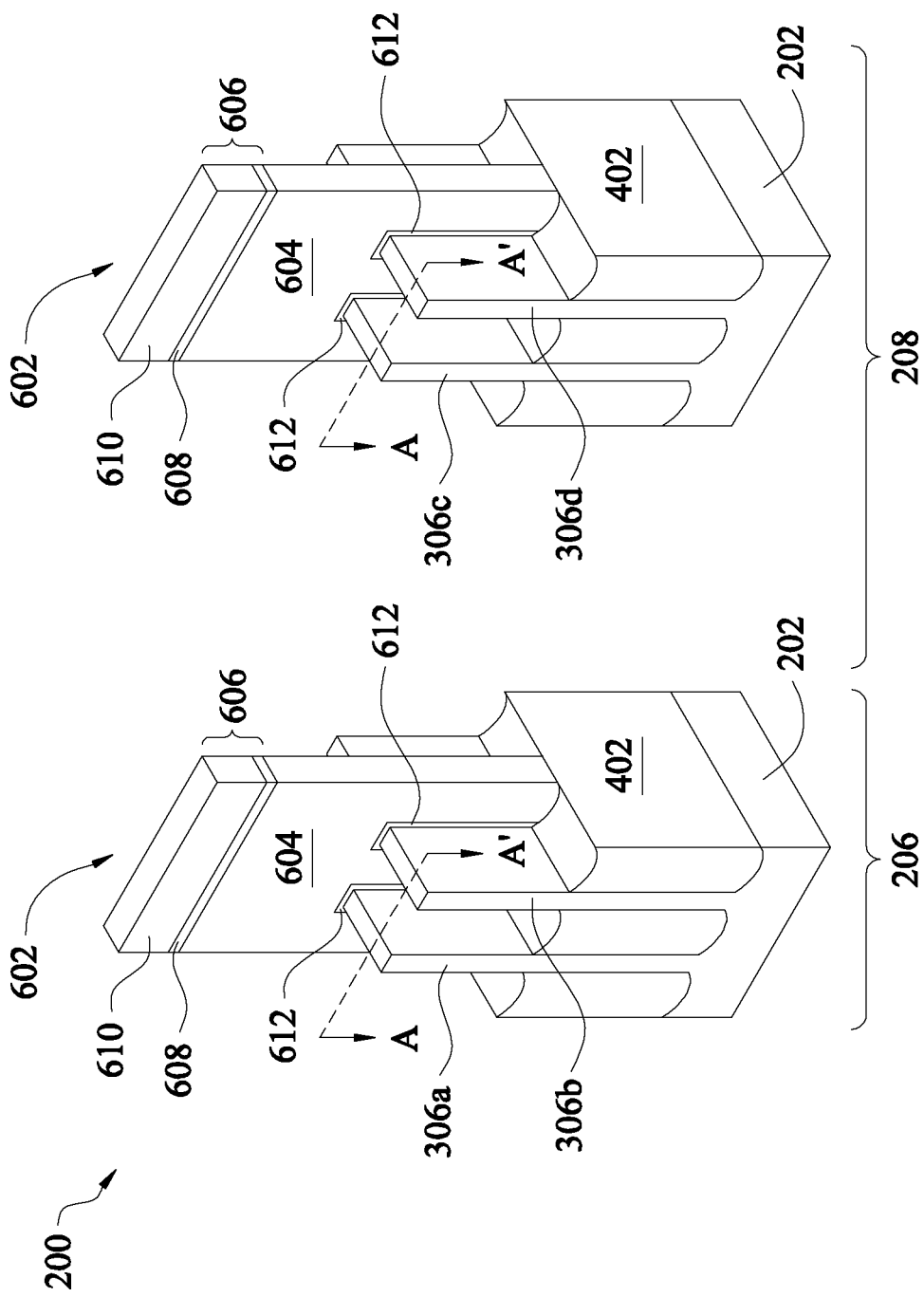
Figure 6B:
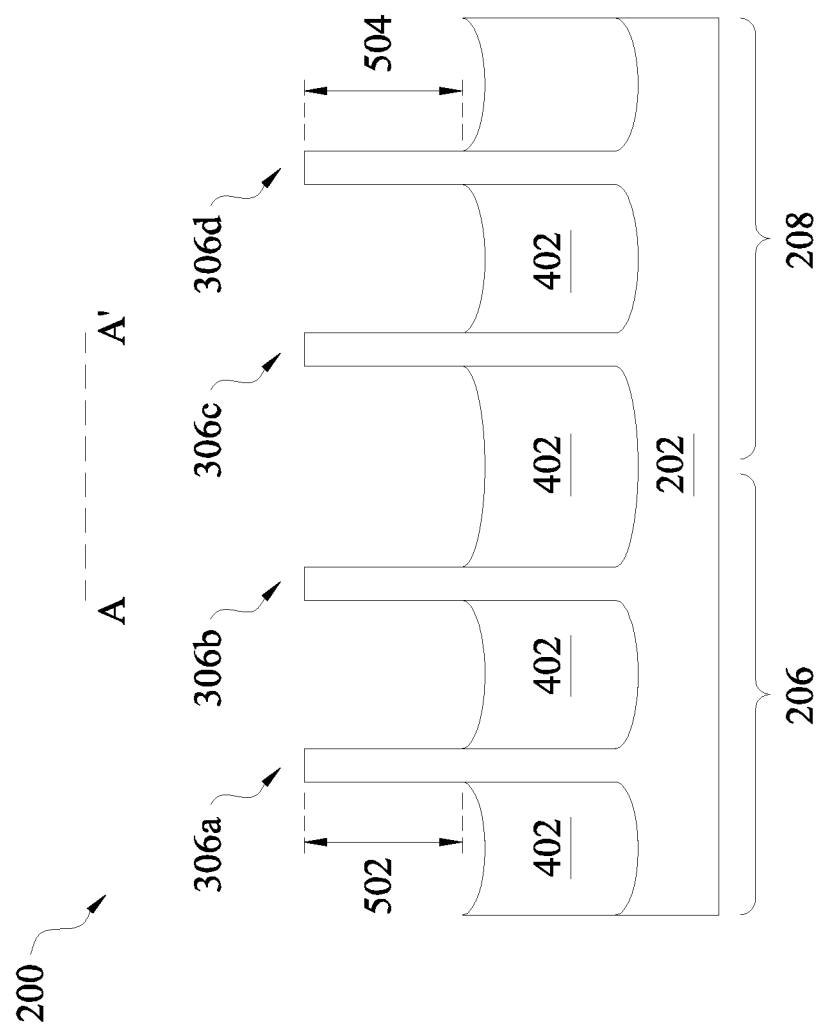

Referring to FIGS. 1A, 6A, and 6B, the method 100 then proceeds to block 110 where a dummy (also referred to as sacrificial) gate structure is formed on the fin elements. The dummy gate structure may be subsequently removed and replaced with a functional gate as discussed below, referred to as a replacement gate process. While the present disclosure includes examples of this replacement gate method, one can recognize other embodiments where a replacement gate process is not employed and a functional gate is formed in block 110.

Referring now to the example of FIG. 6A, a gate stack 602 is formed over the substrate 202 and is at least partially disposed over the fin elements 306a, 306b, 306c, and 306d respectively. The portion of the fin elements 306a, 306b, 306c, and 306d directly underlying the gate stack 602 may be referred to as the channel regions. The gate stack 602 may also define source/drain regions of the fin elements 306a, 306b, 306c and 306d, for example, as the regions of the respective fin elements 306a, 306b, 306c, and 306d adjacent to and on opposing sides of the channel regions of the fin elements 306a, 306b, 306c and 306d.

In some embodiments, the dummy gate stack 602 includes a dielectric layer 612, an electrode layer 604, and a hard mask layer 606 which may include multiple layers (e.g., an oxide layer 608 and a nitride layer 610). The gate stack 602 is formed by various process steps such as layer deposition, patterning, etching, as well as other suitable processing steps. Exemplary layer deposition processes includes CVD (including both low-pressure CVD and plasma-enhanced CVD), PVD, ALD, thermal oxidation, e-beam evaporation, or other suitable deposition techniques, or combinations thereof. In forming the gate stack for example, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods.

In some embodiments, the dielectric layer 612 may also be referred to as a dummy insulating layer or a dummy oxide layer; however, the constraint to an oxide composition is not particularly required. In an embodiment, the dielectric layer 612 also forms an I/O oxide. The dielectric layer 612 may be formed by atomic layer deposition (ALD) and/or other suitable processes. As illustrated in the examples of FIG. 6A, a dielectric layer 612 is disposed on the fin elements 306a, 306b, 306c and 306d and/or on the surface of the STI features 402. In some embodiments, the dielectric layer 612 is removed from the source/drain regions of the fin elements 306a, 306b, 306c and 306d. In some embodiments, the dielectric layer 612 is removed from the surface of the STI features 402. The dielectric layer 612 may be removed by a suitable selective etching process such as a dry etching process or other suitable etching process. Referring to the example of FIG. 6A, the dielectric layer 612 has been removed from the source/drain regions of the fin elements 306a, 306b, 306c and 306d. In some embodiments, the dielectric layer 612 may include SiO$_2$. However, in other embodiments, a dielectric layer 612 having other compositions is possible, including, for example, silicon nitride, a high-K dielectric material or other suitable material. In various examples, the dielectric layer 612 may be deposited by a CVD process, a subatmospheric CVD (SACVD) process, a flowable CVD process, an ALD process, a PVD process, or other suitable process. By way of example, the dielectric layer 612 may be used to prevent damage to the fin elements 306a, 306b, 306c, and 306d by subsequent processing (e.g., subsequent formation of the electrode layer 604).

In some embodiments, the electrode layer 604 of the gate stack 602 may include polycrystalline silicon (polysilicon). In some embodiments, the hard mask layer 606 includes an oxide layer 608 such as a pad oxide layer that may include SiO$_2$. In some embodiments, hard mask layer 606 includes the nitride layer 610 such as a pad nitride layer that may include Si$_3$N$_4$, silicon oxynitride or alternatively include silicon carbide.

Figure 7A:
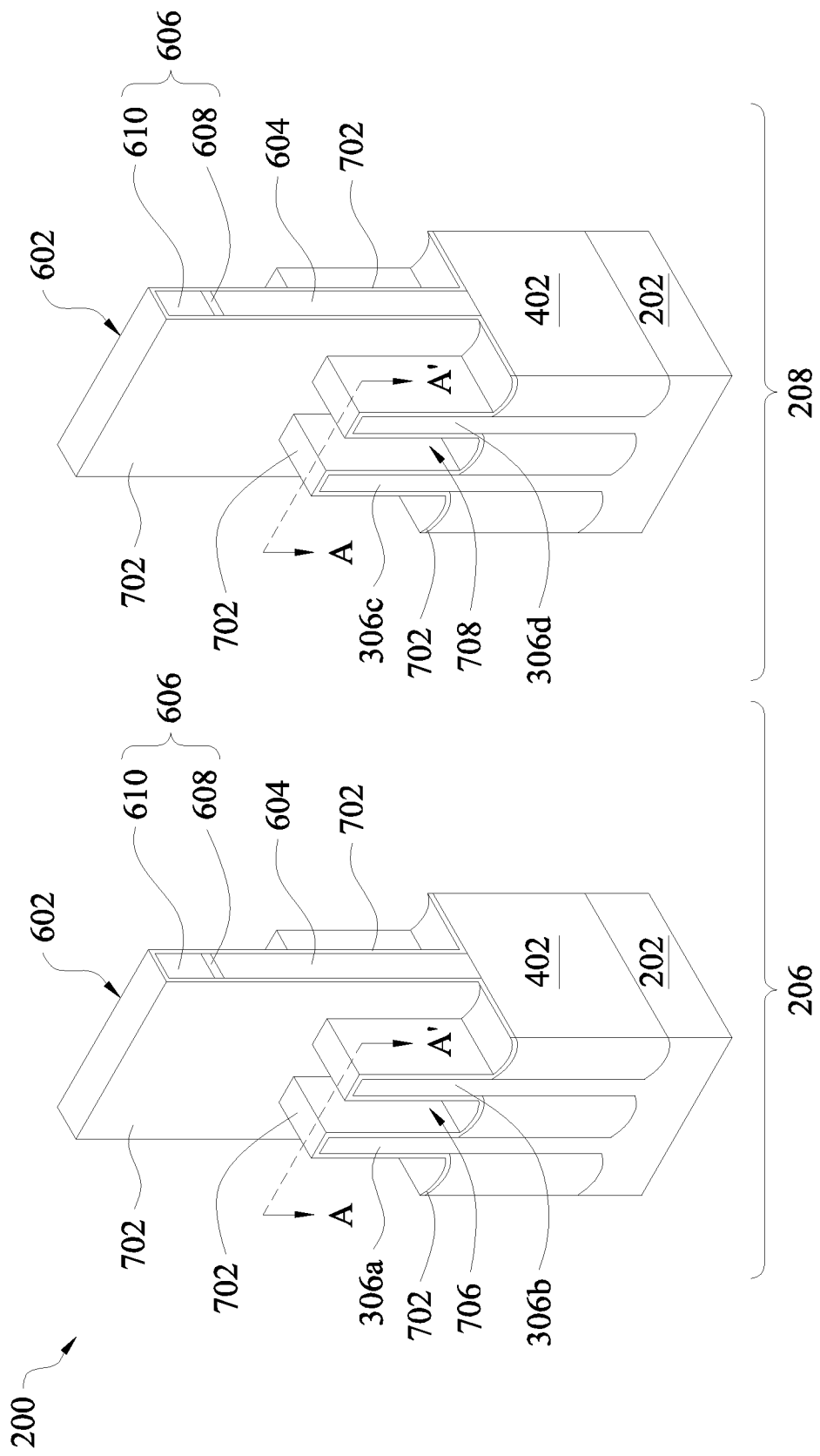
Figure 7B:
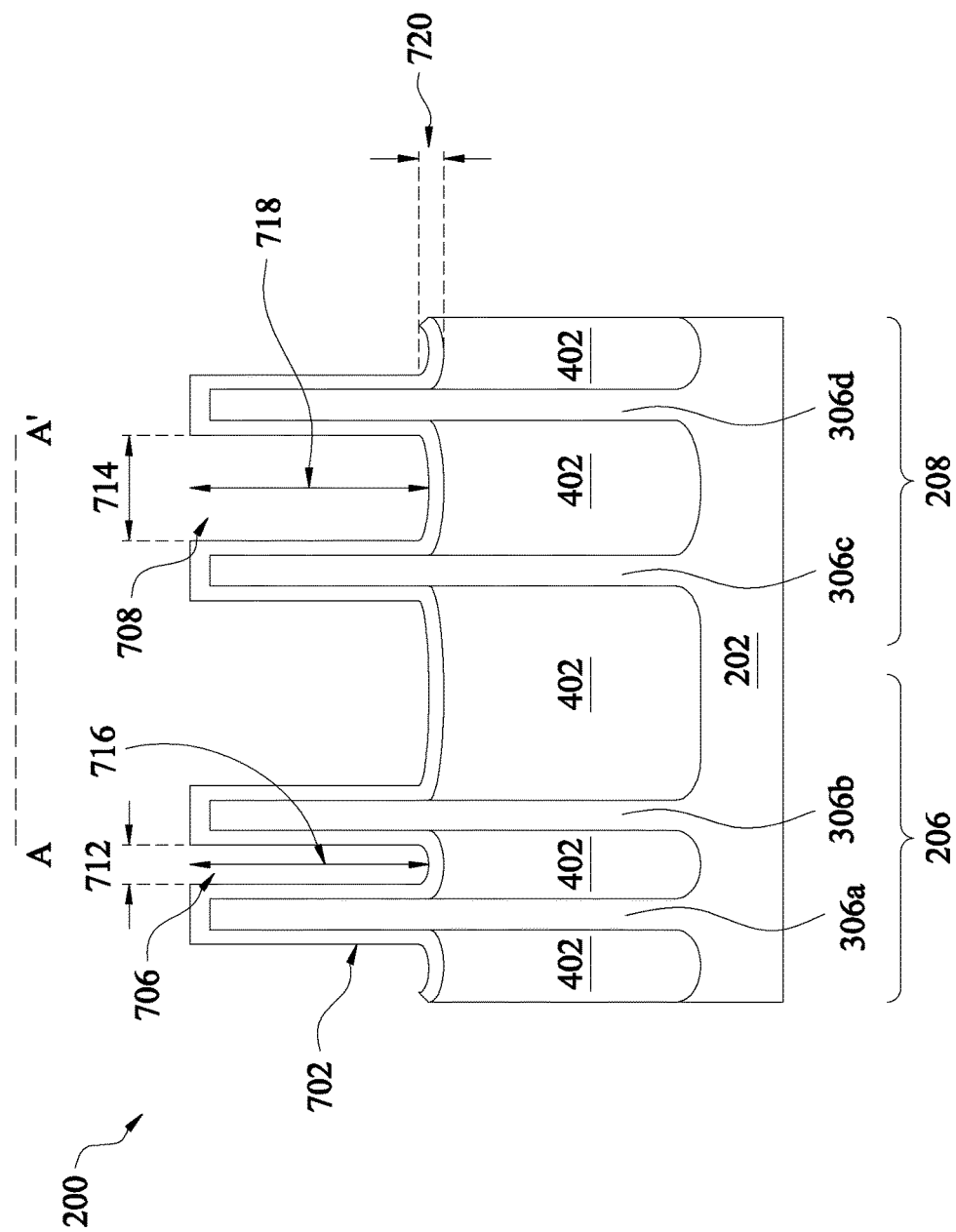

Referring to FIGS. 1A, 7A, and 7B, the method 100 then proceeds to block 112 where a first spacer layer is formed on the substrate including the sidewalls of the dummy gate structure. The first spacer layer may be a conformal dielectric layer formed on the substrate. By way of example, the first spacer layer may include a dielectric material such as silicon oxide, silicon nitride, silicon carbide, silicon oxynitride, SiCN films, silicon oxycarbide, SiOCN films, and/or combinations thereof. In some embodiments, the first spacer layer includes multiple layers, such as main spacer walls, liner layers, and the like. By way of example, the first spacer layer may be formed by depositing a dielectric material using processes such as, CVD process, a subatmospheric CVD (SACVD) process, a flowable CVD process, an ALD process, a PVD process, or other suitable process.

Referring to the examples of FIGS. 7A and 7B, a first spacer layer 702 is disposed on the substrate 202. The first spacer layer 702 may have a thickness 720. In an embodiment, the thickness 720 is between approximately 5 nm and approximately 10 nm. After the deposition of the first spacer layer 702, a trench 706 defined between the fin elements 306a and 306b has a trench width 712 and a trench depth 716, and a trench 708 defined between the fin elements 306c and 306d has a trench width 714 and a trench depth 718. In some embodiments, trench widths 712 and 714 and trench depths 716 and 718 may be affected by the fin distances 308 and 310, heights 502 and 504, and the thickness 720 of the first spacer layer 702. In an embodiment, the trench width 712 is between approximately 25 nm and approximately 55 nm. In an embodiment, the trench width 714 is between approximately 25 nanometers (nm) and approximately 55 nm. In an embodiment, the trench width 712 is substantially equal to the trench width 714. In an embodiment, the trench width 714 is greater than trench width 712 (e.g., by more than about 20%). In an embodiment, the trench depths 716 and 718 are substantially the same, and are between about 30 nm and about 60 nm.

By way of example, the spacer material of the first spacer layer 702 may include a dielectric material such as silicon oxide, silicon nitride, silicon carbide, silicon oxynitride, SiCN films, silicon oxycarbide, SiOCN films, and/or combinations thereof. In some embodiments, first spacer layer 702 may include multiple layers, such as main spacer walls, liner layers, and the like. By way of example, the first spacer layer 702 may be formed by depositing a dielectric material using processes such as, CVD process, a subatmospheric CVD (SACVD) process, a flowable CVD process, an ALD process, a PVD process, or other suitable process.

Figure 1B:
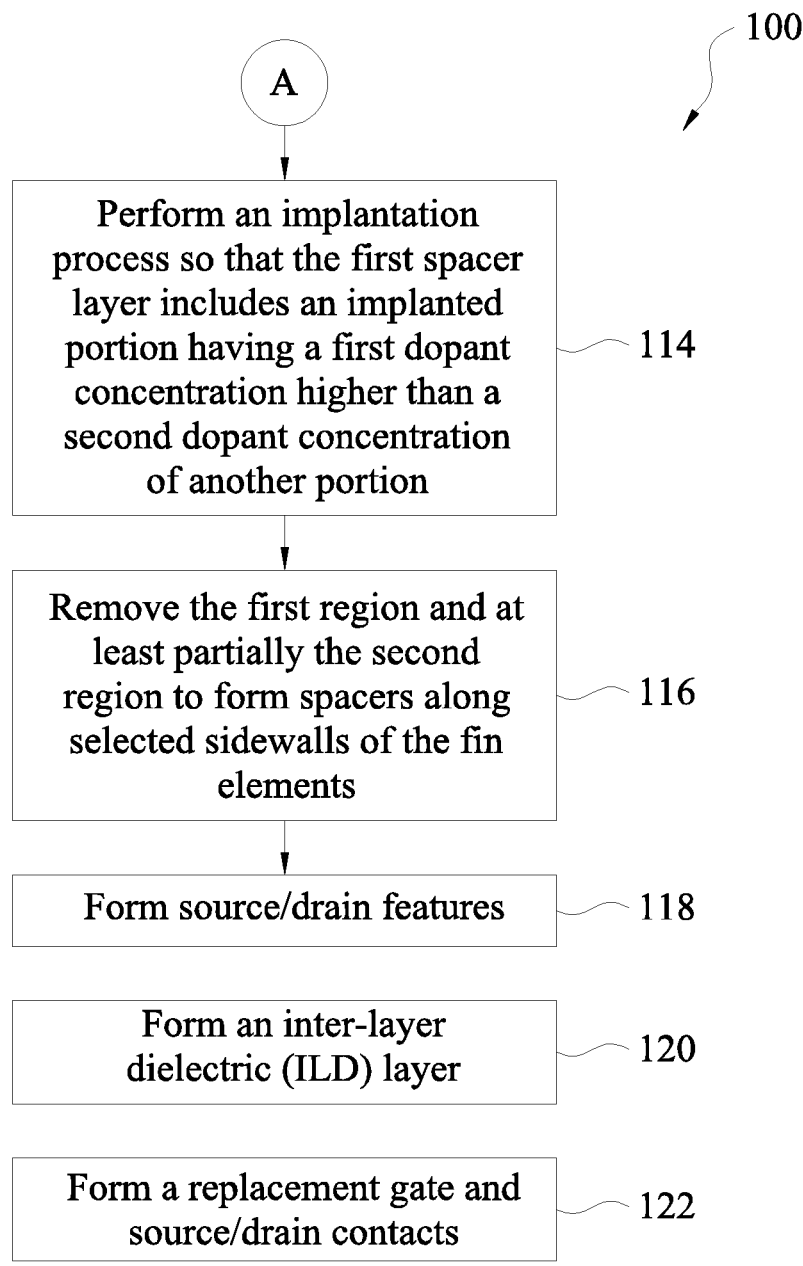
Figure 1C:
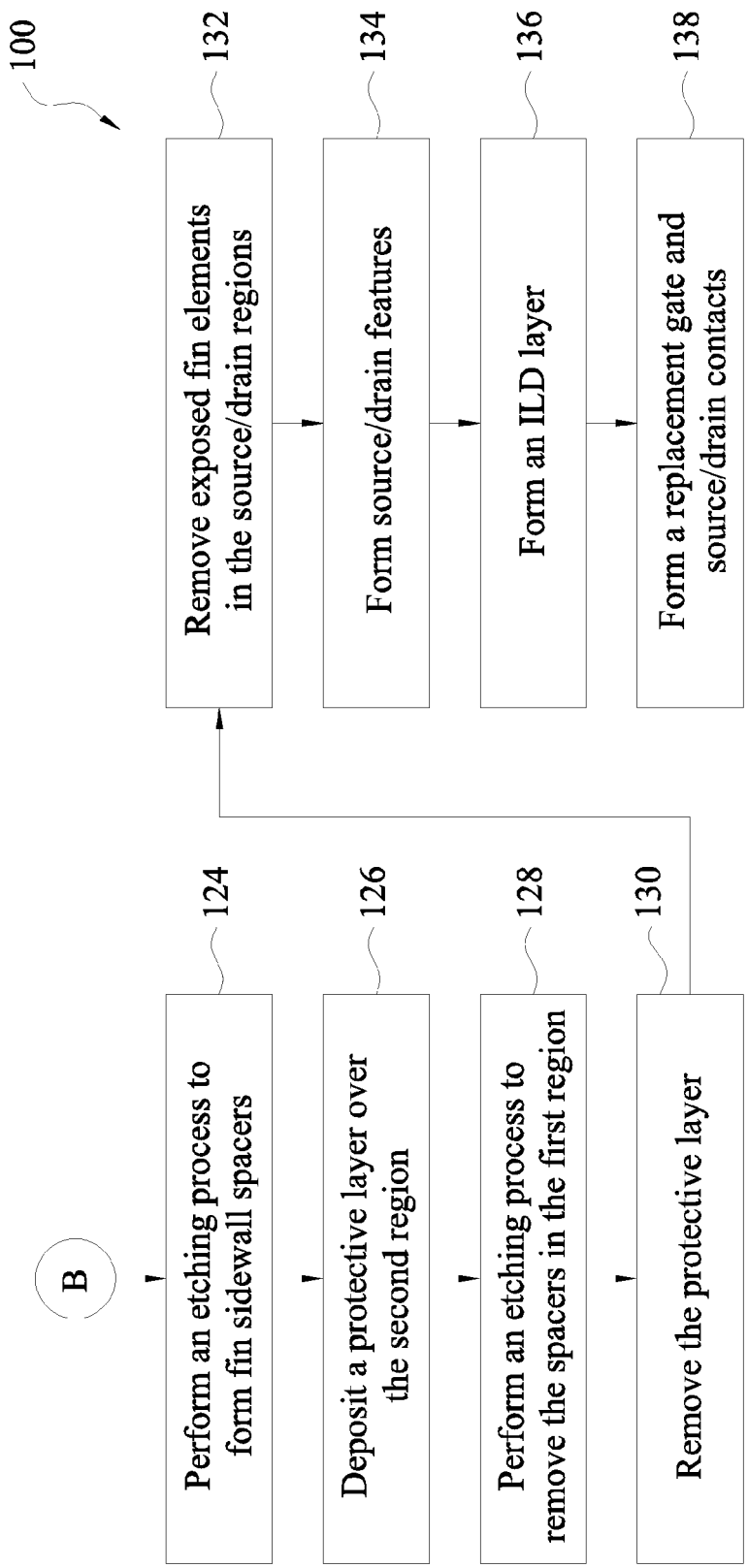
Figure 1D:
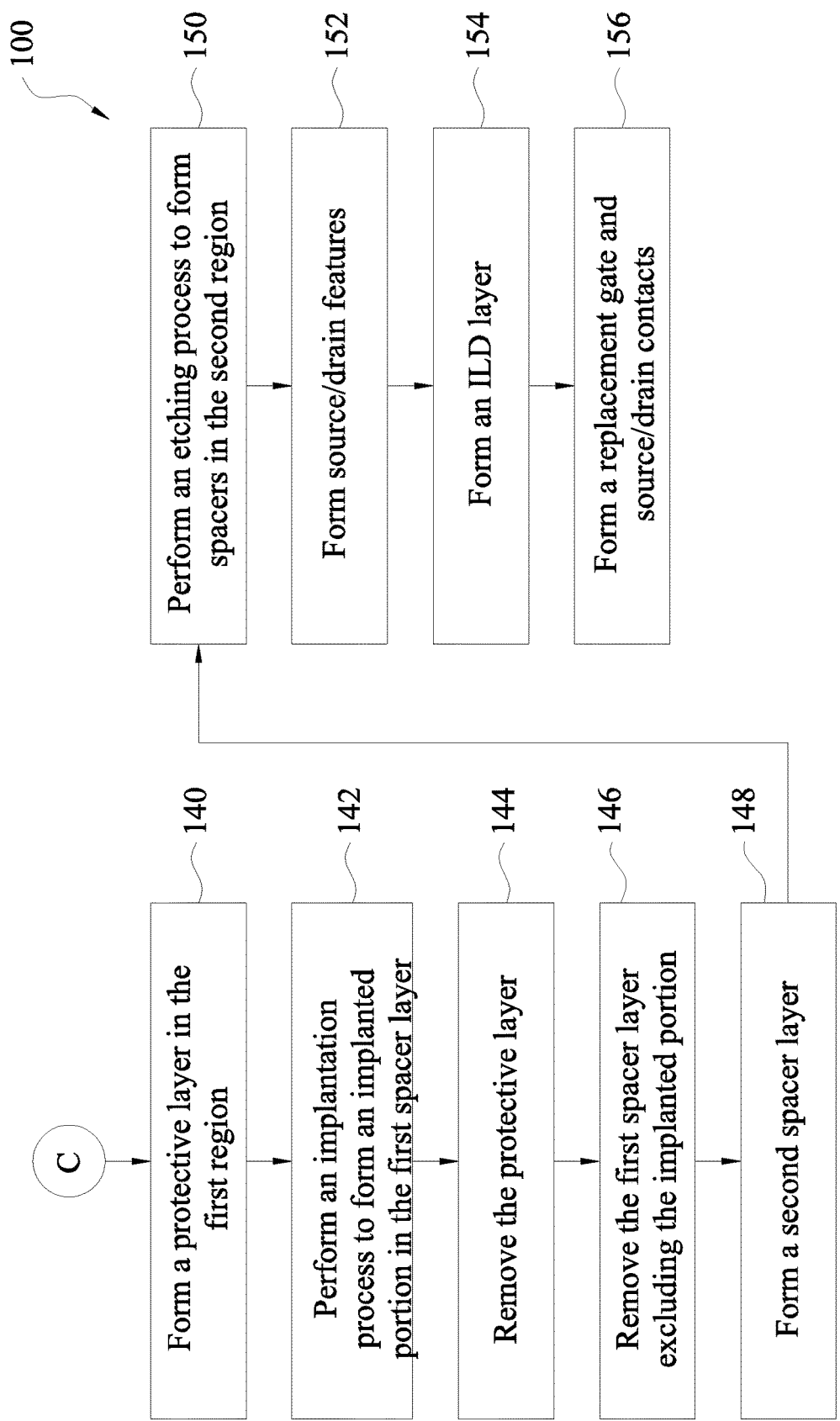

Referring to FIG. 1A, after block 112 is completed, the method 100 may then proceed to one of the branches A, B, and C according to various embodiments. FIG. 1B and semiconductor structures 200A and 200B provided in FIGS. 8A, 8B, 8C, 9A, 9B, 10A, 10B, 11A, 11B, 12A, 12B, 13A, 13B, 14A, 14B, 15A, 15B, 16A, and 16B illustrate embodiments of the present disclosure according to the branch A of the method 100. FIG. 1C and semiconductor structure 200C provided in FIGS. 17A, 17B, 18A, 18B, 19A, 19B, 20A, 20B, 21A, 21B, 22A, 22B, 23A, 23B, 24A, and 24B illustrate embodiments of the present disclosure according to the branch B of the method 100. FIG. 1D and semiconductor structure 200D provided in FIGS. 26, 27A, 27B, 28, 29, 30, 31A, 31B, 32A, 32B, 33, 34A, and 34B illustrate embodiments of the present disclosure according to the branch C of the method 100.

Referring now to FIGS. 1B, 8A, 8B, and 8C, in some embodiments according to the branch A of the method 100, after forming a first spacer layer over the substrate in block 112, the method 100 proceeds to block 114, where an implantation process is performed so that a first region of the first spacer layer has a dopant concentration that is greater than the dopant concentration of a second region of the first spacer layer. The first region and the second region of the first spacer layer may have different etching characteristics in a subsequent etching process, which may be used to control the configurations (e.g., height) of sidewall spacer elements along the fin elements as further discussed below.

In some embodiments, after the deposition of the first spacer layer 702 and before performing an implantation process 800 discussed below, an etching back of the dielectric material of the first spacer layer 702 over the dummy gate structure 602 may be performed. Referring to the example of FIG. 8A, the first spacer layer 702 has been etched back to expose the nitride layer 610 of the dummy gate structure 602, and the first spacer layer 702 remaining on the sidewalls of the dummy gate structure 602 forms spacers 812.

Figure 8A:
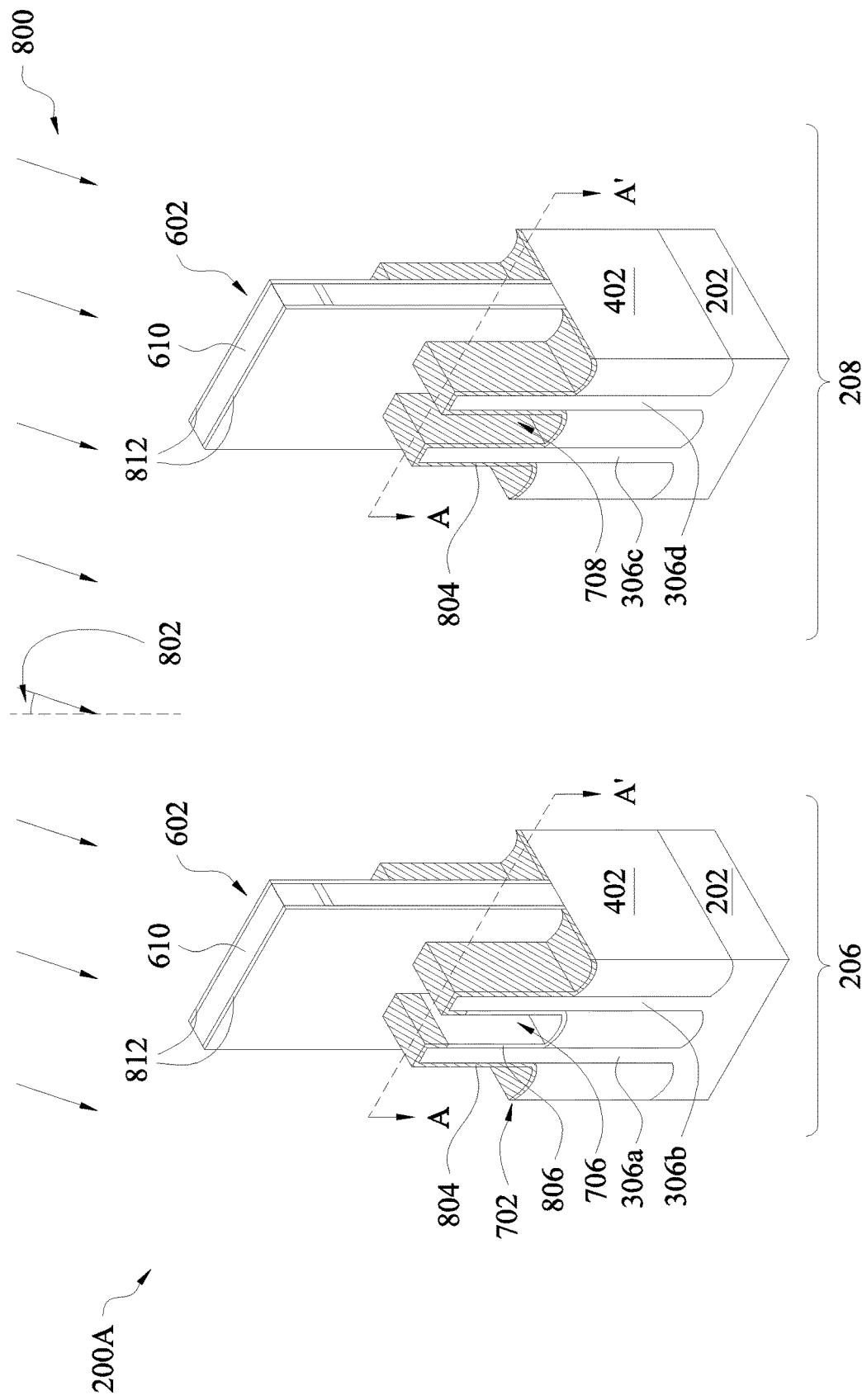
FIG. 8A is an isometric view of an embodiment of the semiconductor structure 200A according to aspects of the method of FIGS. 1A, 1B, 1C, and 1D.
Figure 8B:
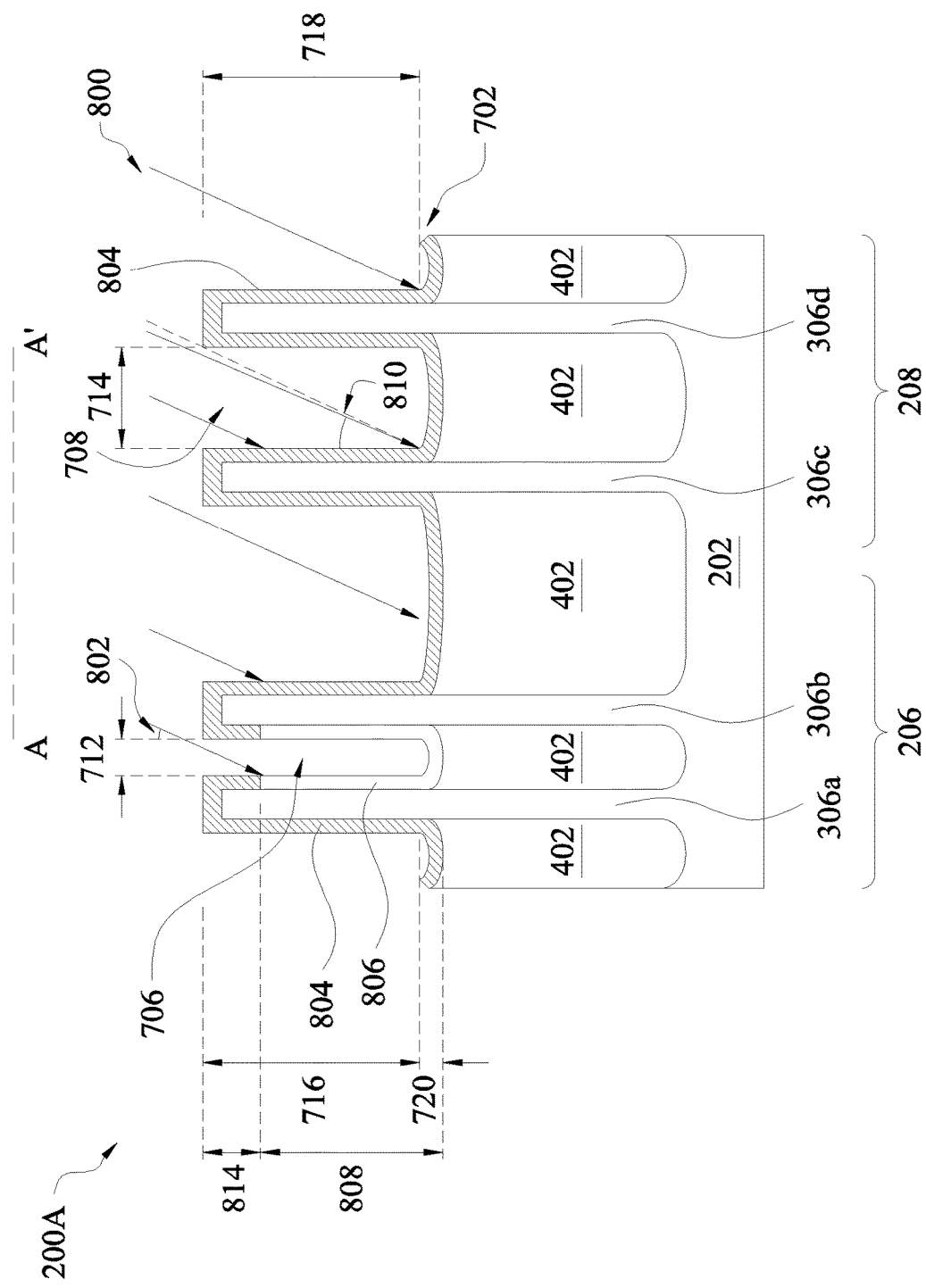
FIG. 8B is a cross-sectional view, corresponding to the isometric views of FIG. 8A, of an embodiment of the semiconductor structure 200A according to aspects of the method of FIGS. 1A, 1B, 1C, and 1D.

Referring to the example of FIGS. 8A and 8B, in some embodiments, the implantation process 800 is performed so that the first spacer layer includes an implanted portion 804 having a first dopant concentration, and a portion 806 having a second dopant concentration less than the first dopant concentration. In some embodiments, the implanted portion 804 along the inner sidewalls of the fin elements 306a and 306b may extend an inner sidewall implanted height 814 from a top surface of the first spacer layer 702. In some embodiments, the portion 806 along the inner sidewalls of the fin elements 306a and 306b may extend a distance 808 from a top surface of the STI feature 402. In some embodiments, the portion 806 may also include portions of the first spacer layer 702 along sidewalls of the dummy gate structure 602 in both the first region 206 and the second region 208. The implanted portion 804 may include other portions of the first spacer layer 702 excluding the portion 806.

In some embodiments, the implantation process 800 includes an ion implantation process implanting ions (e.g., carbon ions) to the implanted portion 804 of the first spacer layer 702. In some embodiments, the implantation process 800 is a tilted implantation process applied to the first spacer layer 702 with a tilt angle 802. In some embodiments, the tilt angle 802 is controlled so that the implanted portion 804 is implanted while the portion 806 of the first pacer layer 702 remains substantially unchanged by the implantation process 800. To the extent that any ions are implanted into the portion 806, they are sufficiently low in quantity and concentration so as to be negligible for the purposes of the present disclosure. In one example, after the implantation process 800 is performed, the portion 806 includes an implanted ion concentration less than about 1% by weight.

In some embodiments, the tilt angle 802 of the implantation process 800 is controlled to achieve the required dimensions of the implanted portion 804 and the portion 806. In some embodiments, the tilt angle 802 is related to the trench depth 716, the trench width 712, and the height 808. In some examples, the tilt angle 802 is controlled to satisfy the following equation: tan(tilt angle 802)=(trench width 712)/(inner sidewall implanted height 814). In some embodiments, the tilt angle 802 is controlled to be equal to or less than an angle 810 to ensure that the first spacer layer 702 in the second region 208 (e.g., bottom of the trench 708) is implanted by the implantation process 800. The angle 810 may be related to the trench width 714 and the trench depth 718. In some examples, the angle 810 satisfies the following equation: tan(angle 810)=(trench width 714)/(trench depth 718). In a particular example for illustration, the trench width 712 is about 4 nm, the trench height 716 is about 54 nm, the inner sidewall implanted height 814 is about 15 nm, the height 808 is about 44 nm, the thickness 720 of the first spacer layer 702 is about 5 nm, the trench height 718 is about 54 nm, the trench width 714 is about 19 nm, the tilt angle 802 is about 15 degrees, and the angle 810 is about 20 degrees.

In some embodiments, the dopant concentration in the implanted portion 804 is controlled (e.g., by controlling dopant species, ion beam energy, implantation dose of the implantation process 800) so as to result in desired etch characteristics (e.g., a desired etch rate) of the implanted portion 804. In some examples, an etch rate of the implanted portion 804 is greater than the etch rate of the portion 806 (e.g., by more than three times) in the subsequent etching process. In some embodiments, the dopant concentration of the implanted portion 804 may be greater than the dopant concentration of the portion 806 (e.g., by more than 10% by weight). In one example, the difference between the dopant concentration of the implanted portion 804 and the dopant concentration of the portion 806 is between about 10% to about 50%.

In some embodiments, the implantation process 800 includes two steps: the first step is an ion implantation with the tilt angle 802 toward the left, so that the ion beam is toward the left sidewalls of the trenches 706 and 708, and the second step is another ion implantation with the tilt angle 802 toward the right, so that the ion beam is toward the right sidewalls of the trenches 706 and 708. In some embodiments, the implantation process 800 does not use any masking elements in either of those two steps.

Figure 8C:
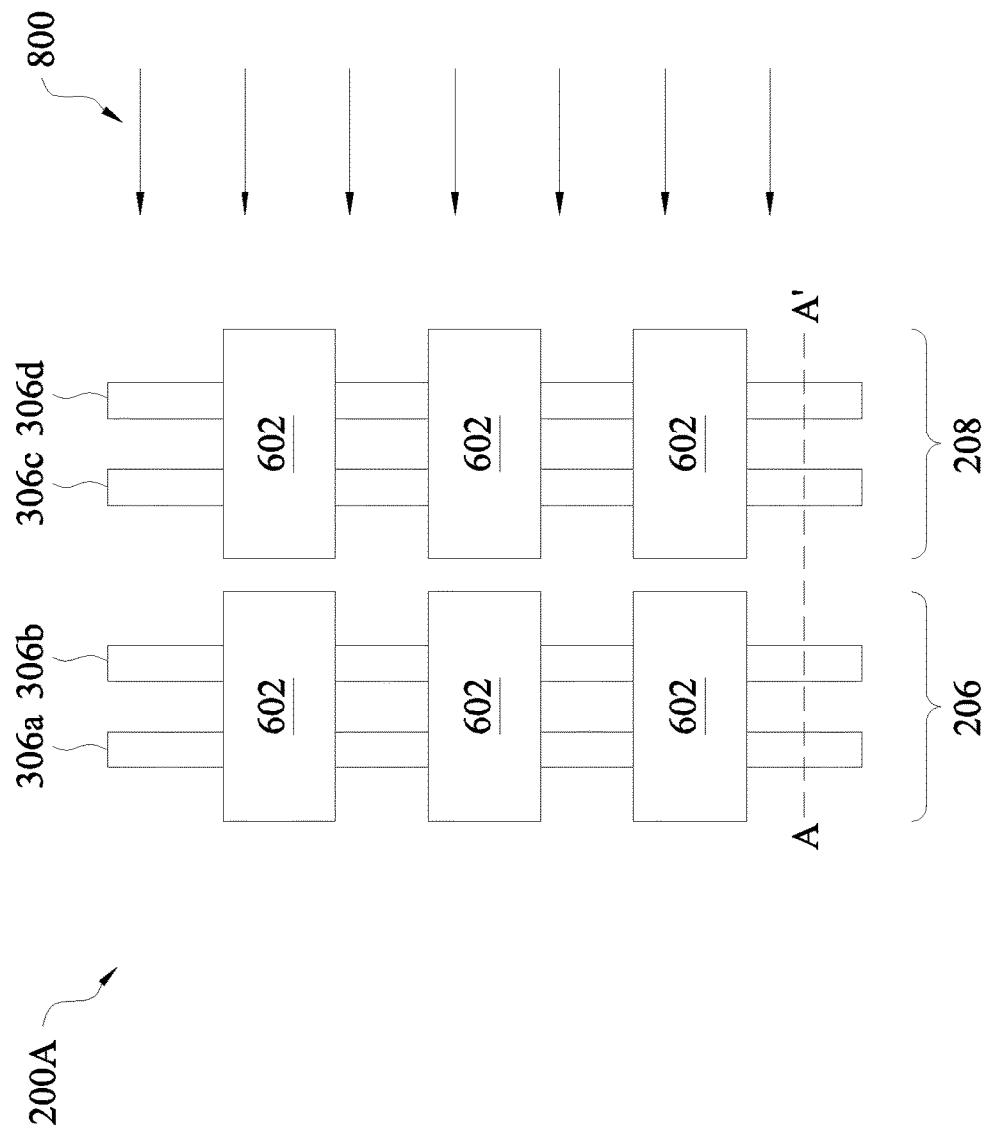
FIG. 8C is a simplified top view, corresponding to the isometric view of FIG. 8A, of an embodiment of the semiconductor structure 200A according to aspects of the method of FIGS. 1A, 1B, 1C, and 1D.

Referring to the example of FIG. 8C, illustrated is a simplified top view of the semiconductor structure 200. In some embodiments, the implantation process 800 is controlled (e.g., by controlling a twist angle) so that spacers 812 in both the first region 206 and the second region 208 are not affected by the implantation process 800. As illustrated in FIG. 8C, in some embodiments, the implantation process 800 is applied in a direction parallel to the sidewalls of the dummy gate structure 602, so that spacers 812 remain substantially the same.

Figure 9A:
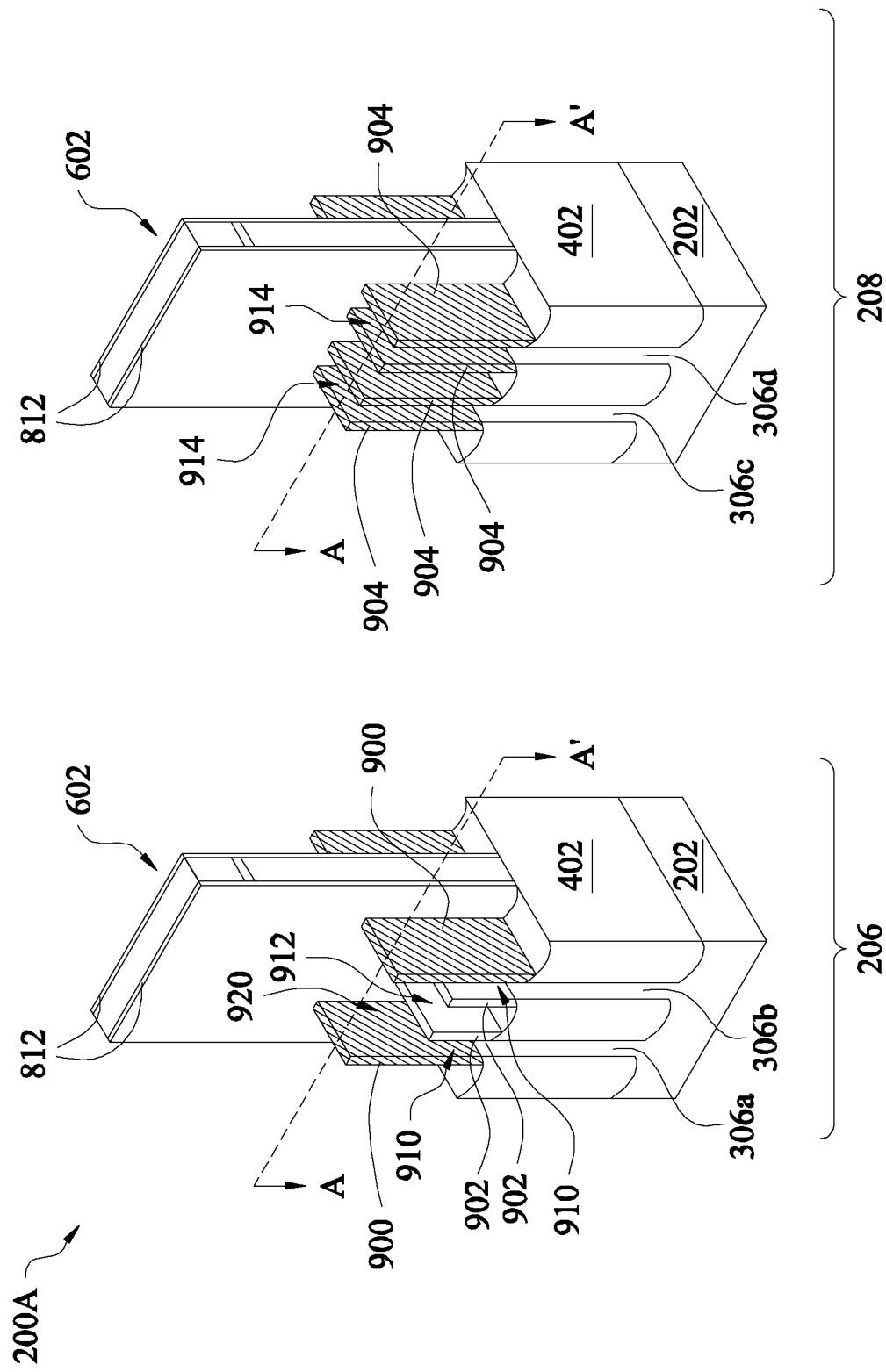
FIGS. 9A, 10A, 11A, and 12A are isometric views of an embodiment of the semiconductor structure 200A according to aspects of the method of FIGS. 1A, 1B, 1C, and 1D.
Figure 9B:
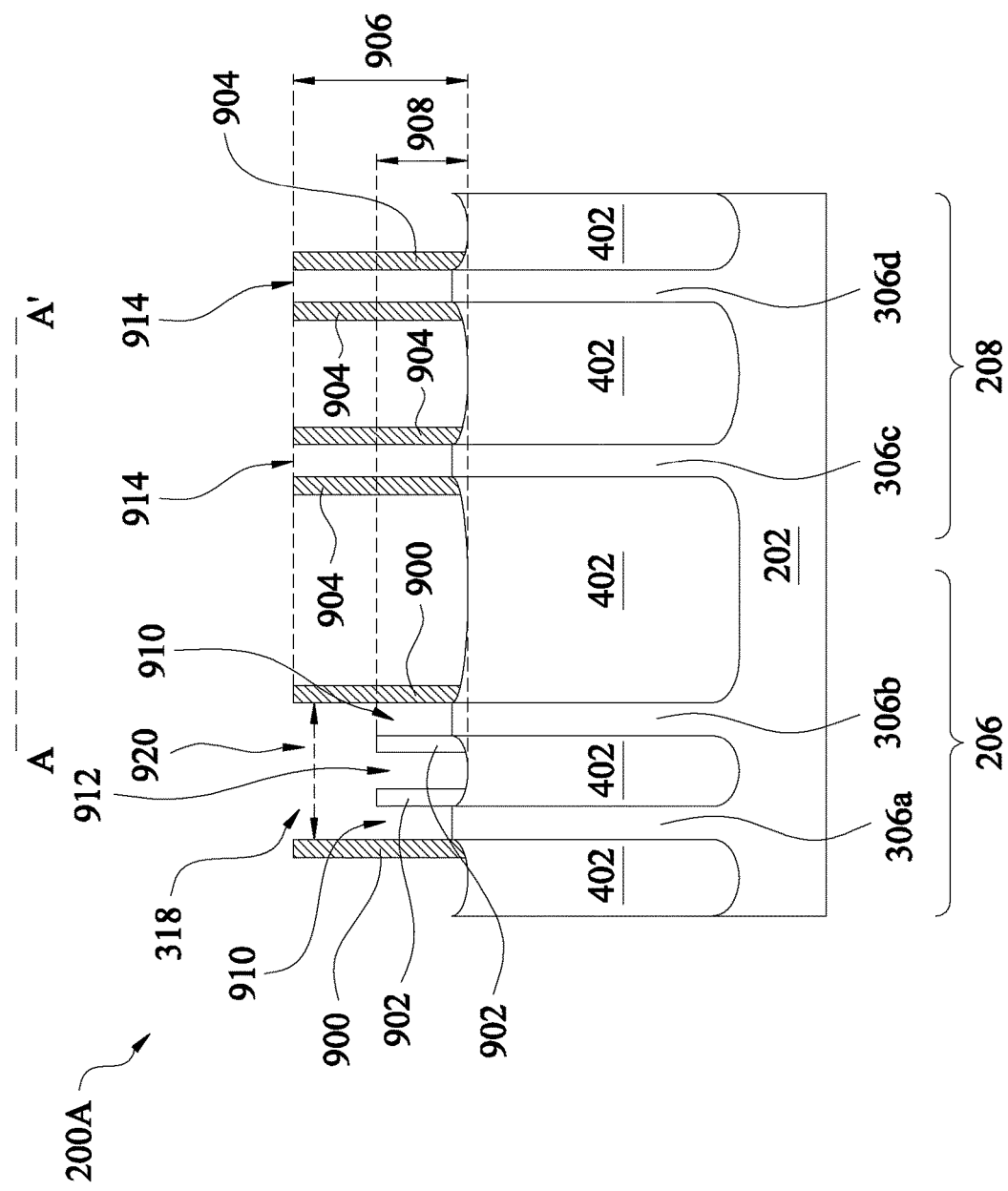
FIGS. 9B, 10B, 11B, and 12B are cross-sectional views, corresponding to the isometric views of FIGS. 9A, 10A, 11A, and 12A, of an embodiment of the semiconductor structure 200A according to aspects of the method of FIGS. 1A, 1B, 1C, and 1D.

Referring to FIGS. 1B, 9A, and 9B, the method 100 proceeds to block 116, where an etching process is performed so that top portions of the first spacer layer are removed to form sidewall spacers in the source/drain regions along sidewalls of the fin elements in both the first region and the second region.

Referring to the examples of FIGS. 9A and 9B, in an exemplary embodiment of block 116, an etching process (e.g., a dry etching process, a wet etching process, and/or a combination thereof) is performed to remove top portions of the first spacer layer 702 in the source/drain regions. In some embodiments, the etching process includes a dry etching process using an etchant including a fluorine-containing gas, a chlorine-containing gas, other etching gas, or a combination thereof, such as $CF_4$, $SF_6$, $NF_3$, or $Cl_2$. In some embodiment, the etching conditions are controlled (e.g., by controlling an etchant, and/or an etching time) so as to achieve desired spacer heights. In some embodiments, the etchant may be chosen to achieve desired etch selectivity for the implanted portion 804 and the portion 806 In one example, where carbon ions are implanted during the implantation process 800, the etchant may be oxygen free or has an oxygen concentration less than about 10% by weight.

In some embodiments, spacers of different heights may be formed along fin elements 306a, 306b, 306c, and 306d after the etching process is performed. In some embodiments, in the first region 206, the implanted portion 804 along the inner sidewalls of the fin elements 306a and 306b is completely removed, and an upper portion of the portion 806 along the inner sidewalls of the fin elements 306a and 306b may be removed to form spacers 902. The spacers 902 (also referred to as inner spacers 902) may be disposed along inner sidewalls of the fin elements 306a and 306b and have an inner spacer height 908. In some embodiments, an upper portion of the implanted portion 804 of the first spacer layer 702 in the first region 206 may be removed to form spacers 900 (also referred to as outer spacers 900) having an outer spacer height 906 disposed along the outer sidewalls of fin elements 306a and 306b. In some embodiments, the outer spacer height 906 is greater than the inner spacer height 908 (e.g., by at least more than about 30%). In some embodiments, the outer spacer height 906 is in a range of between about 20 nm and about 60 nm. In some embodiments, the inner spacer height 908 is in a range of between about 1 nm and about 45 nm.

In some embodiments, various parameters (e.g. the tilt angle 802, dopant species, ion beam energy, implantation dose of the implantation process 800, etching conditions including an etchant and/or and an etching time of the etching process) may be designed to achieve the etch selectivity for the implanted portion 804 and the region 806, the outer spacer height 906, and the inner spacer height 908. For example, it may be designed so that the ratio between the etch rate of the portion 806 and the second etch rate of the implanted portion 804 is about (height 808−inner spacer height 908)/(height 716+thickness 720−outer spacer height 906). In a particular example, the height 808 is about 44 nm, the inner spacer height 908 is about 4 nm, the height 716 is about 54 nm, the thickness 720 is about 5 nm, the outer spacer height 906 is about 39 nm, and the ratio between the first etch rate and the second etch rate is about 2. In some embodiments, a trench 912 having an inner spacer height 908 may be formed between the fin elements 306a and 306b.

In some embodiments, in the second region 208, upper portions of the implanted portion 804 of the first spacer layer 702 are removed to form spacers 904 disposed along sidewalls of fin elements 306c and 306d. In some examples, the spacers 904 have a height that is substantially the same as the outer spacer height 906. In some embodiments, the height of the spacers 904 is greater than the inner spacer height 908 (e.g., by at least more than about 30%). In some embodiments, the height of the spacers 904 is in a range of between about 20 nm and about 60 nm.

In some embodiments, the dry etching process does not substantially affect the spacers 812 on sidewalls of the dummy gate structure 602 in both the first region 206 and second region 208.

In some embodiments, top portions of the fin elements 306a, 306b, 306c, and 306d are removed using a separate subsequent etching process or the same etching process. In the examples of FIGS. 9A and 9B, the portions of the fin elements 306a, 306b, 306c, and 306d over the STI 402 are removed. In the first region 206, two trenches 910 are formed between spacers 900 and 902, exposing top surfaces of the fin elements 306a and 306b respectively. In some embodiments, because the inner spacers 902 have an inner spacer height 908 less than the outer spacer height 906 of the outer spacers 900, the first region 206 includes a trench 920 having a width 318 over the trenches 910 and 912.

In some embodiments, after removing the top portions of the fin elements, in the second region 208, two trenches 914 are formed between spacers 904, exposing top surfaces of the fin elements 306c and 306d respectively.

In some embodiments, the fin elements 306a, 306b, 306c, and 306d below the top surface of the STI features 402 are not exposed and thus, not etched during the dry etching process. Similarly, in some embodiments, the fin elements 306a, 306b, 306c, and 306d are not etched in the channel regions, which underlie the dummy gate structure 602.

Figure 10A:
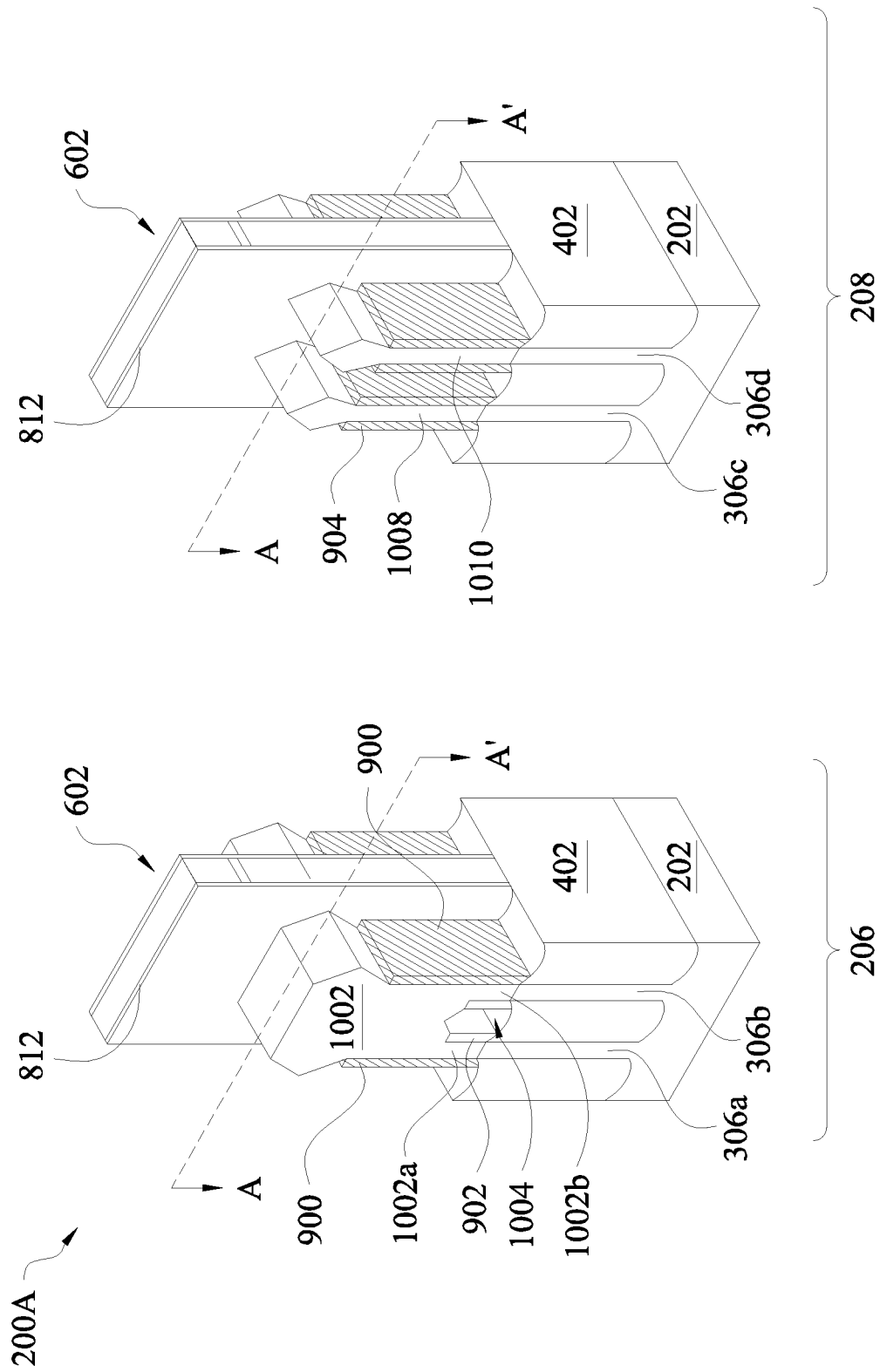
Figure 10B:
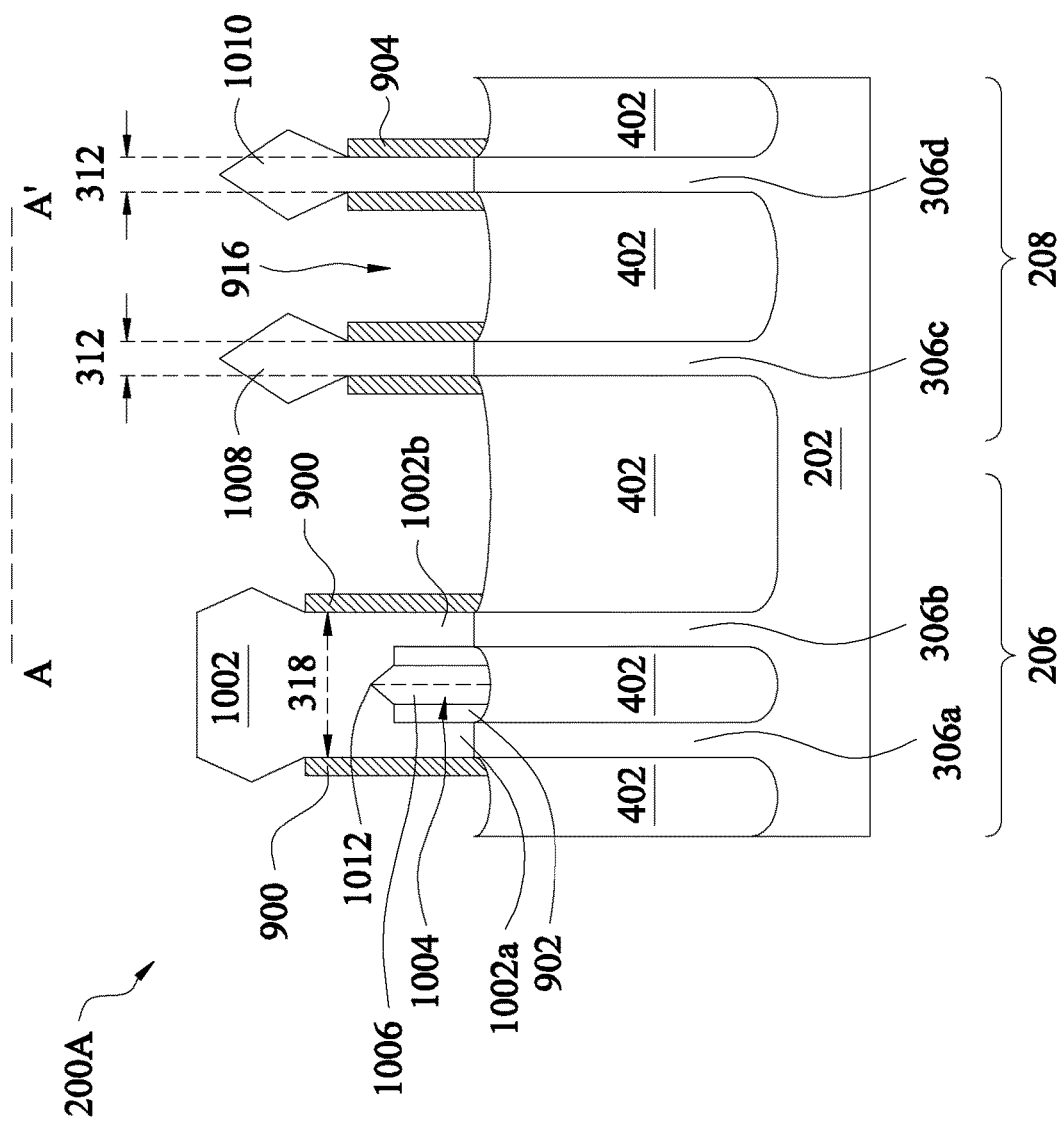

Referring to FIGS. 1B, 10A, and 10B, the method 100 then proceeds to block 118, where an epitaxial growth process is performed to form source/drain features on the fin elements. In some embodiments, the source/drain features may be formed by performing an epitaxial growth process on top surfaces of the fin elements.

Referring to the example of FIGS. 10A and 10B, in some embodiments, in the first region 206 of the semiconductor structure 200A, the growth of a source/drain feature 1002 over top surfaces of the fin elements 306a and 306b may be laterally constrained by spacers 900 and 902. Particularly, the source/drain feature 1002 includes a source/drain feature 1002a and a source/drain feature 1002b formed by epitaxially growing a semiconductor material on the exposed surfaces of fin elements 306a and 306b respectively. The growth of each of the source/drain features 1002a and 1002b is laterally constrained by an inner spacer 900 and an outer spacer 902 disposed along sidewalls of the respective fin element. After source/drain features 1002a and 1002b fill the trenches 910 respectively, the source/drain features 1002a and 1002b merge at a merge point 1012, and then grow into the merged source/drain feature 1002. A distance 1006 extends from the merge point 1012 to a top surface of the STI feature 402. In some embodiments, the distance 1006 is less than the spacer outer spacer height 906 of the outer spacers 900 and/or the height of the spacers 904. In some embodiments, the distance 1006 may be greater than the spacer inner spacer height 908 of the inner spacers 902. In some examples, the height 1006 is in a range of between about 2 nm and about 5 nm.

In some embodiments, the formation of the source/drain features 1002 also provides for formation of a gap 1004 having a height 1006. The gap 1004 may be filled with air and thus, referred to as an "air-gap." The air-gap 1004 is defined by two sidewalls of the source/drain feature 1002 joining at the merge point 1012, the spacers 902, and a top surface of the STI feature 402.

In some embodiments, as illustrated in FIGS. 10A and 10B, in the second region 208, source/drain features 1008 and 1010 include a material formed by epitaxially growing a semiconductor material on the fin elements 306c and 306d respectively. The growth of each of the source/drain features 1008 and 1010 is laterally constrained by two spacers 904 disposed along sidewalls of the corresponding fin element. In an example, after filling the trenches 914 over the fin elements 306c and 306d respectively, the source/drain features 1008 and 1010 protrude out of the trenches 914. In some embodiments, the protruding portions of the source/drain features 1008 and 1010 do not merge.

In various embodiments, the grown semiconductor material of source/drain features 1002, 1008, and/or 1010 may include Ge, Si, GaAs, AlGaAs, SiGe, GaAsP, SiP, or other suitable material. In some embodiments, the epitaxially grown material of source/drain features 1002, 1008, and/or 1010 may be in-situ doped during the epitaxial process. In some embodiments, the epitaxially grown material of source/drain features 1002, 1008, and/or 1010 is not in-situ doped, and, for example, instead an implantation process is performed to dope the epitaxially grown material of source/drain features 1002, 1008, and/or 1010.

In an embodiment, the fin elements 306a, 306b, 306c, and 306d are silicon and the epitaxially grown material of source/drain features 1002, 1008, and/or 1010 also is silicon. In some embodiments, the fin elements 306a, 306b, 306c, and 306d and the material of the source/drain features 1002, 1008, and/or 1010 may comprise a similar material, but be differently doped. In other embodiments, the fin elements 306a, 306b, 306c, and 306d include a first semiconductor material, and the epitaxially grown material of source/drain features 1002, 1008, and/or 1010 includes a second semiconductor different than the first semiconductor material.

In various embodiments, the source/drain features 1002, 1008, and/or 1010 may be grown in different processes or the same processes and/or include different materials and/or dopants or dopant profiles. In an embodiment, the epitaxially grown material of source/drain features 1002, 1008, and/or 1010 is silicon being doped with phosphorous. In a further embodiment, the phosphorous dopant concentration may be between approximately $5 \times 10^{20}$ and approximately $2 \times 10^{21}$ atoms per cm³. The epitaxially grown material of source/drain features 1002, 1008, and/or 1010 may be alternatively suitably doped to include arsenic, antimony, or other N-type donor material.

Figure 11A:
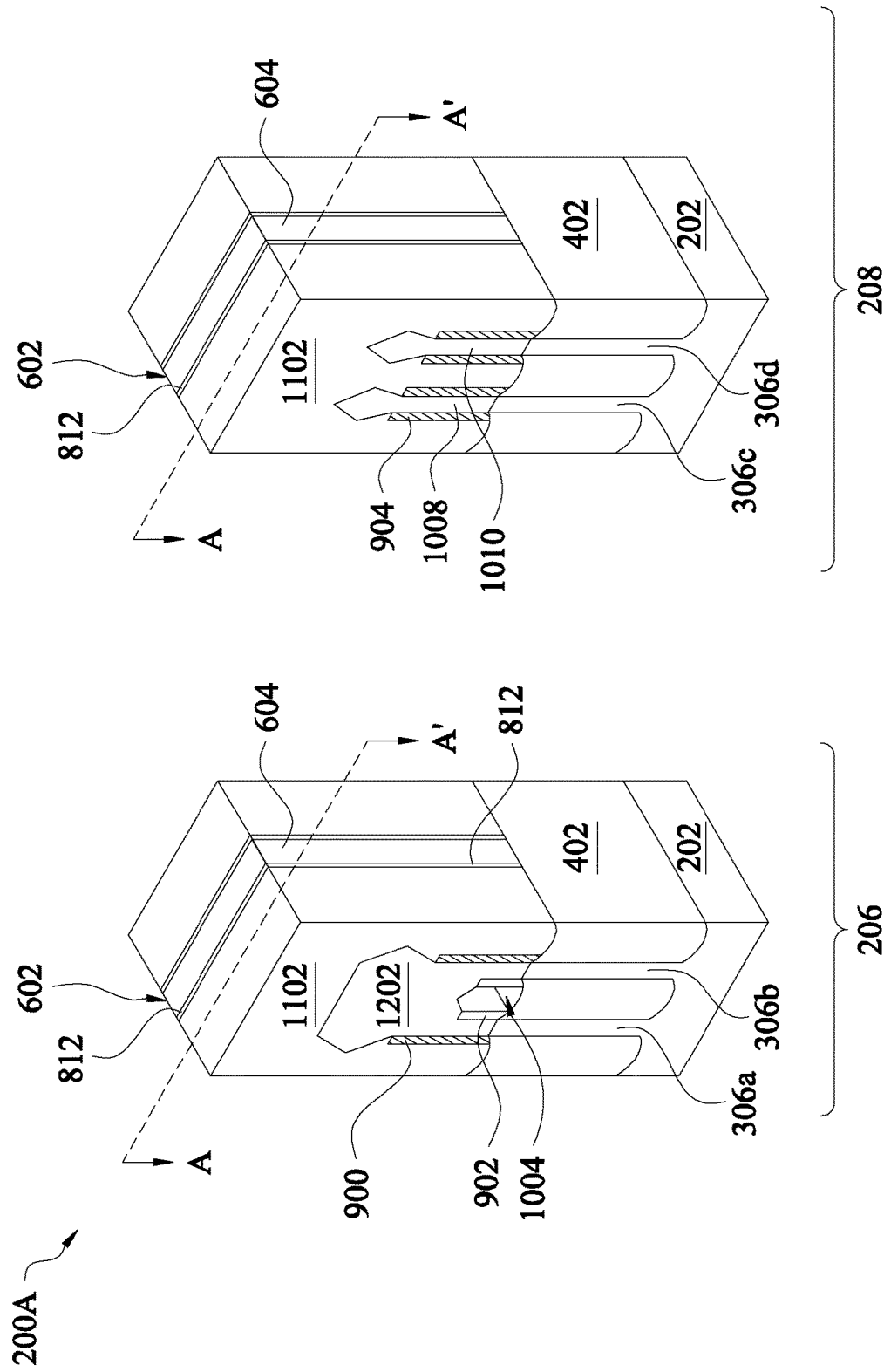
Figure 11B:
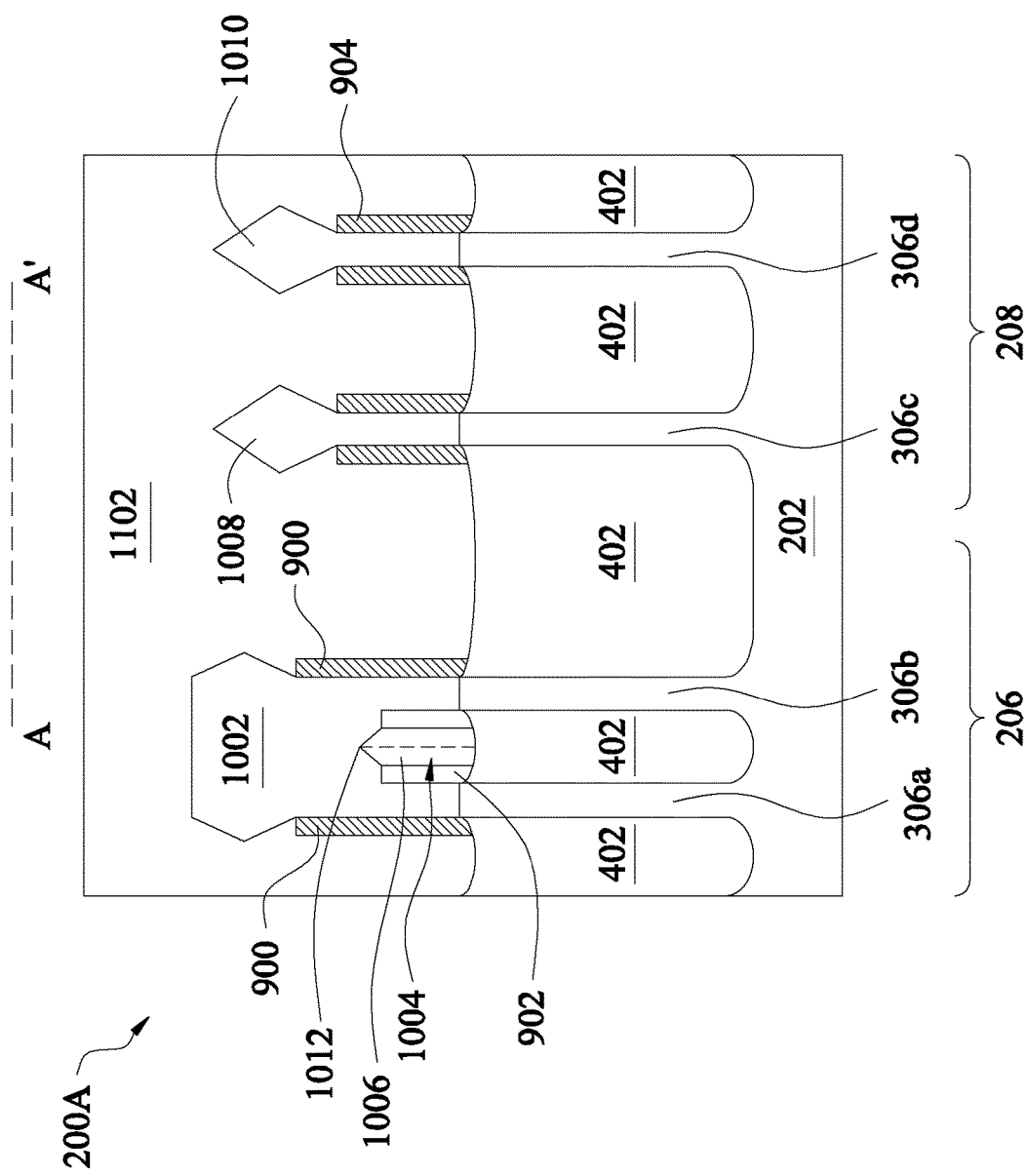

Referring to FIGS. 1B, 11A, and 11B, the method 100 then proceeds to block 120 where an inter-layer dielectric (ILD) layer is formed on the substrate. Referring to the examples of FIGS. 11A and 11B, in an embodiment of block 120, an ILD layer 1102 is formed in both the first region 206 and the second region 208 over the substrate 202 of the semiconductor structure 200A.

In some embodiments, a contact etch stop layer (CESL) may also be formed over the substrate 202 prior to forming the ILD layer 1102. In some examples, the CESL includes a silicon nitride layer, silicon oxide layer, a silicon oxynitride layer, and/or other materials known in the art. The CESL may be formed by plasma-enhanced chemical vapor deposition (PECVD) process and/or other suitable deposition or oxidation processes. Exemplary materials of the ILD layer 1102 include, for example, tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 1102 may be deposited by a PECVD process or other suitable deposition technique. In some embodiments, after formation of the ILD layer 1102, the semiconductor structure 200A may be subject to a high thermal budget process to anneal the ILD layer. The ILD layer 1102 may include a plurality of layers.

In some examples, after depositing the ILD layer, a planarization process (e.g., CMP) may be performed to expose a top surface of the dummy gate structure. Using FIGS. 11A and 11B as exemplary, a planarization process removes portions of the ILD layer 1102 (and CESL layer, if present) overlying the dummy gate structure 602 and planarizes a top surface of the semiconductor structure 200A. In addition, the planarization process may remove the hard mask 606 overlying the dummy gate structure 602 to expose the electrode layer 604.

Figure 12A:
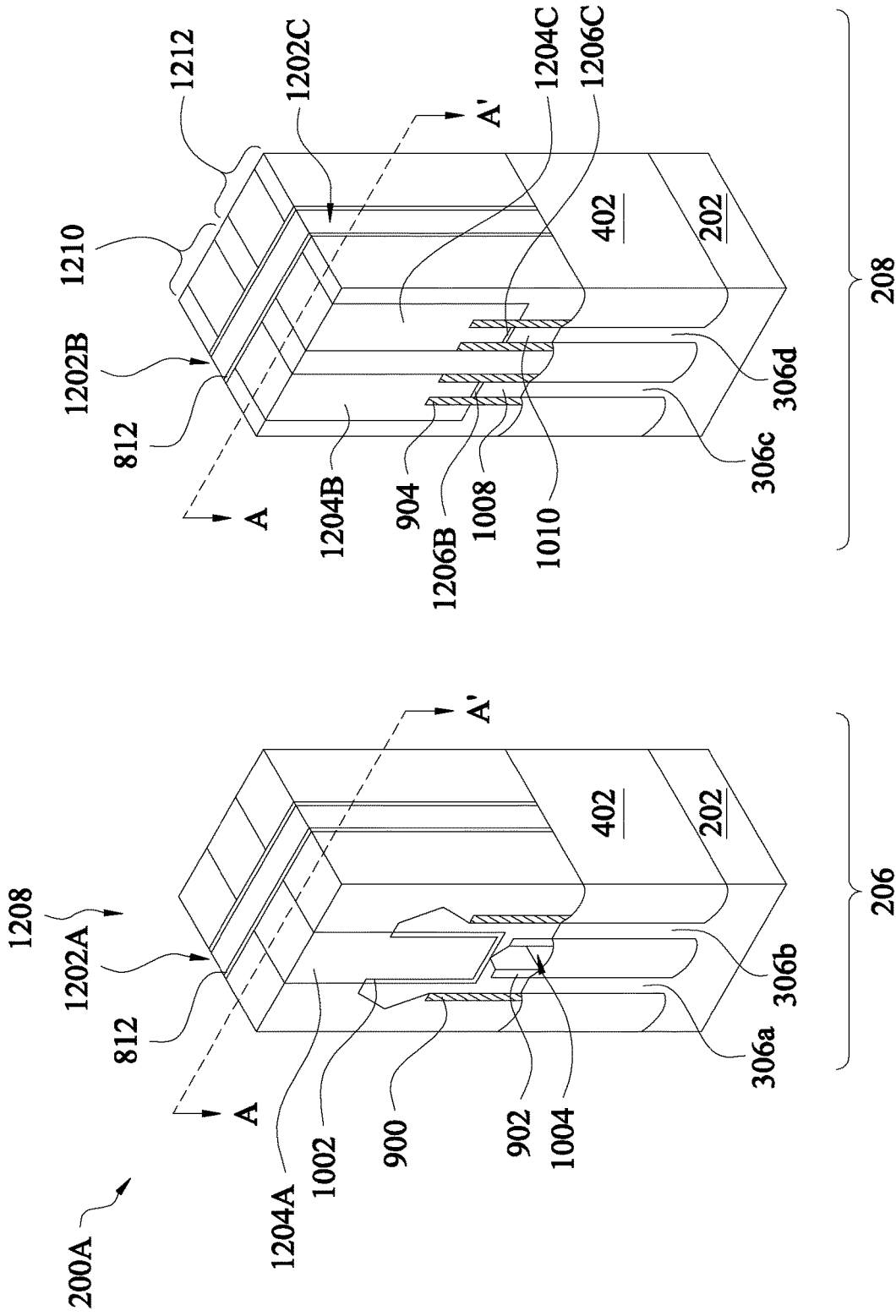
Figure 12B:
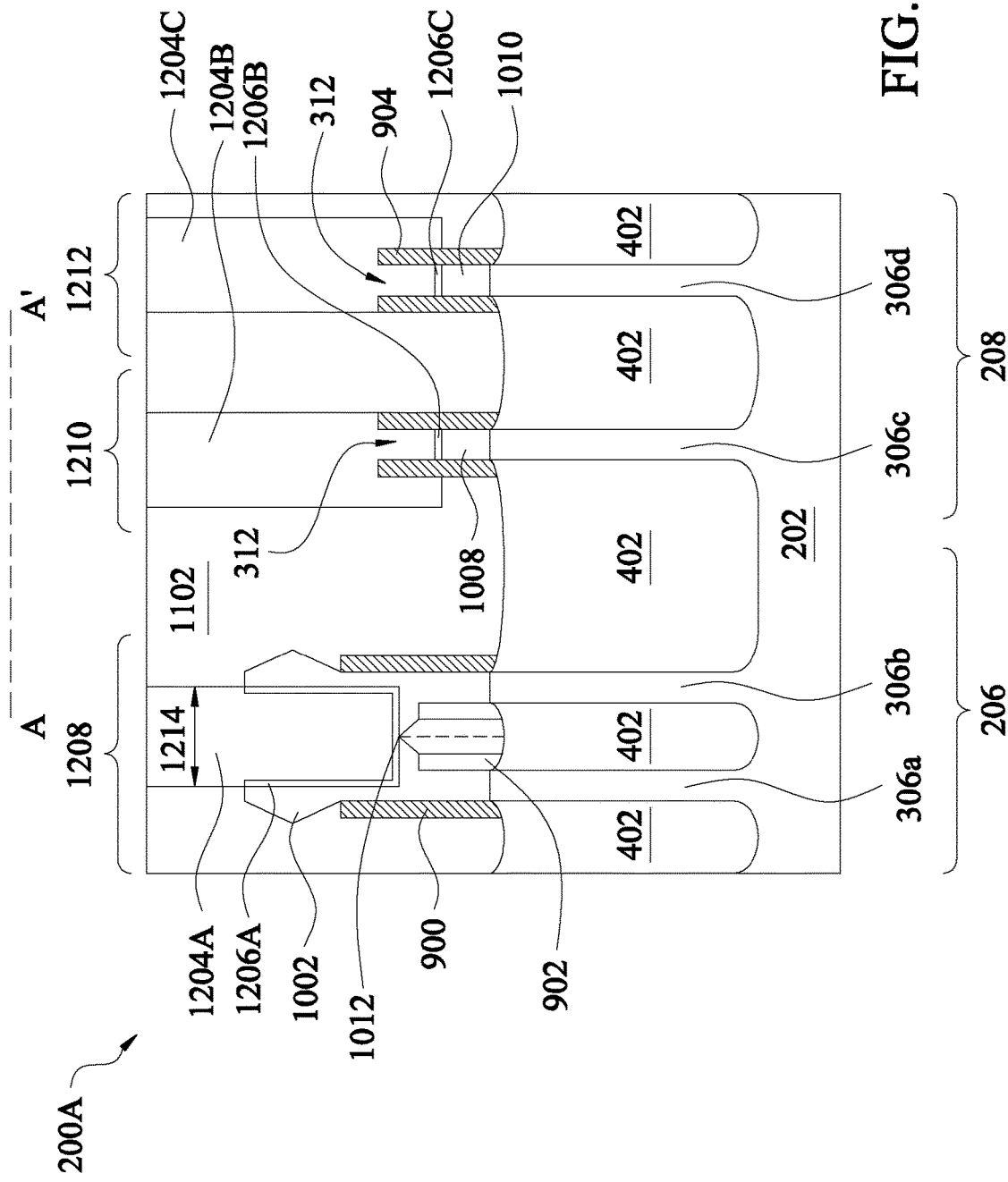

Referring to FIGS. 1B, 12A and 12B, the method 100 then proceeds to block 122 where a replacement gate and source/drain contacts are formed. Block 122 of the method 100 includes removing the dummy gate structure or portion thereof. As one example, the previously formed dummy gate structure 602 (e.g., the dielectric layer 612 and the electrode layer 604) is removed from the substrate 202. The removal of the dielectric layer 612 and the electrode layer 604 of the dummy gate structure 602 results in an opening or trench. A final gate structure (e.g., including a high-K dielectric layer and metal gate electrode) may be subsequently formed in the trench or opening, as described below. The removal of the dummy gate stack features may be performed using a selective etching process, such as a selective wet etching, a selective dry etching, or a combination thereof.

In some embodiments, block 122 continues to include forming a replacement functional gate structure including a high-K/metal gate stack. Referring to the example of FIGS. 12A and 12B, in some embodiments, in the first region 206, a final gate structure 1202A may be formed in the trench or opening over the fin elements 306a and 306b in the channel region, so that the fin elements 306a and 306b become the fins elements of a FinFET 1208. In some embodiments, in the second region 208, a final gate structure 1202B may be formed in the trench or opening over the fin element 306c in the channel region, so that the fin element 306c becomes the fin element of a FinFET 1210. In some embodiments, a final gate structure 1202C may be formed in the trench or opening over the fin element 306d in the channel region, so that the fin element 306d becomes the fin element of a FinFET 1212.

In various embodiments, each of the gate structures 1202A, 1202B, and 1202C may include a high-K gate dielectric layer and a metal gate electrode stack. Each of the gate structures 1202A, 1202B, and 1202C may also include an interfacial layer formed over the channel region of the fin, a high-K gate dielectric layer formed over the interfacial layer, and a metal layer formed over the high-K gate dielectric layer. High-K gate dielectrics, as used and described herein, include dielectric materials having a high dielectric constant, for example, greater than that of thermal silicon oxide (~3.9). The metal layer used within high-K/metal gate stack may include a metal, metal alloy, or metal silicide. Additionally, the formation of the high-K/metal gate stack includes depositions to form various gate materials and one or more CMP processes to remove excessive gate materials and thereby planarize a top surface of the semiconductor structure 200A.

In some embodiments, the interfacial layer of the gate structures 1202A, 1202B, and 1202C may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The gate dielectric layer of the gate structure 1202A, 1202B, and 1202C may include a high-K dielectric layer such as hafnium oxide ($HfO_2$). Alternatively, the gate dielectric layer of the gate stack 1502 may include other dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The gate dielectric layer may be formed by ALD, physical vapor deposition (PVD), CVD, oxidation, and/or other suitable methods. The metal layer of the gate structures 1202A, 1202B, and 1202C may include a single layer or alternatively a multi-layer structure, such as various combinations of a metal layer with a selected work function to enhance the device performance (work function metal layer), liner layer, wetting layer, adhesion layer, metal alloy or metal silicide. By way of example, the metal layer of the gate structure 1202A, 1202B, and 1202C may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In addition, the metal layer may provide an N-type or P-type work function, may serve as a transistor (e.g., FinFET) gate electrode, and in at least some embodiments, the metal layer of the gate structures 1202A, 1202B, and 1202C may include a polysilicon layer. In various embodiments, the metal layer of the gate structure 1202A, 1202B, and 1202C may be formed by ALD, PVD, CVD, e-beam evaporation, or other suitable process. Further, the metal layer of the gate structures 1202A, 1202B, and 1202C may be formed separately for N-FET and P-FET transistors which may use different metal layers. In various embodiments, a CMP process may be performed to remove excessive metal from the metal layer of the gate structures 1202A, 1202B, and 1202C, and thereby provide a substantially planar top surface of the metal layer of the gate structures 1202A, 1202B, and 1202C.

In some embodiments, block 122 continues to include forming of source/drain contacts. Referring to the examples of FIGS. 12A and 12B, source/drain contacts 1204A, 1204B, and 1204C are formed over the source/drain features 1002, 1008, and 1010 respectively. In some embodiments, in the first region 206, a source/drain contact 1204A may be formed over the source/drain feature 1002 in the source/drain region of the FinFET 1208. The source/drain contact 1204A may include a silicidation feature 1206A having a U-shaped cross-section. In some embodiments, the silicidation feature 1206A may include a bottom surface and two sidewalls contacting the source/drain feature 1002. In some embodiments, the bottom surface may have a width 1214 between about 20 nm and about 90 nm.

In some embodiments, in the second region 208, a source/drain contact 1204B may be formed over the source/drain feature 1008 in the source/drain region of the FinFET 1210. The source/drain contact 1204B may include a silicidation feature 1206B having a bottom surface having a width 312 contacting the source/drain feature 1008. In some embodiments, a source/drain contact 1204C may be formed over the source/drain feature 1010 in the source/drain region of the FinFET 1212. The silicidation feature 1206C may include a bottom surface having a width 312 contacting the source/drain feature 1010.

As illustrated in the example of FIG. 12A, the spacers 812 disposed along sidewalls of the gate structure interposes the source/drain contacts 1204A, 1204B, and 1204C, and the gate structure 1202A, 1202B, and 1202C. The source/drain contacts 1204A, 1204B, and 1204C including the silicidation features 1206A, 1206B, and 1206C respectively may be formed by various process steps such as patterning and etching to form contact openings in the source/drain features, layer deposition, silicidation, as well as other suitable processing steps.

In the some embodiments, the silicidation features 1206A, 1206B, and 1206C may include nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), titanium silicide (TiSi), other suitable conductive materials, and/or combinations thereof. The silicidation feature 1206 may be formed by a process that includes depositing a metal layer, annealing the metal layer such that the metal layer is able to react with silicon to form silicide, and then removing the non-reacted metal layer.

In some embodiments, the source/drain contacts 1204A, 1204B, and 1204C may include various conductive materials including copper, tungsten, titanium, titanium nitride, other suitable materials, and/or combinations thereof. In various embodiments, the source/drain contact 1204A, 1204B, and 1204C may be formed by ALD, PVD, CVD, e-beam evaporation, or other suitable process. In various embodiments, a CMP process may be performed to remove excessive metal from the source/drain contacts 1204A, 1204B, and 1204C, and thereby provide a substantially planar top surface of the metal layer of the source/drain contacts 1204A, 1204B, and 1204C.

While the exemplary FIGS. 12A and 12B illustrate two fin elements in the FinFET 1208, in various embodiments, the FinFET 1208 may include any number of fin elements. Furthermore, while the exemplary FIGS. 12A and 12B illustrate that two single-fin FinFETs 1210 and 1212 are formed using the fin elements 306c and 306d respectively, in some embodiments, a multiple-fin FinFET may include both the fin elements 306c and 306d, and in some embodiments, a first multiple-fin FinFET may include the fin element 306c, and a second multiple-fin FinFET may include the fin element 306d.

In some embodiments, the first region 206 is a core region including various logic devices. In one example, the FinFET 1208 may be used to form a logic device, for example, a logic gate such as NAND, NOR, and/or inverter in the core region. In some embodiments, the second region 208 is an SRAM region including SRAM cells. In some embodiments, the FinFET 1210 and the FinFET 1210 may be transistors (e.g., PMOS pull-up transistor, NMOS pull-down transistor, and/or NMOS pass-gate transistor) of the same SRAM cell. In some embodiments, the FinFET 1210 may be a transistor (e.g., PMOS pull-up transistor, NMOS pull-down transistor, or NMOS pass-gate transistor) of a first SRAM cell, and the FinFET 1212 may be a be a transistor (e.g., PMOS pull-up transistor, NMOS pull-down transistor, or NMOS pass-gate transistor) of a second SRAM cell.

Referring now to FIG. 1B and FIGS. 13A, 13B, 14A, 14B, 15A, 15B, 16A, and 16B, in an exemplary embodiment of the branch A of the method 100, in the first region 206, the first spacer layer 702 disposed along inner sidewalls of the fin elements in the first region 206 is completed removed. In such embodiments, the growth of the source/drain features is not laterally constrained by any inner spacers disposed along the inner sidewalls of the fin elements 306a and 306b. This is illustrated by the semiconductor structure 200B as illustrated in FIGS. 13A, 13B, 14A, 14B, 15A, 15B, 16A, and 16B. The same description provided above with reference to blocks 114, 116, 118, 120, 122 and FIGS. 9A, 9B, 10A, 10B, 11A, 11B, 12A, and 12B applies except with the differences noted below.

Figure 13A:
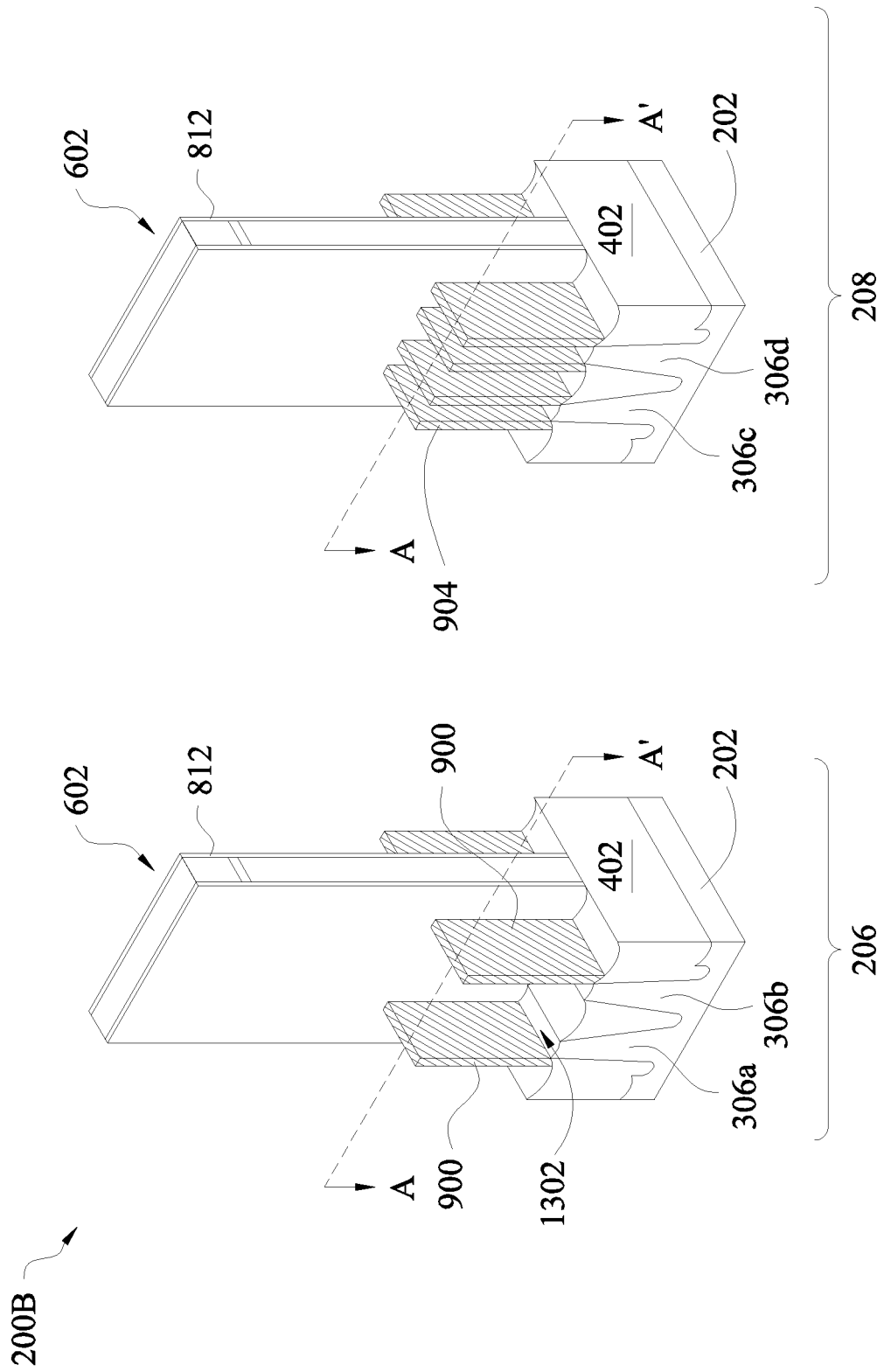
FIGS. 13A, 14A, 15A, and 16A are isometric views of an embodiment of the semiconductor structure 200B according to aspects of the method of FIGS. 1A, 1B, 1C, and 1D.
Figure 13B:
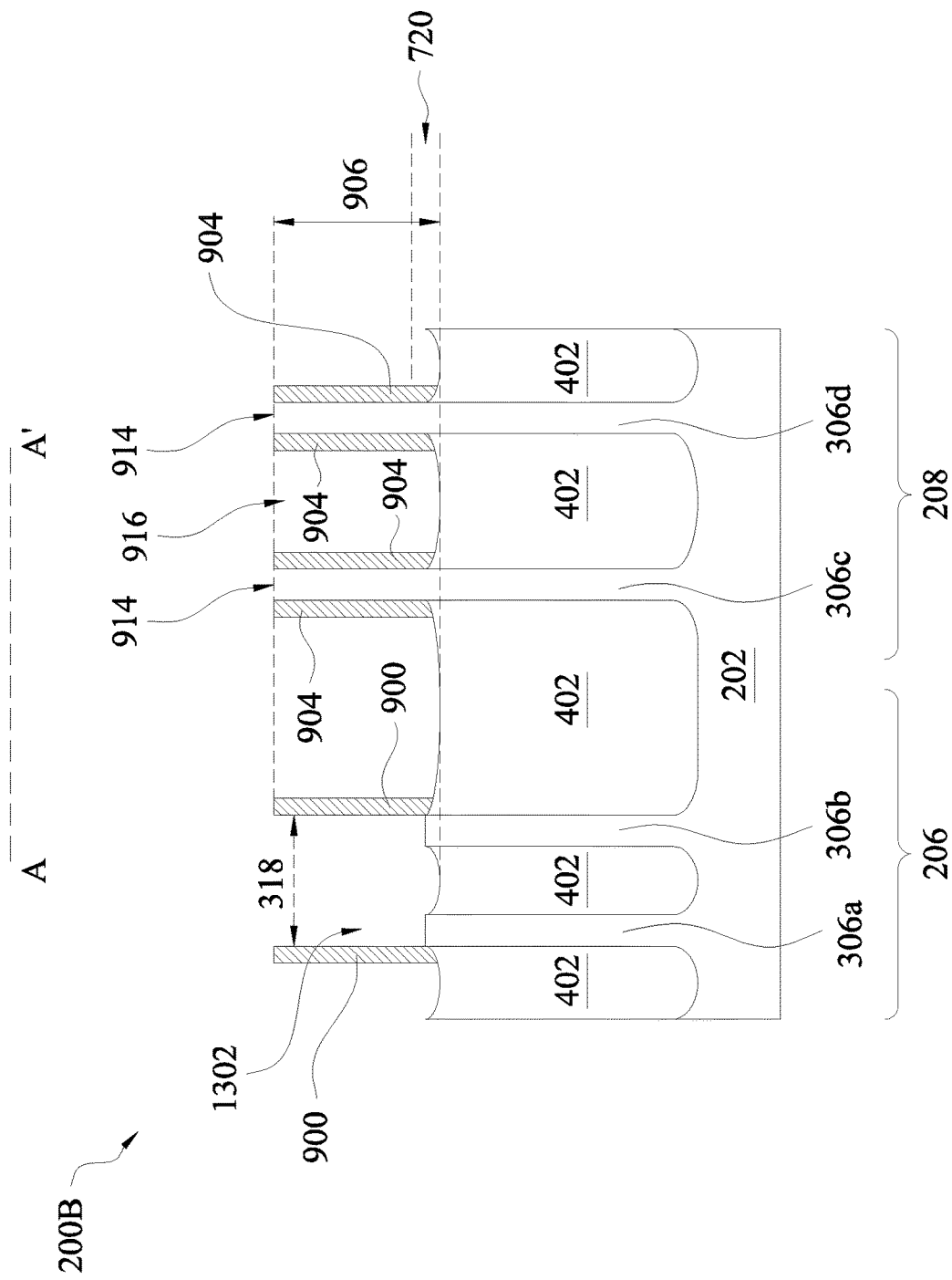
FIGS. 13B, 14B, 15B, and 16B are cross-sectional views, corresponding to the isometric views of FIGS. 13A, 14A, 15A, and 16A, of an embodiment of the semiconductor structure 200B according to aspects of the method of FIGS. 1A, 1B, 1C, and 1D.

Referring now to the example of FIGS. 13A and 13B, at block 116, after the etching process is performed, top portions of the implanted portion 804 are removed to form spacers disposed along fin elements. As illustrated in FIGS. 13A and 13B, in some embodiments, after the etching process is performed, the first region 206 includes outer spacers 900 having an outer spacer height 906 disposed along the outer sidewalls of the fin elements 306a and 306b, but includes no inner spacers along inner sidewalls of the fin elements 306a and 306b. In some embodiments, various parameters (e.g. dimensions of the fin elements, thickness 720 of the first spacer layer 702, the tilt angle 802, dopant species, ion beam energy, implantation dose of the implantation process 800) may be designed to achieve the desired etch selectivity for the implanted portion 804 and the portion 806, so that the portion 806 is completely removed by the etching process, while the outer spacer 900 having an outer spacer height 906 is formed. For example, it may be designed so that the ratio between the first etch rate of the portion 806 and the second etch rate of the implanted portion 804 is about (height 808)/(height 716+thickness 720 −outer spacer height 906). In a particular example, the height 808 is about 44 nm, the height 716 is about 54 nm, the thickness 720 is about 5 nm, the outer spacer height 906 is about 39 nm, and the ratio between the first etch rate and the second etch rate is about 2.2.

In some embodiments, top portions of the fin elements 306a, 306b, 306c, and 306d are removed (using the same etching process or a separate etching process). As illustrated in FIGS. 13A and 13B, in the first region 206, a trench 1302 having a width 318 is formed between spacers 900, exposing the top surfaces of the fin elements 306a and 306b.

Figure 14A:
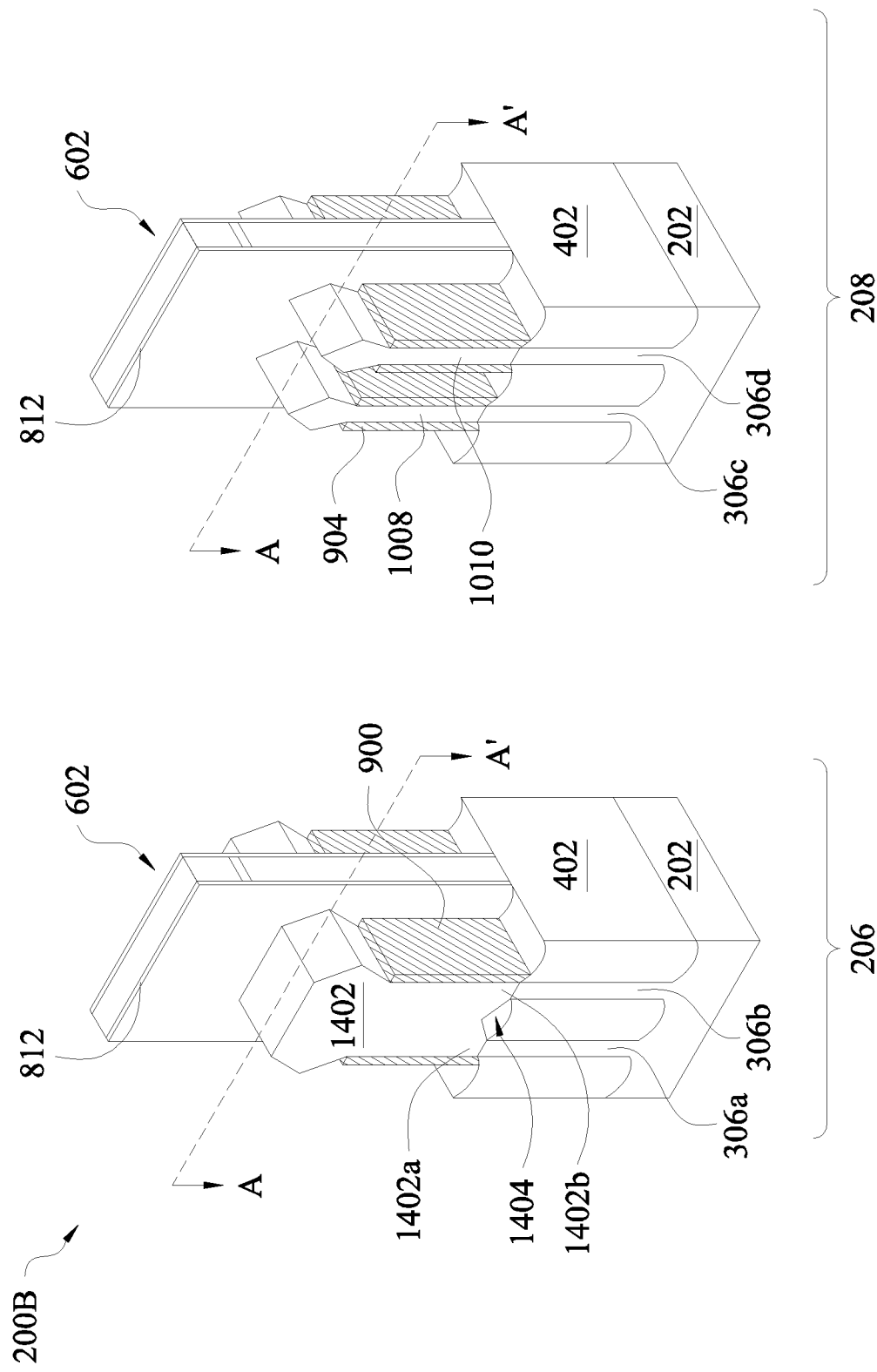
Figure 14B:
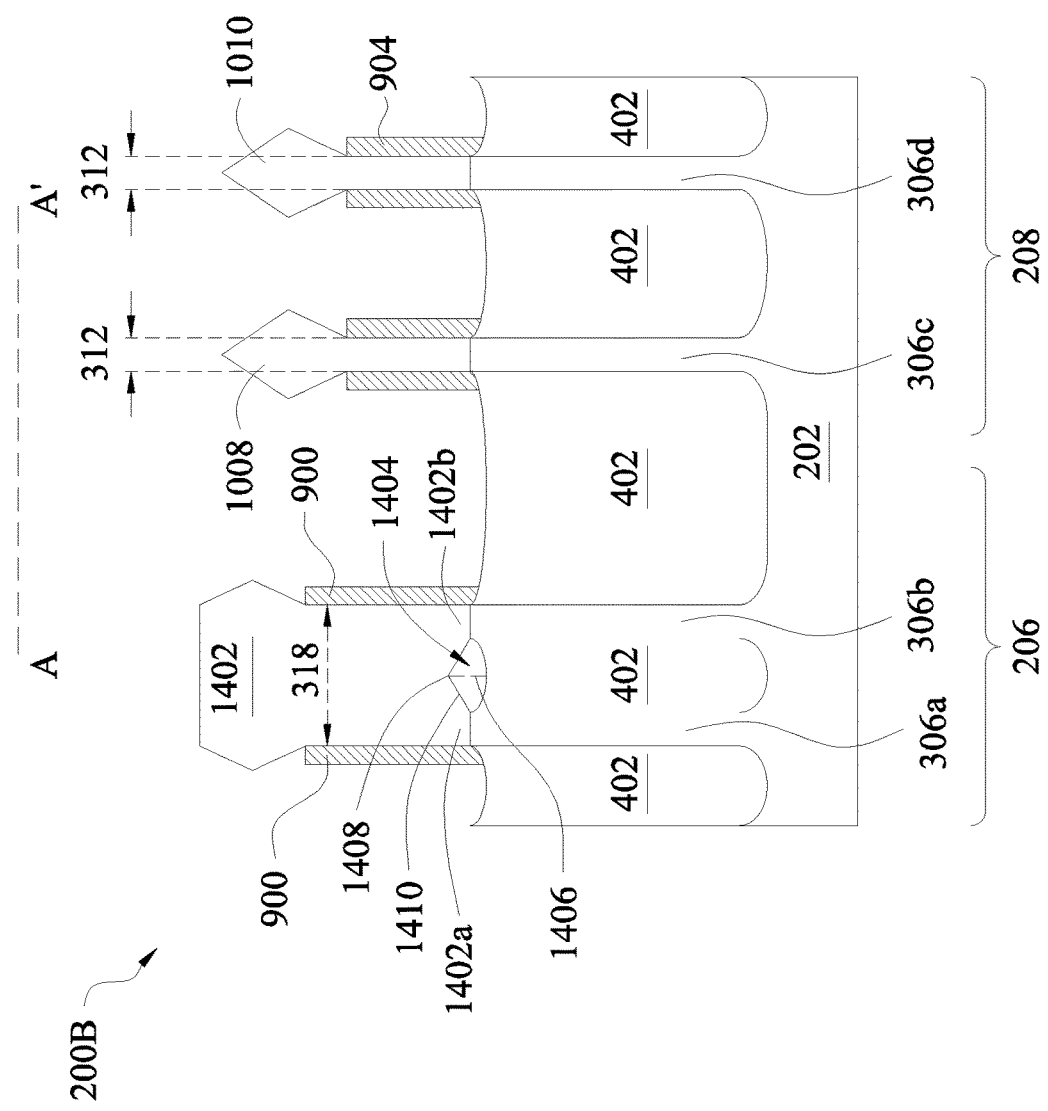

Referring now to FIGS. 1B, 14A, and 14B, the method 100 proceeds to block 118, where source/drain features are formed in the first and second regions of the semiconductor structure 200B. Referring now to the examples of FIGS. 14A and 14B, in the first region 206, a source/drain feature 1402 is formed over the fin elements 306a and 306b in the trench 1302. The growth of the source/drain feature 1402 is laterally constrained by outer spacers 900, and is not laterally constrained by any inner spacers disposed along inner sidewalls of the fin elements 306a and 306b. Specifically, the source/drain feature 1402 includes a source/drain feature 1402a and a source/drain feature 1402b formed by epitaxially growing a semiconductor material on the exposed surfaces of fin elements 306a and 306b respectively. The growth of each of the source/drain features 1402a and 1402b is only laterally constrained by a single spacer 900. In other words, only a sidewall of each of the source/drain features 1402a and 1402b is defined by a spacer 900. In some embodiments, the source/drain features 1402a and 1402b may include sidewalls 1410 extending from inner sidewalls of the fin elements 306a and 306b in a direction not perpendicular to a top surface of the STI feature 402. The source/drain features 1402a and 1402b merge at a merge point 1408, and then grow into the merged source/drain feature 1402. A distance 1406 may extend between the merge point 1408 and a top surface of the STI feature 402. In some embodiments, the distance 1406 is less than the spacer outer spacer height 906 of the outer spacers 900 and/or the height of the spacers 904. In some examples, the height 1406 is in a range of between about 1 nm and 5 nm. In some embodiments, an air-gap 1404 is formed between the source/drain feature 1402 and a top surface of the STI 402. The air-gap 1404 has a substantially triangular-shape in the cross-section defined by the sidewalls 1410 joining at the merge point 1408 and a top surface of the STI feature 402.

In various embodiments, the grown semiconductor material of source/drain features 1402, 1008, and/or 1010 may be substantially similar to the semiconductor material of source/drain features 1002, 1008, and/or 1010 discussed above with reference to FIGS. 10A and 10B.

Figure 15A:
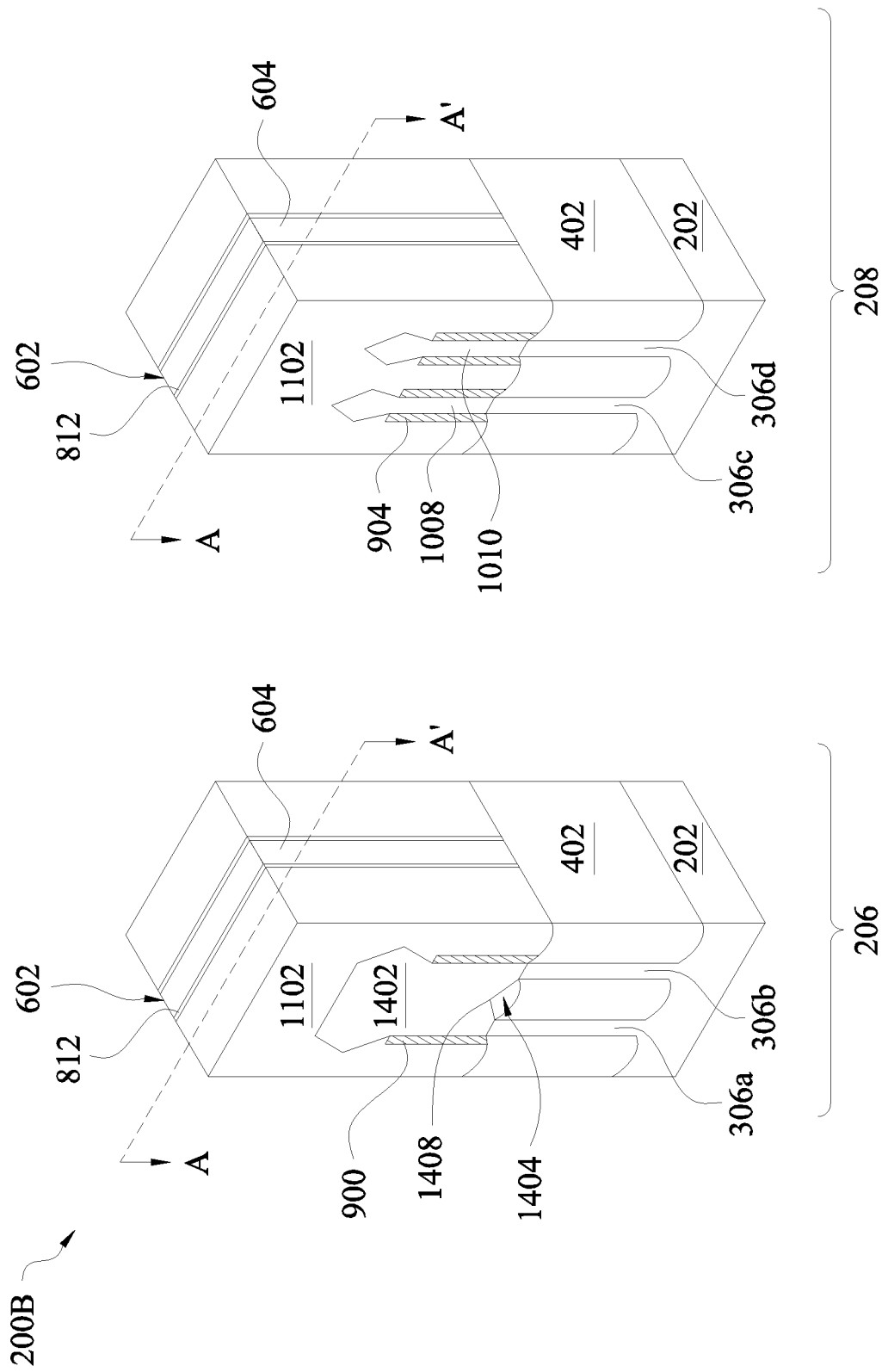
Figure 15B:
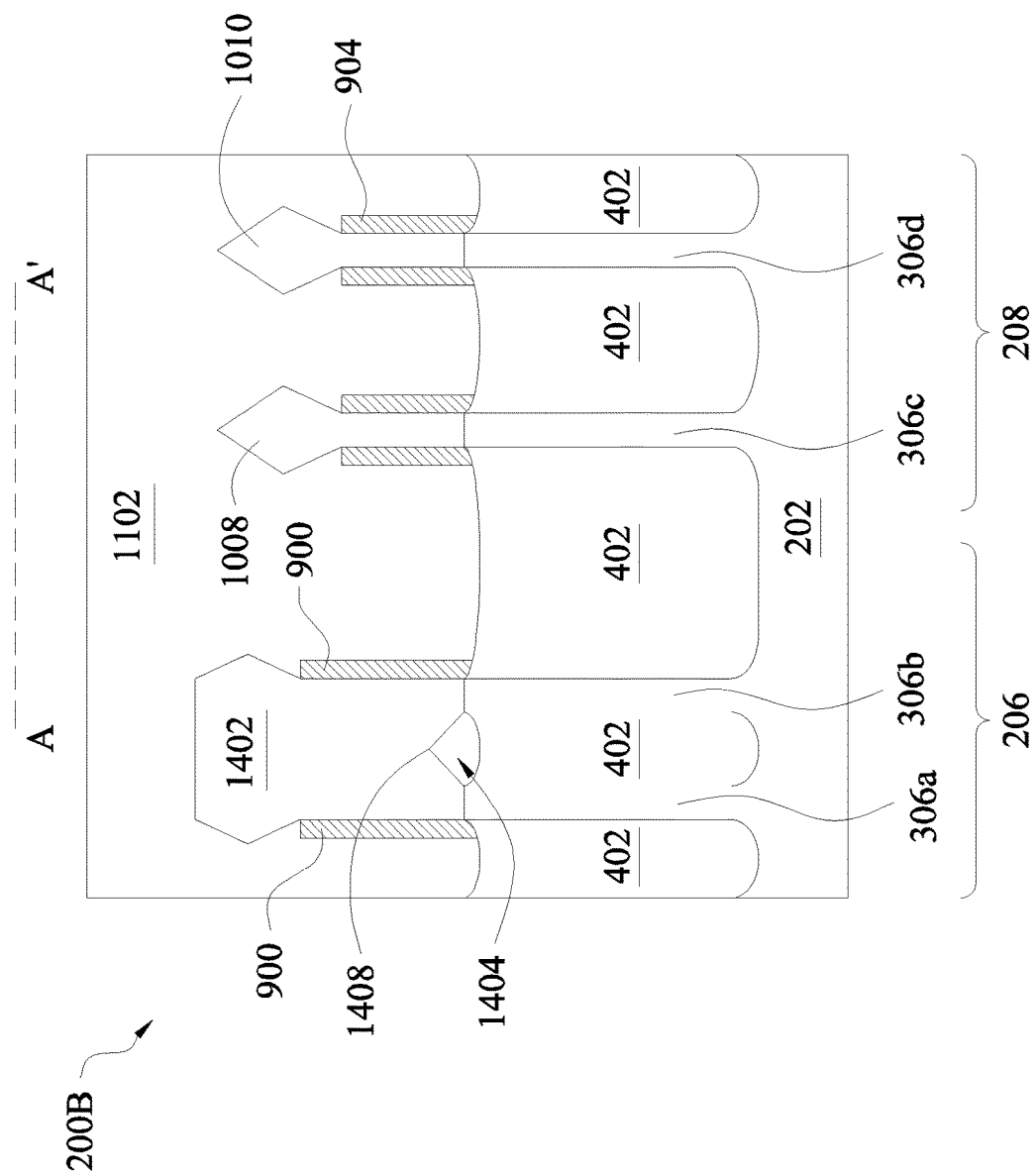

Referring now to FIGS. 1B, 15A, and 15B, the method 100 proceeds to block 120, where an ILD layer is formed. Referring to the example of FIGS. 15A and 15B, in an embodiment of block 120, an ILD layer 1102 is formed over the substrate 202. In some embodiments, a contact etch stop layer (CESL) is also formed over the substrate 202 prior to forming the ILD layer 1102. The ILD layer 1102 may be substantially similar to the ILD layer 1102 discussed above with reference to FIGS. 11A and 11B. In some examples, after depositing the ILD layer 1102, a planarization process (e.g., CMP) may be performed to expose a top surface of the dummy gate structure 602, including, for example, removing the hard mask 606.

Figure 16A:
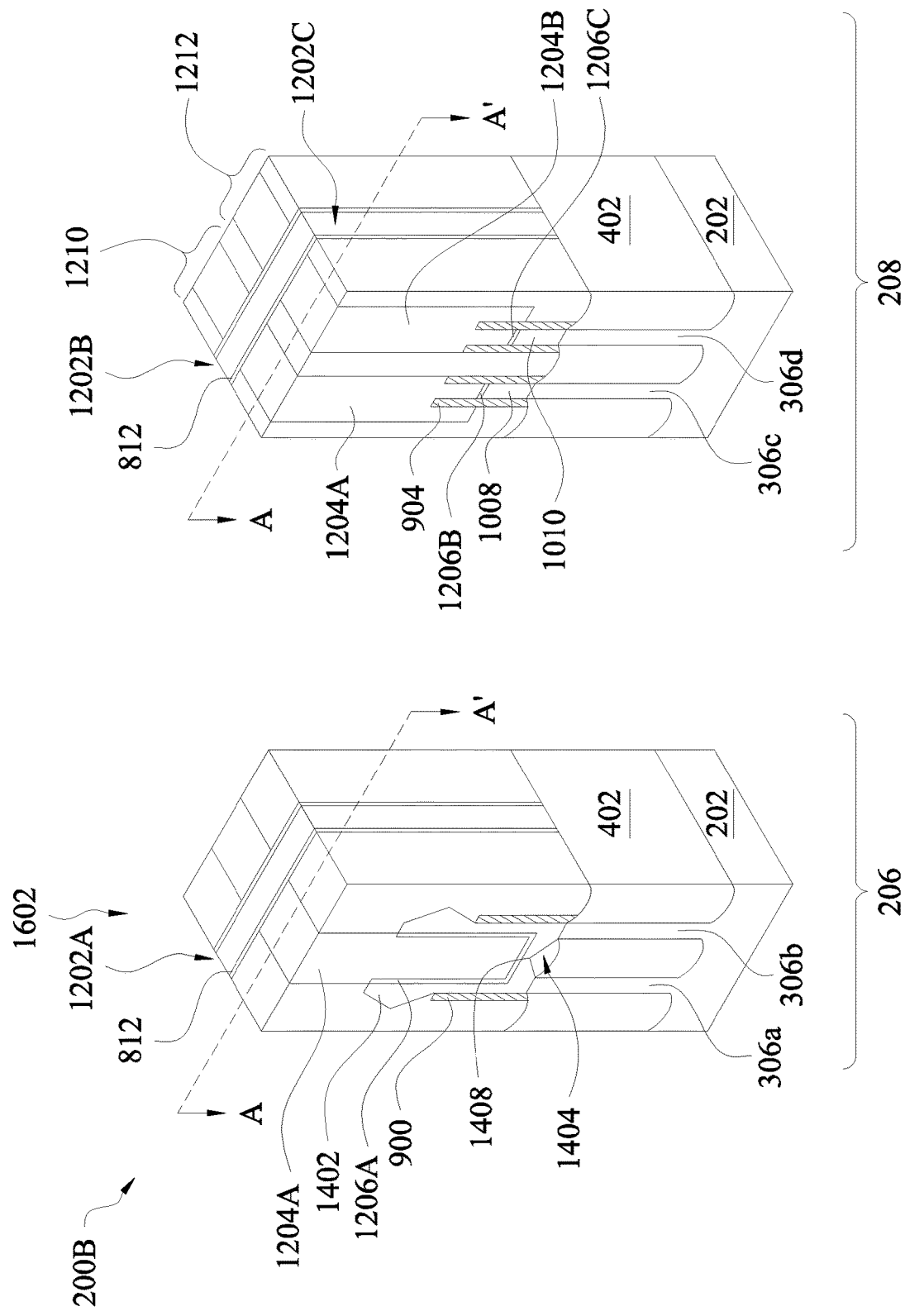
Figure 16B:
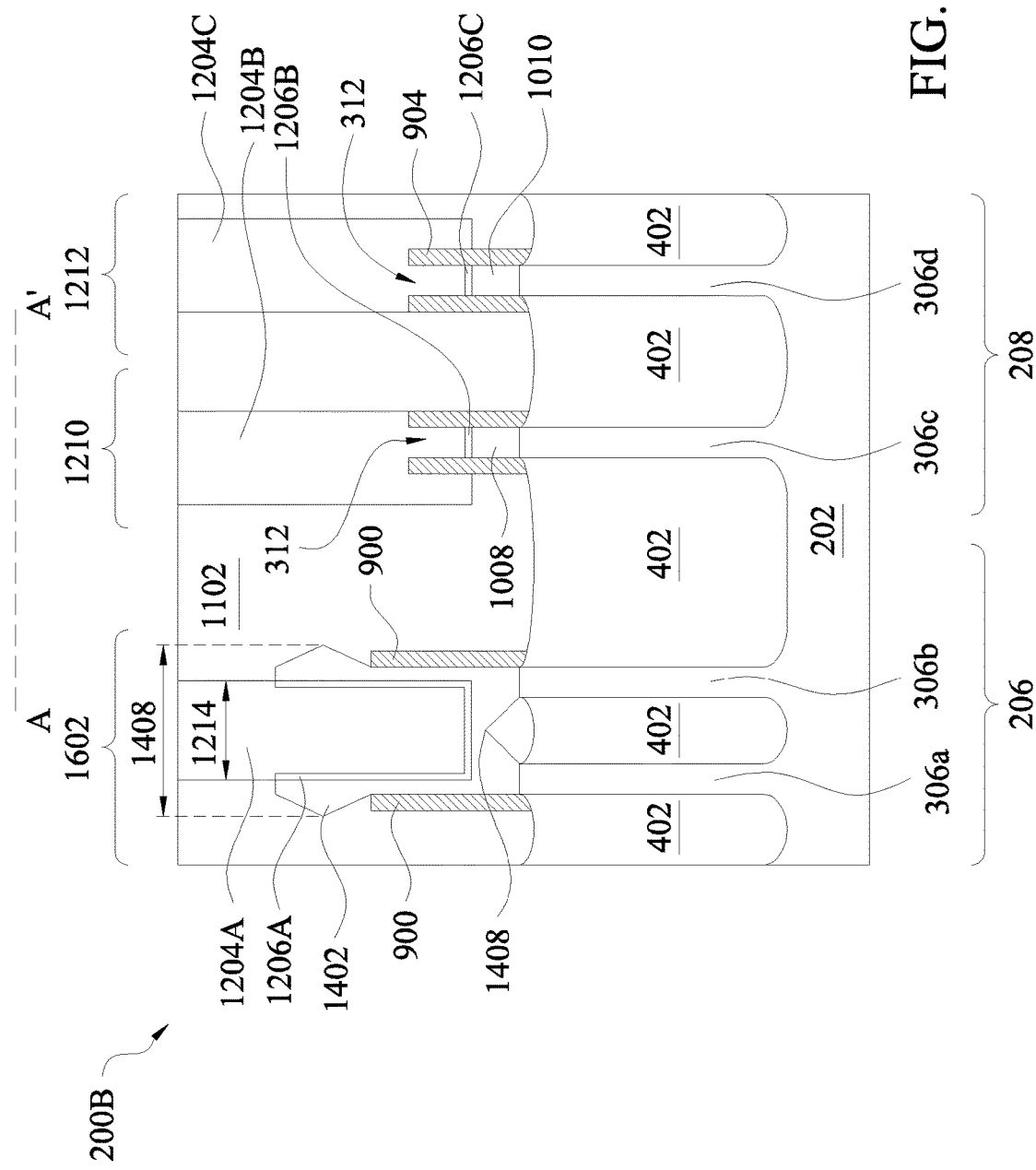

Referring now to FIGS. 1B, 16A, and 16B, the method 100 proceeds to block 122, where a replacement gate and source/drain contacts are formed. Referring now to the examples of FIGS. 16A and 16B, the previously formed dummy gate structure 602 is removed from the substrate 202. The removal of the dummy gate structure 602 results in an opening or trench. In some embodiments, in the first region 206, a final gate structure 1202A may be subsequently formed in the trench or opening over the fin elements 306a and 306b in the channel region, so that the fin elements 306a and 306b become the fins of a FinFET 1602. In some embodiments, block 122 continues to include forming of source/drain contacts. In some embodiments, in the first region 206, a source/drain contact 1204A may be formed over the source/drain feature 1402 in the source/drain region of the FinFET 1602. The source/drain contact 1204A may include a silicidation feature 1206A having a U-shaped cross-section.

In some embodiments, while the exemplary FIGS. 16A and 16B illustrate two fin elements in the FinFET 1602, in various embodiments, the FinFET 1602 may include any number of fin elements. In some embodiments, the first region 206 is a core region including various logic devices. In one example, the FinFET 1602 may be used to form a logic device, for example, a logic gate such as a NAND gate, a NOR gate, and/or an inverter in the core region.

Referring now to FIGS. 1A and 1C, in an exemplary embodiment of the method 100, after block 112, the method 100 proceeds to the branch B, where a protective layer covering the second region but not the first region may be used to protect the second region when spacers along the fin elements in the first region are removed. In such embodiments, the growth of the source/drain features in the first region is not laterally constrained by any spacers formed along sidewalls of the fin elements in the first region, while the growth of the source/drain features in the second region is laterally constrained by spacers formed along sidewalls of the fin elements in the second region. This is illustrated by the semiconductor structure 200C as illustrated in FIGS. 17A, 17B, 18A, 18B, 19A, 19B, 20A, 20B, 21A, 21B, 22A, 22B, 23A, 23B, 24A, and 24B.

Figure 17A:
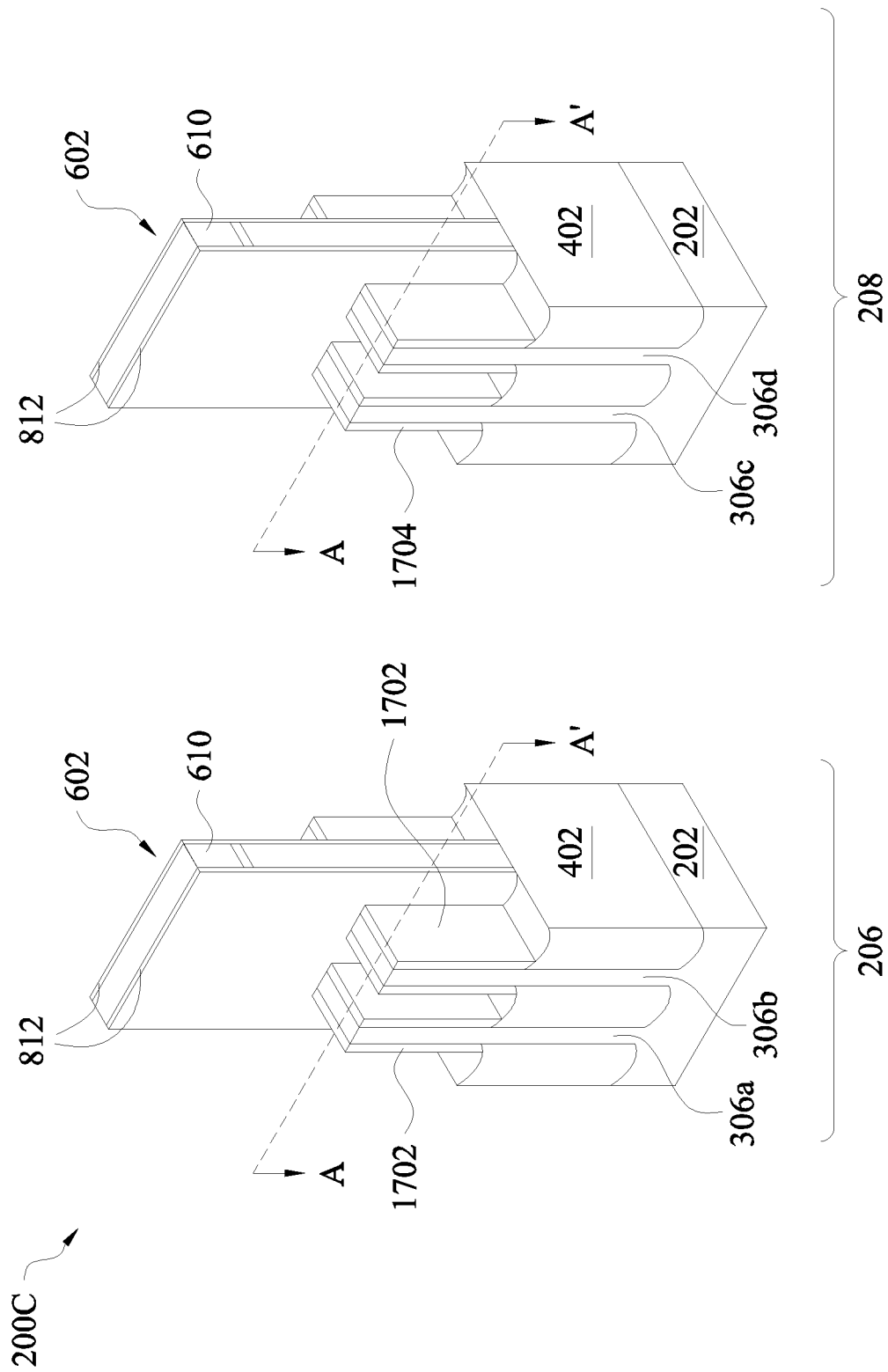
FIGS. 17A, 18A, 19A, 20A, 21A, 22A, 23A, and 24A are isometric views of an embodiment of the semiconductor structure 200C according to aspects of the method of FIGS. 1A, 1B, 1C, and 1D.
Figure 17B:
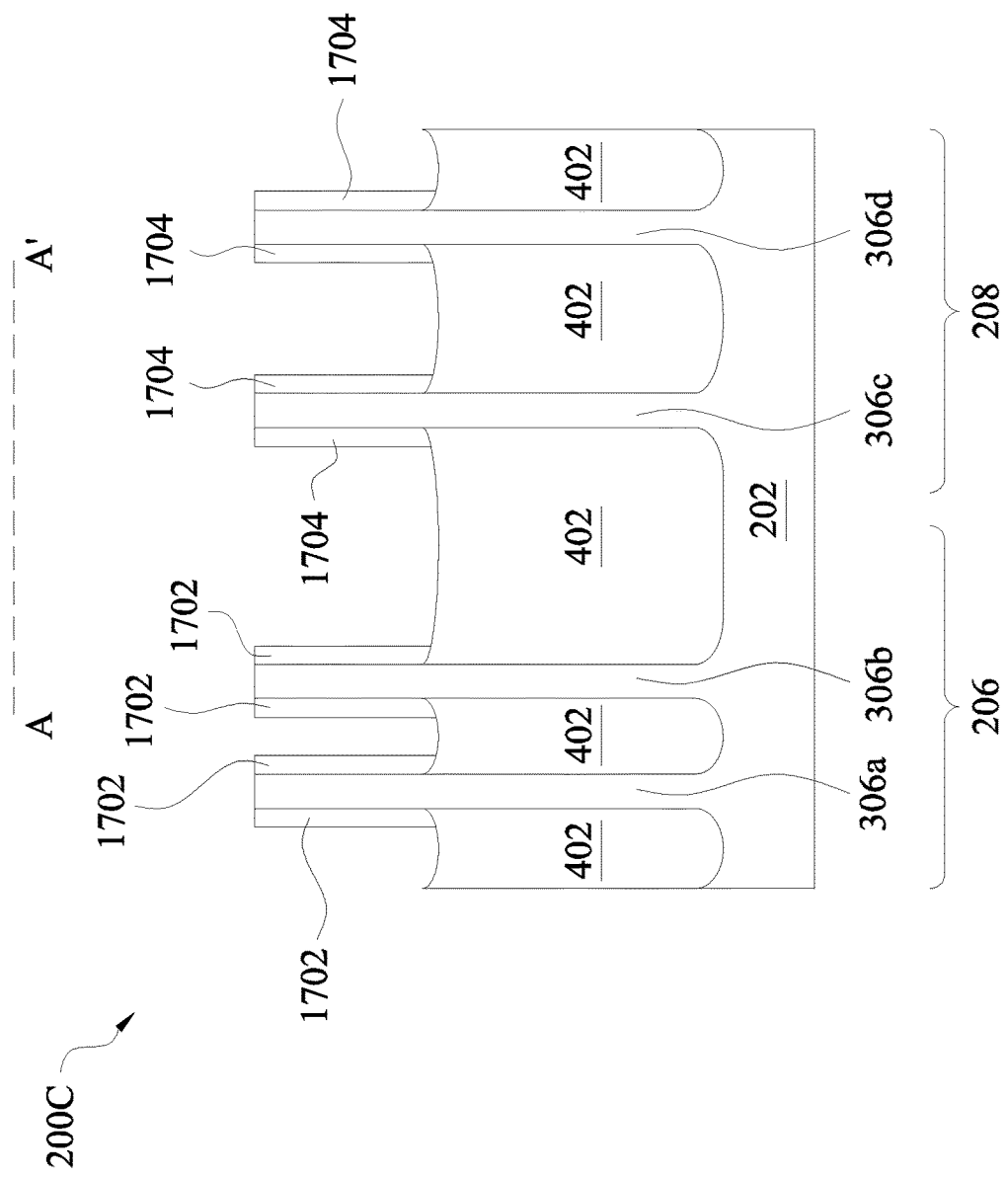
FIGS. 17B, 18B, 19B, 20B, 21B, 22B, 23B, and 24B are cross-sectional views, corresponding to the isometric views of FIGS. 17A, 18A, 19A, 20A, 21A, 22A, 23A, and 24A, of an embodiment of the semiconductor structure 200C according to aspects of the method of FIGS. 1A, 1B, 1C, and 1D.

Referring now to FIGS. 1C, 17A, and 17B, in some embodiments according to the branch B of the method 100, after forming a first spacer layer over the substrate in block 112, the method 100 proceeds to block 124, where an etching process is performed to form spacer elements along fin elements in both the first region and the second region.

Referring to the example of FIGS. 17A and 17B, in some embodiments, a dry etching process is performed to the semiconductor structure 200C to remove upper surface portions of the first spacer layer 702 in the source/drain region (e.g., portions of the first spacer layer 702 covering the top surfaces of dummy gate structure 602, the fin elements 306a, 306b, 306c, and 306d and the STI features 302 in the source/drain region). In some embodiments, in the first region 206, spacers 1702 are formed along sidewalls of the fin elements 306a and 306b. In some embodiments, in the second region 208, spacers 1704 are formed along sidewalls of the fin elements 306c and 306d.

In some embodiments, in both the first region 206 and the second region 208, the first spacer layer 702 may be etched back by the dry etching process to expose the nitride layer 610 of the dummy gate structure 602. The dry etching process may not substantially affect the portions of the first spacer layer 702 formed on sidewalls of the dummy gate structure 602. Thus, the first spacer layer 702 remaining on the sidewalls of the dummy gate structure 602 forms spacers 812.

Figure 18A:
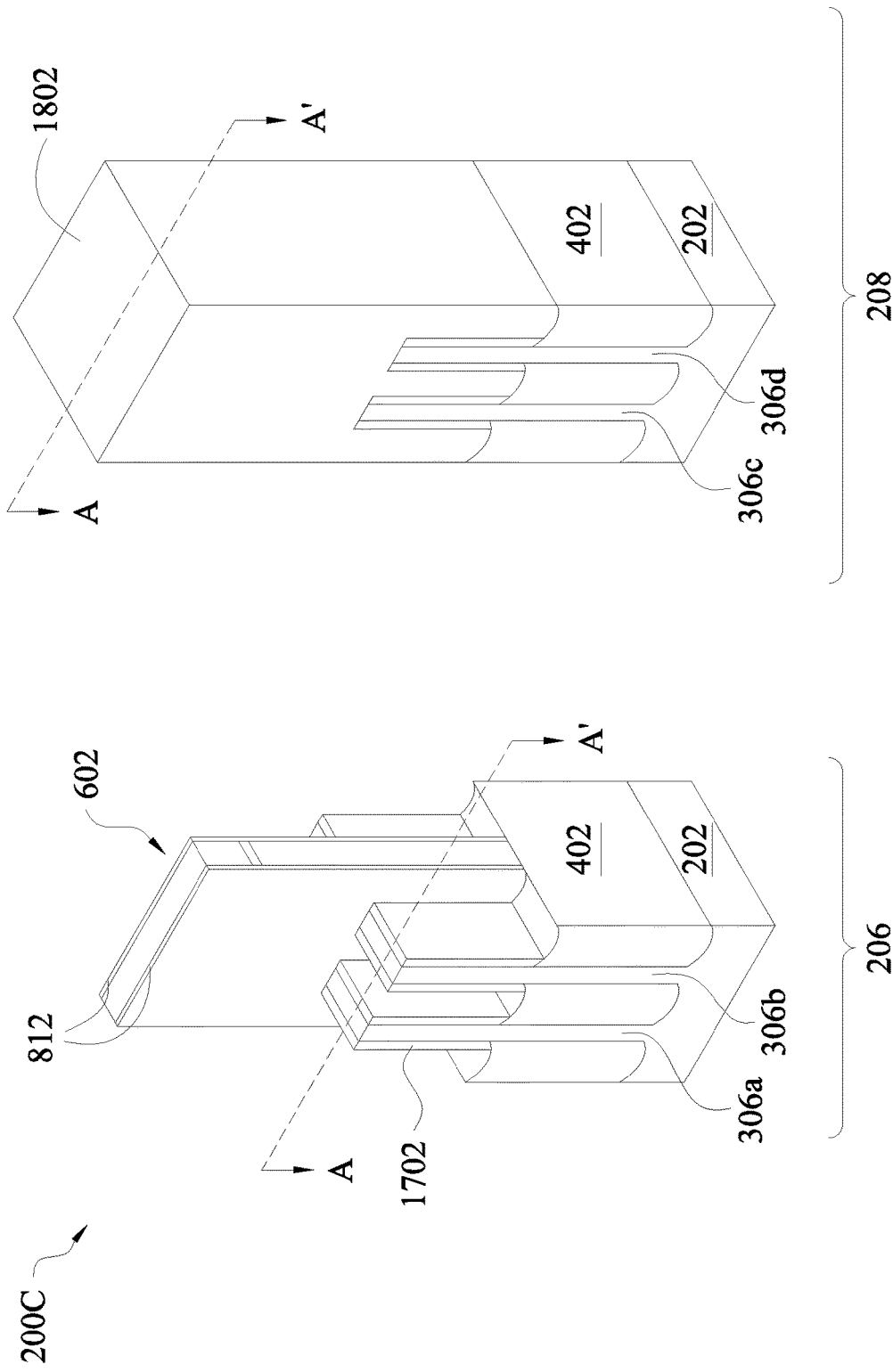
Figure 18B:
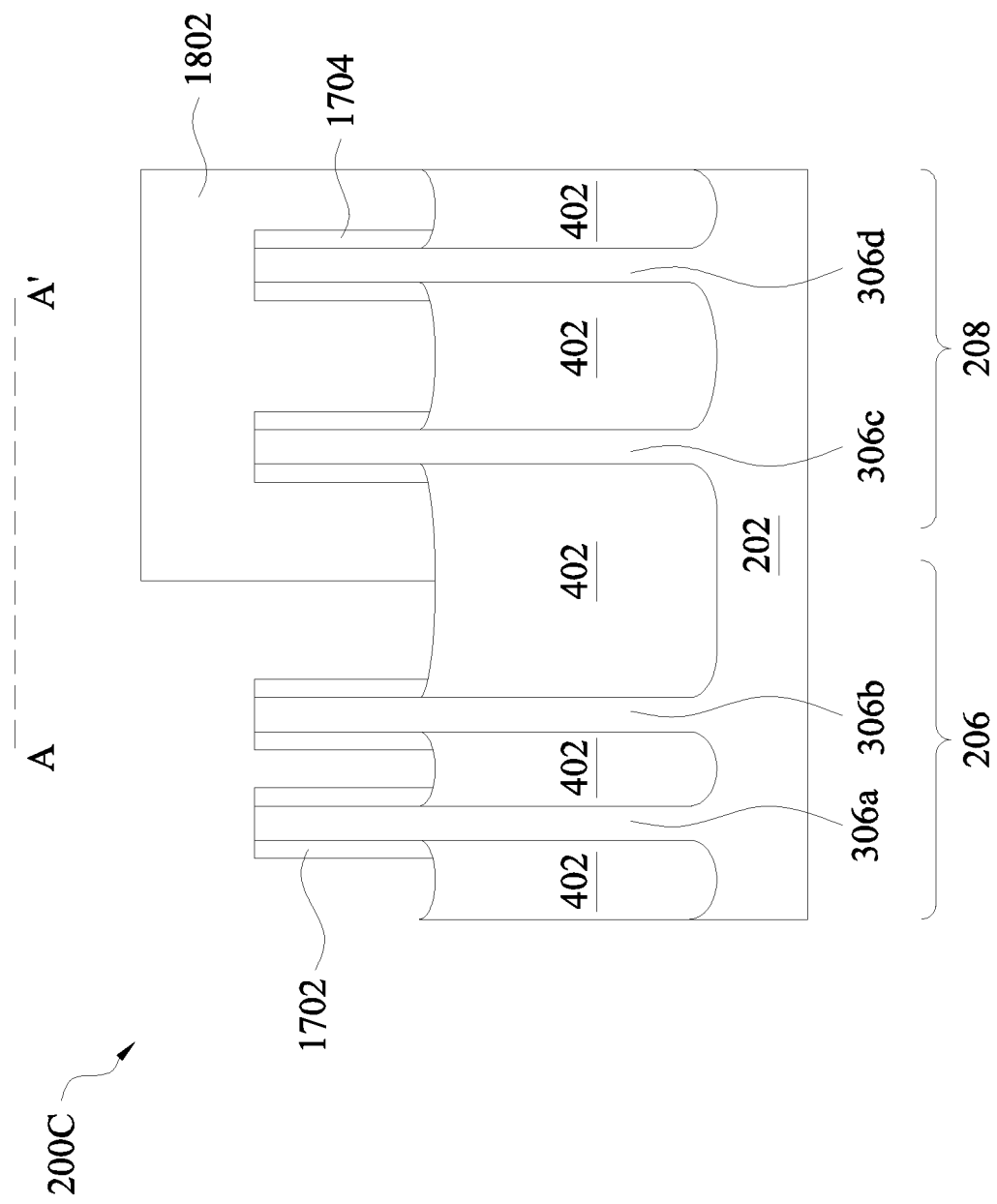

Referring now to FIGS. 1C, 18A, and 18B, the method 100 then proceeds to block 126 of the branch B, where a protective layer is deposited over the second region, while the first region remains exposed. Referring to the example of FIGS. 18A and 18B, a protective layer 1802 may be formed in the second region 208, covering the fin elements 306c and 306d. In some embodiments, the protective layer 1802 includes a photoresist material, and may be formed by a lithography process over the substrate 202. The protective layer 1802 may include an opening exposing the first region 206 while protecting the second region 208.

Figure 19A:
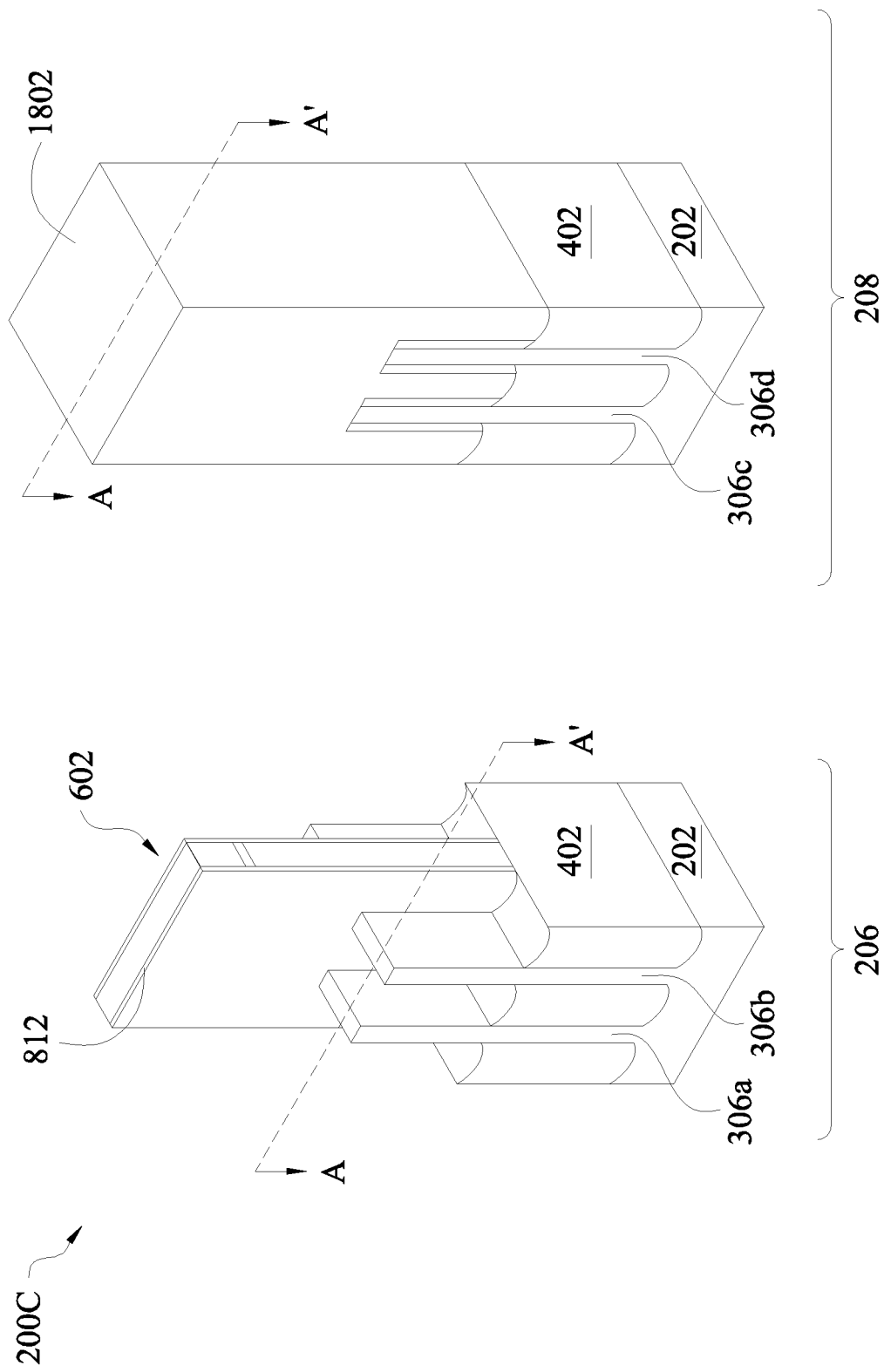
Figure 19B:
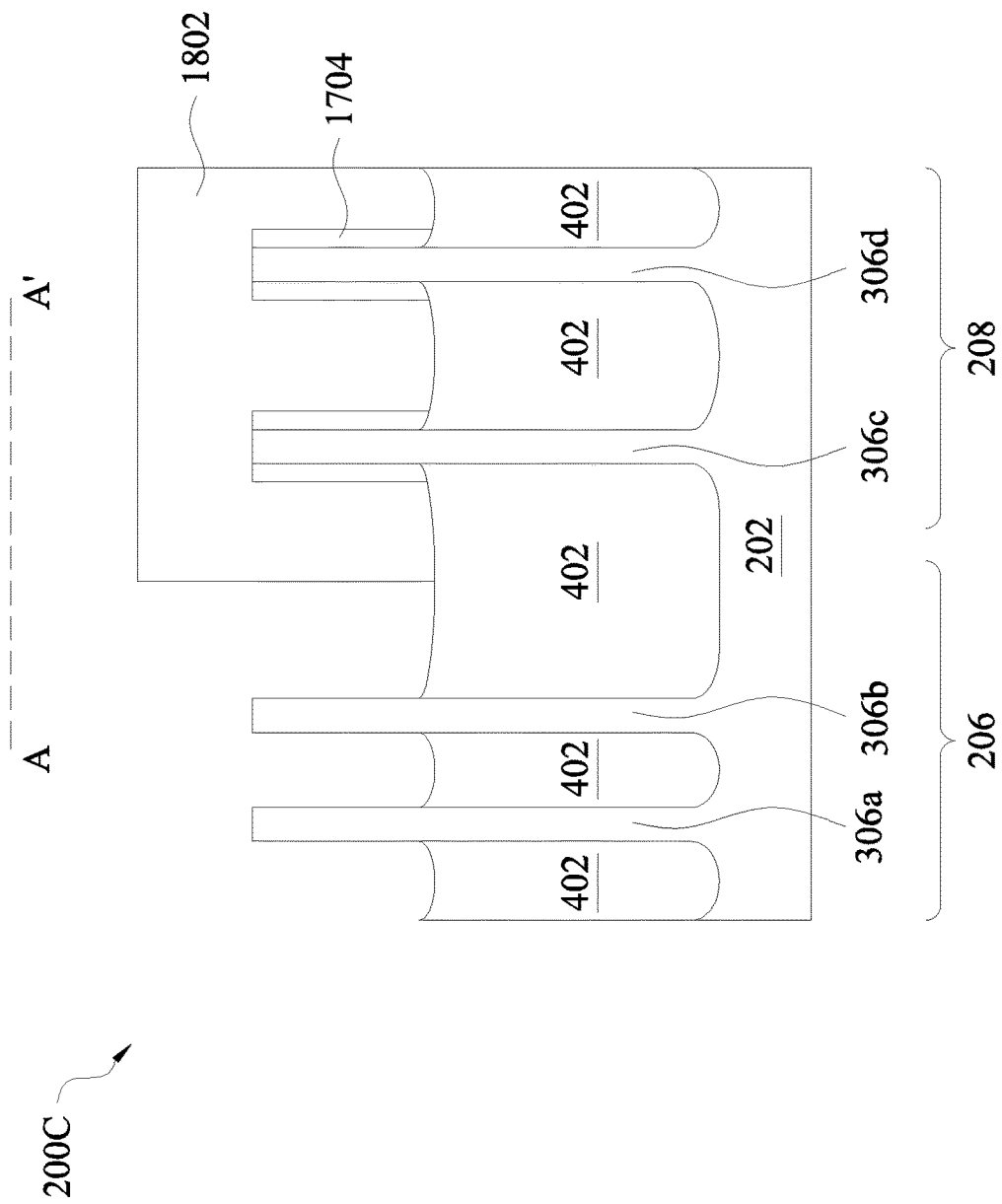

Referring now to FIGS. 1C, 19A, and 19B, the method 100 then proceeds to block 128, where the spacers along the sidewalls of the fin elements in the first region are removed.

Referring to the examples of FIGS. 19A and 19B, in some embodiments, an etching process is performed to remove spacers 1702 in the first region 206. In some embodiments, the etching process may not substantially affect the spacers 812 formed along the sidewalls of the dummy gate structure 812, and/or the fin elements 306a and 306b. In some embodiments, the etching process includes a dry etching process using an etchant including a fluorine-containing gas, a chlorine-containing gas, other etching gas, or a combination thereof, such as $CF_4$, $SF_6$, $NF_3$, or $Cl_2$.

Meanwhile, because the second region 208 has the protective layer 1802 formed thereover, the etching process does not substantially affect the second region 208. In other words, spacers 1704, fin elements 306c and 306d, and the dummy gate structure 602 in the second region 208 remain substantially the same. At this stage of fabrication, the second region 208 includes spacers 1704 along sidewalls of the fin elements 306c and 306d, while the first region 206 does not include any spacers along sidewalls of the fin elements 306a and 306b.

Figure 20A:
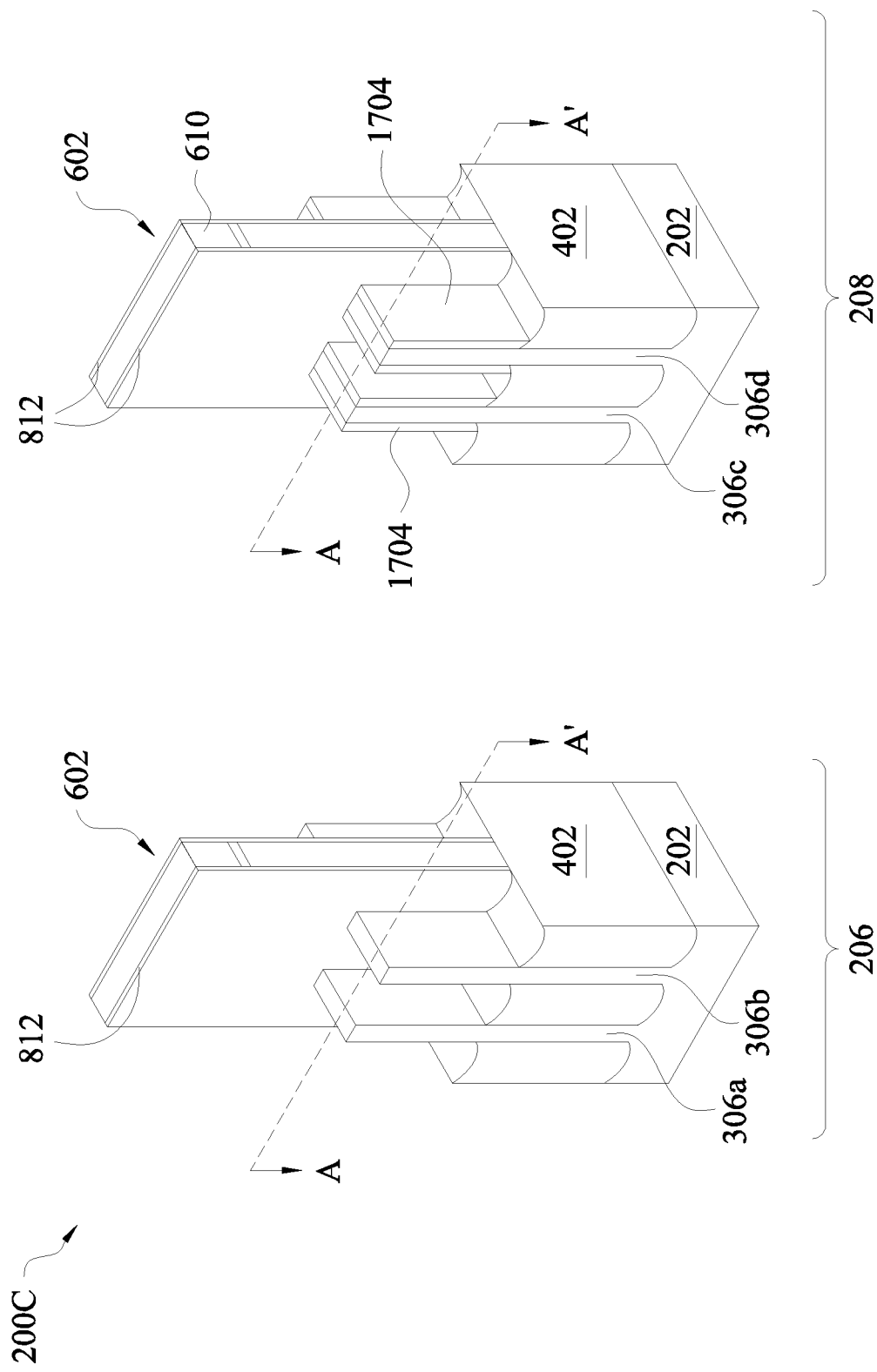
Figure 20B:
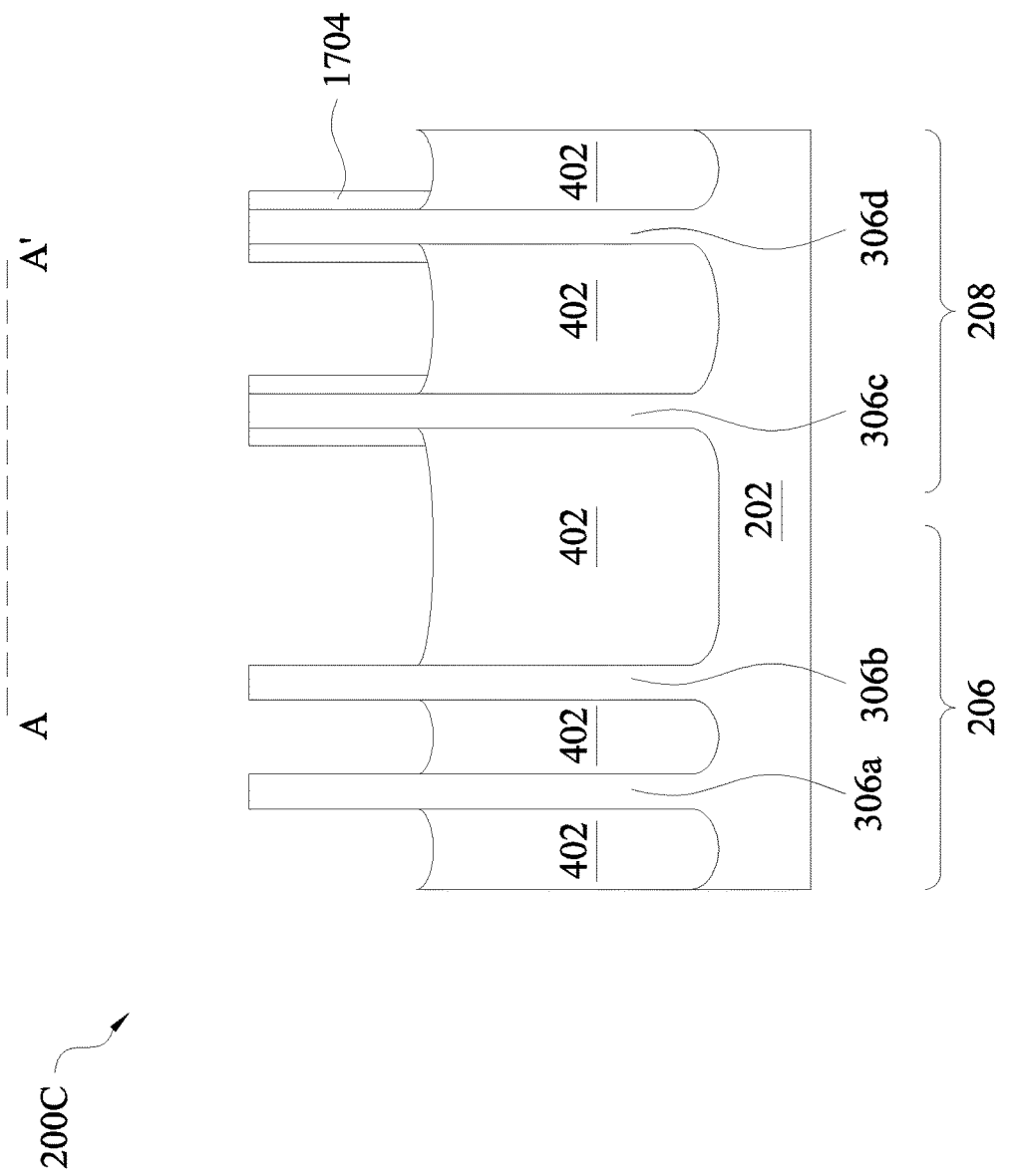

Referring now to FIGS. 1C, 20A, and 20B, the method 100 then proceeds to block 130, where the protective layer over the second region is removed. Referring to the example of FIGS. 20A and 20B, in some embodiments, after the protective layer 1802 is removed, both the first region 206 and the second region 208 are exposed. In some embodiments, the protective layer 1802 may be removed by a photoresist stripping or ashing process.

Figure 21A:
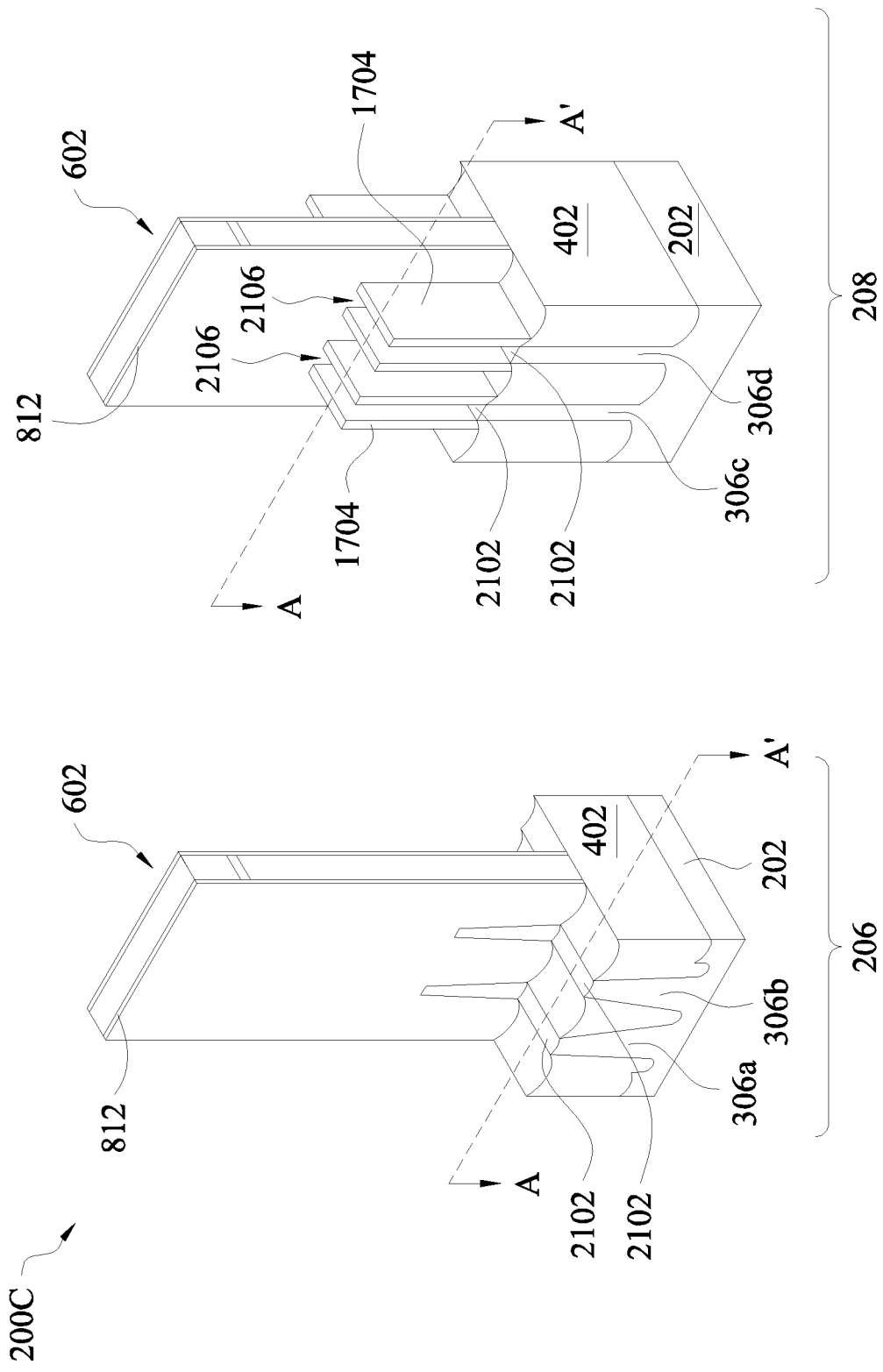
Figure 21B:
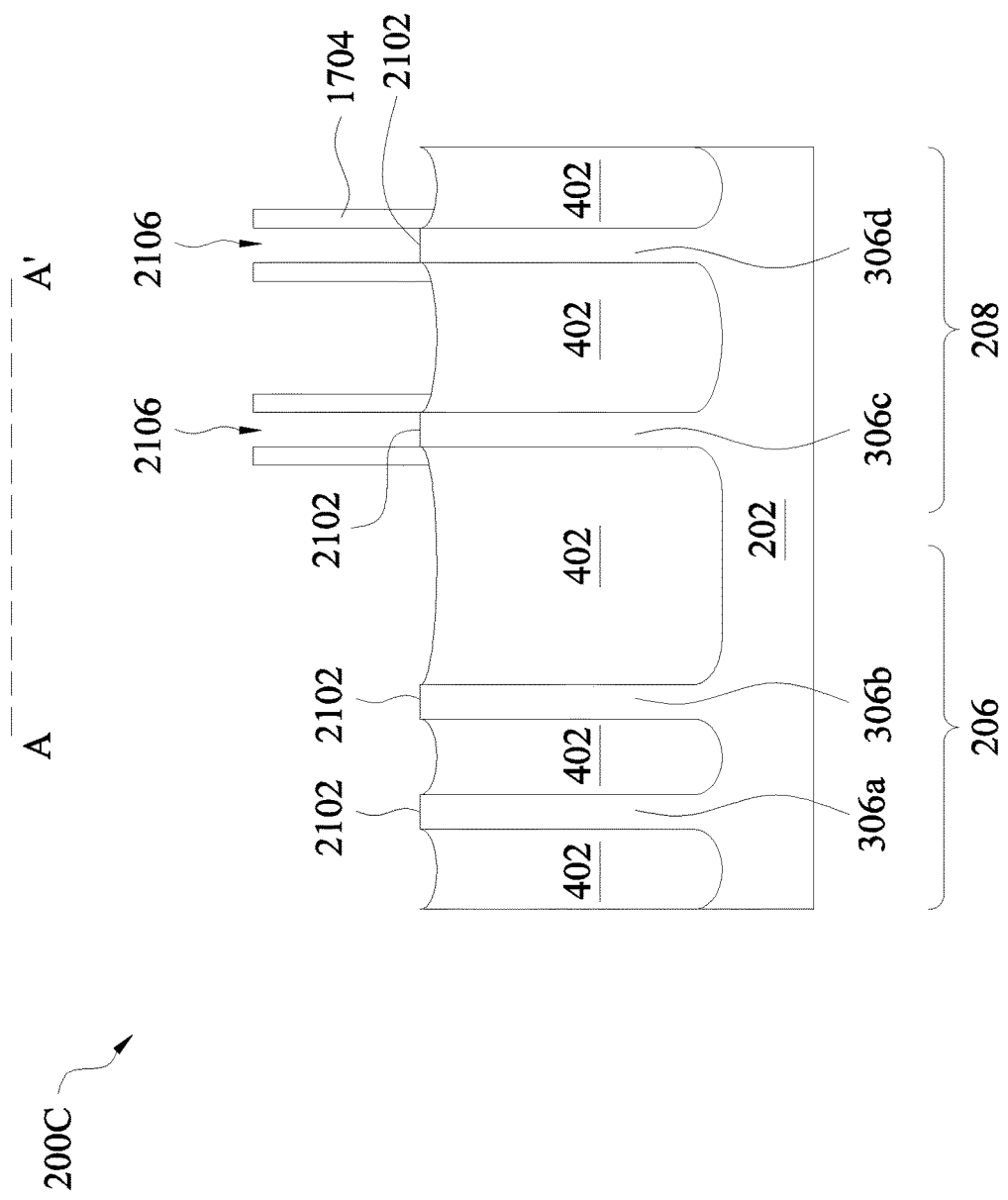

Referring to FIGS. 1C, 21A, and 21B, the method 100 then proceeds to block 132, where exposed fin elements in both the first and second regions are removed. Referring to the examples of FIGS. 21A and 21B, an etching process is performed to remove the fin elements 306a, 306b, 306c, and 306d over the top surface of the STI features 402 in the source/drain regions in both the first region 206 and the second region 208, while the spacers 1704 and 812 remain substantially un-etched.

In some embodiments, in the first region 206, after removing the top portions of the fin elements 306a and 306b in the source/drain region, exposed top surfaces 2102 of the fin elements 306a and 306b in the source/drain region are substantially co-planar with a top surface of the STI features 402.

In some embodiments, in the second region 208, after removing the top portions of the fin elements 306c and 306d in the source/drain region, exposed top surfaces 2102 of the fin elements 306c and 306d are substantially co-planar with a top surface of the STI feature 402. The top surfaces 2102 of the fin elements 306c and 306d may be exposed in trenches 2106 defined by the spacers 1704. In some embodiments, the dry etching process may not substantially affect the spacers 1704 formed along the sidewalls of the fin elements 306c and 306d in the second region. For example, the dry etching process may use an etchant including fluorine and/or oxygen.

Figure 22A:
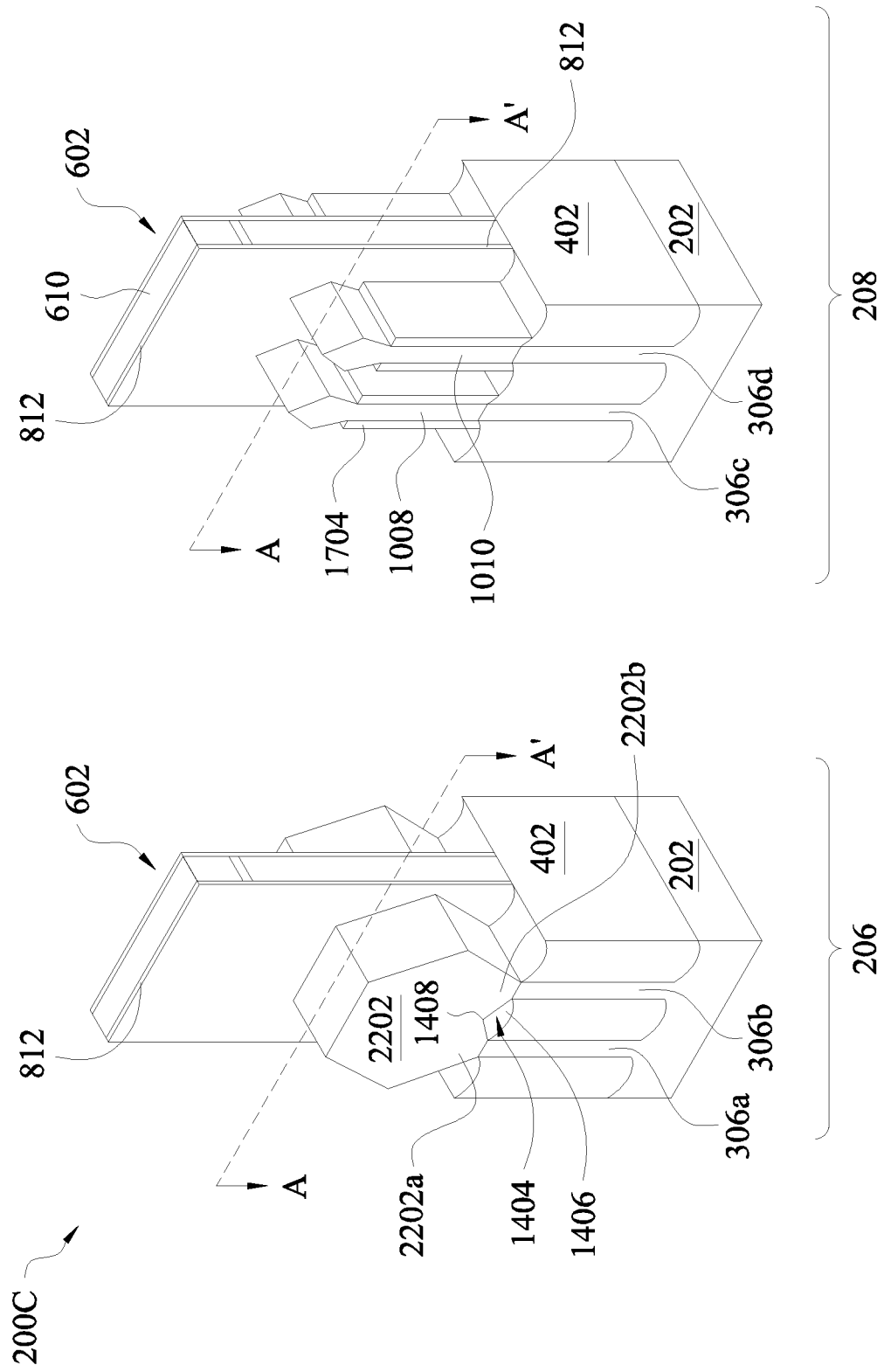
Figure 22B:
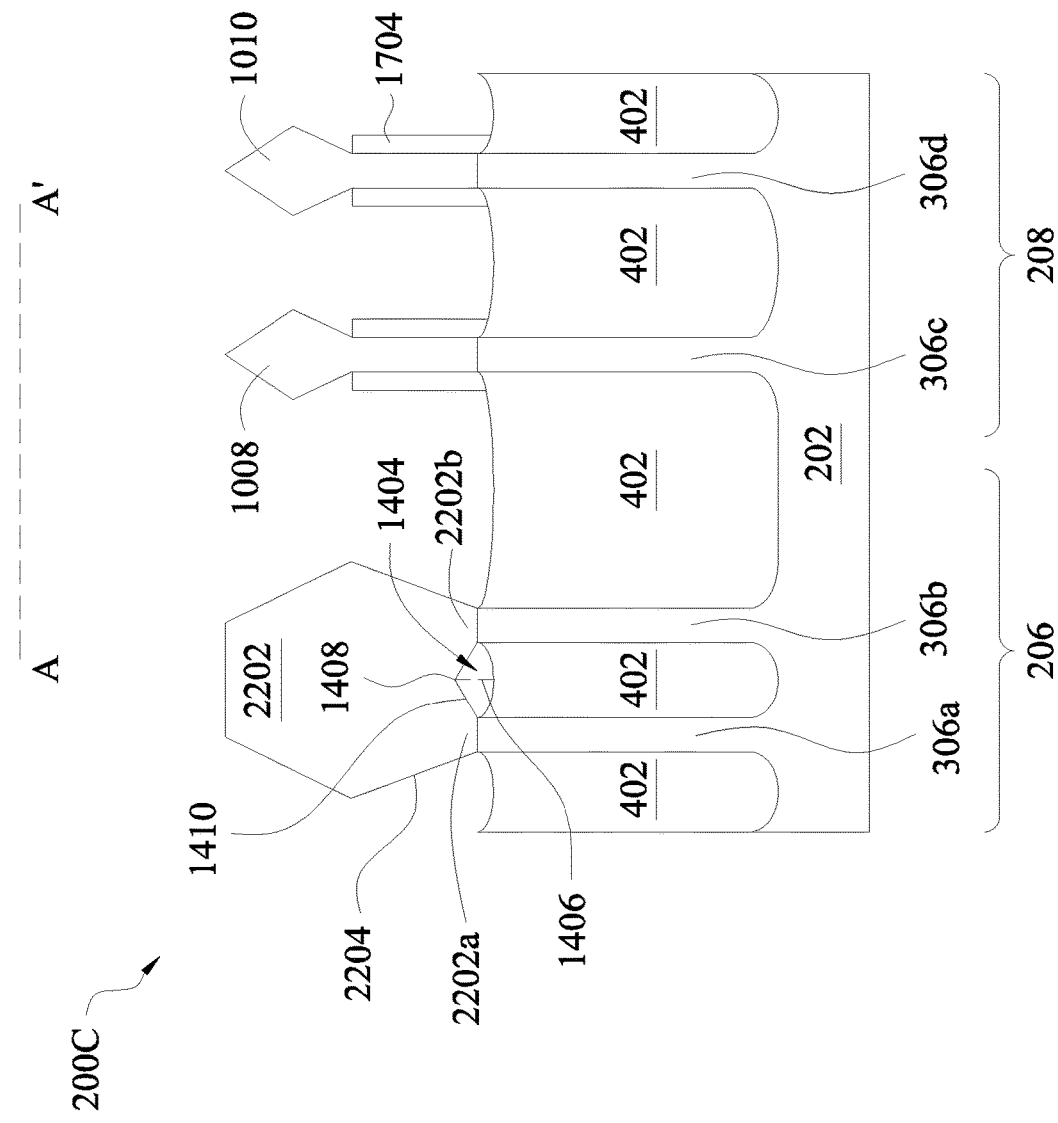

Referring to FIGS. 1C, 22A, and 22B, the method 100 proceeds to block 134, where source/drain features are formed in the first and second regions of the semiconductor structure 200C. Referring now to the examples of FIGS. 22A and 22B, in some embodiments, in the first region 206, a source/drain feature 2202 is formed over the fin elements 306a and 306b. The growth of the source/drain feature 2202 is not laterally constrained any spacers. Specifically, the source/drain feature 2202 includes a source/drain feature 2202a and a source/drain feature 2202b formed by epitaxially growing a semiconductor material on the exposed surfaces of fin elements 306a and 306b respectively. The growth of each of the source/drain features 2202a and 2202b is not laterally constrained by any spacers. In some embodiments, the source/drain features 2202a and 2202b may include sidewalls 1410 extending from inner sidewalls of the fin elements 306a and 306b in a direction not perpendicular to a top surface of the STI feature 402. In some embodiments, the source/drain features 2202a and 2202b may include outer sidewalls 2204 extending from outer sidewalls of the fin elements 306a and 306b in a direction not perpendicular to a top surface of the STI feature 402.

In some embodiments, the source/drain features 2202a and 2202b merge at a merge point 1408, and then grow into the source/drain feature 2202. A distance 1406 extends between the merge point 1408 and a top surface of the STI features 402. In some embodiments, the distance 1406 is less than the height of the spacers 904. In one example, the distance 1406 is in a range of between about 2 nm and 5 nm. In some embodiments, an air-gap 1404 between the source/drain feature 2202 and a top surface of the STI 402 may be formed. The air-gap 1404 may have a height 1406 and has a substantially triangular-shape in the cross-section defined by the sidewalls 2206 of the respective epitaxial features 2202a and 2202b and a top surface of the STI features 402.

In some embodiments, in the second region 208, source/drain features 1008 and 1010 include a material formed by epitaxially growing a semiconductor material on the fin elements 306c and 306d respectively. The growth of each of the source/drain features 1008 and 1010 is laterally constrained by two spacers 1704 disposed along sidewalls of the respective fin element. In an example, after filling the trenches 2106 over the fin elements 306c and 306d respectively, the source/drain features 1008 and 1010 protrude out of the trenches 2106. In some embodiments, the protruding portions of the source/drain features 1008 and 1010 do not merge.

In various embodiments, the grown semiconductor material of source/drain features 2202, 1008, and/or 1010 may be substantially similar to the semiconductor material of source/drain features 1002, 1008, and/or 1010 discussed above with reference to FIGS. 10A and 10B.

Figure 23A:
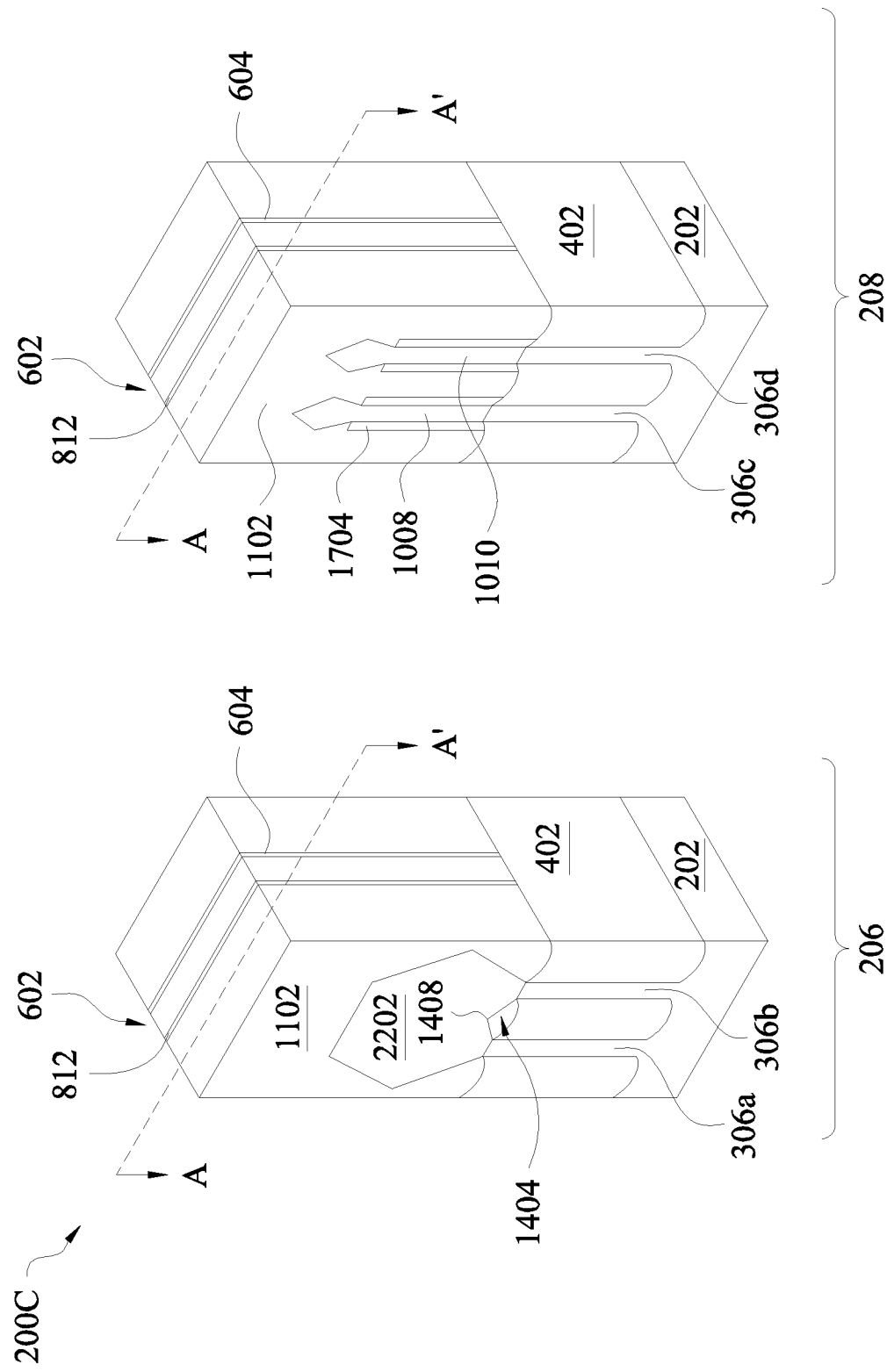
Figure 23B:
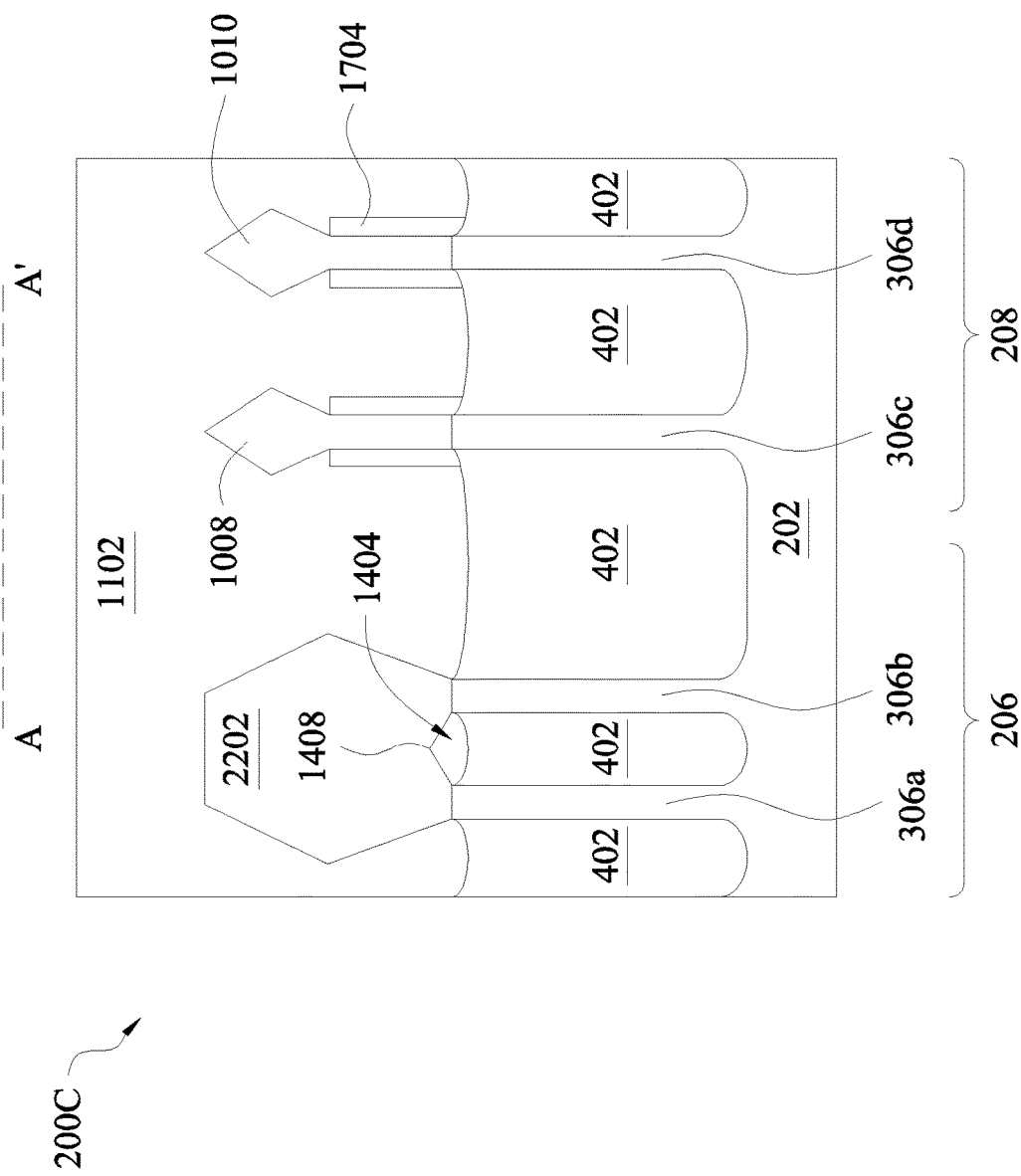

Referring to FIGS. 1C, 23A, and 23B, the method 100 proceeds to block 136, where an inter-layer dielectric (ILD) layer is formed. Block 136 may be substantially similar to block 120 of the method 100. Referring to the example of FIGS. 23A and 23B, in an embodiment of block 136, an ILD layer 1102 is formed over the substrate 202. In some embodiments, a contact etch stop layer (CESL) is also formed over the substrate 202 prior to forming the ILD layer 1102. The ILD layer 1102 may be substantially similar to the ILD layer 1102 discussed above with reference to FIGS. 11A and 11B. In some examples, after depositing the ILD layer 1102, a planarization process (e.g., CMP) may be performed to expose a top surface of the dummy gate structure 602, including, for example, removing the hard mask 606.

Figure 24A:
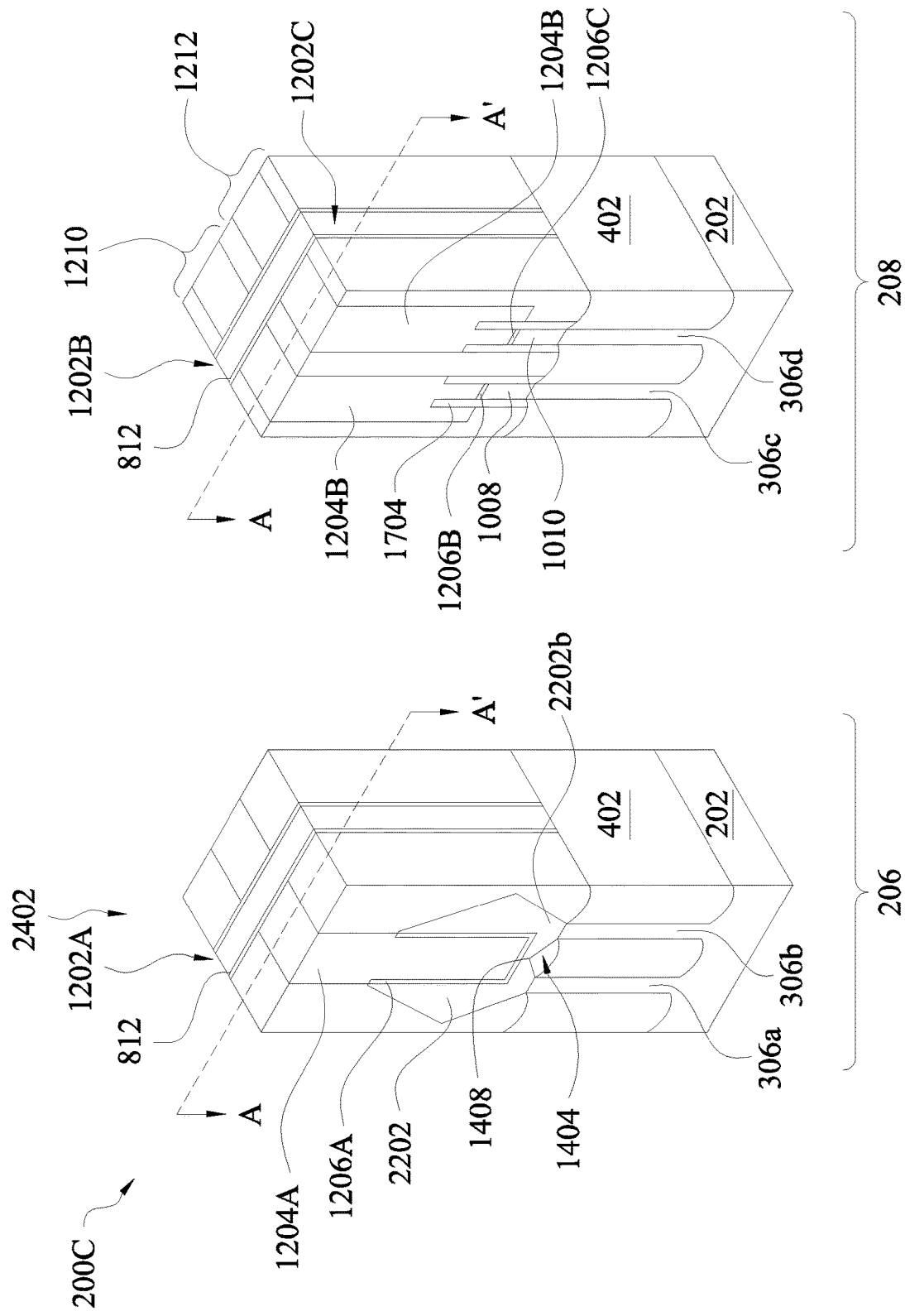
Figure 24B:
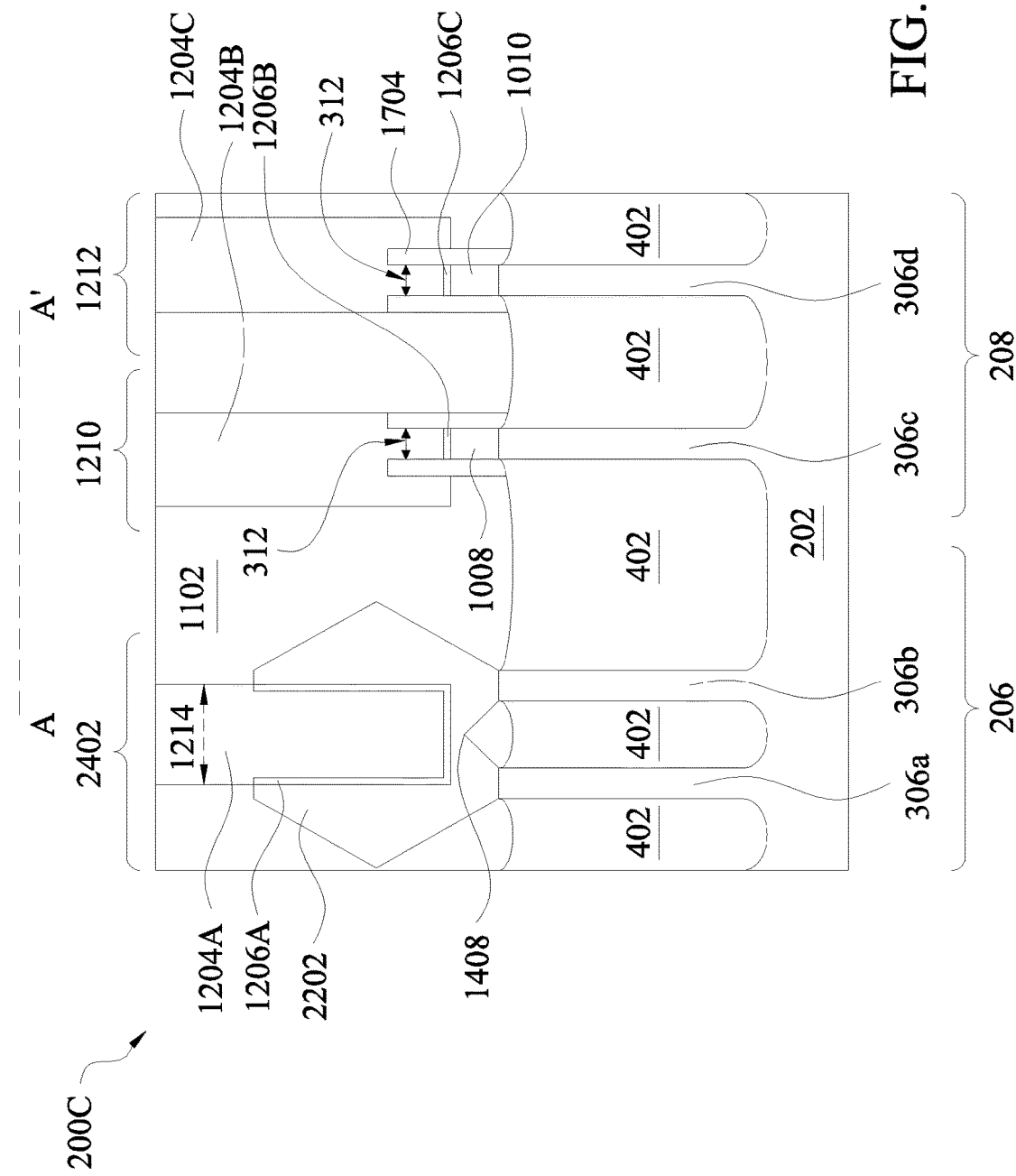

Referring now to FIGS. 1C, 24A, and 24B, the method 100 proceeds to block 138, where a replacement gate and source/drain contacts are formed. Block 138 includes removing the dummy gate structure or portion thereof and replacing it with a functional gate, for example, a high-k/metal gate stack. Block 123 may also include forming of source/drain contacts. Block 138 may be substantially similar to block 122 of the method 100. Referring now to the examples of FIGS. 24A and 24B, the previously formed dummy gate structure 602 is removed from the substrate 202. The removal of the dummy gate structure 602 results in an opening or trench.

In some embodiments, in the first region 206, a final gate structure 1202A may be subsequently formed in the trench or opening over the fin elements 306a and 306b in the channel region, so that the fin elements 306a and 306b become the fins of a FinFET 2402.

In some embodiments, in the second region 208, a final gate structure 1202B may be subsequently formed in the trench or opening over the fin element 306c in the channel region, so that the fin element 306c becomes the fin of a FinFET 1210. In some embodiments, a final gate structure 1202C may be subsequently formed in the trench or opening over the fin element 306d in the channel region, so that the fin element 306d becomes the fin of a FinFET 1212.

In some embodiments, block 138 continues to include forming of source/drain contacts. In some embodiments, in the first region 206, a source/drain contact 1204A may be formed over the source/drain feature 2202 in the source/drain region of the FinFET 2402. The source/drain contact 1204A may include a silicidation feature 1206A having a U-shaped cross-section. In some embodiments, the silicidation feature 1206A may include a bottom surface having a width 1214 contacting the source/drain feature 2202, and two sidewalls contacting the source/drain feature 2202. In some embodiments, the width 1214 may be equal to or greater than a width 318 between outer sidewalls of the adjacent fin elements 306a and 306b. In some embodiments, the width 1214 is between about 40 nm and 100 nm.

In some embodiments, in the second region 208, a source/drain contact 1204B may be formed over the source/drain feature 1008 in the source/drain region of the FinFET 1210. The source/drain contact 1204B may include a silicidation feature 1206B having a bottom surface having a width 312 contacting the source/drain feature 1008. In some embodiments, a source/drain contact 1204C may be formed over the source/drain feature 1010 in the source/drain region of the FinFET 1212. The silicidation feature 1206C may include a bottom surface having a width 312 contacting the source/drain feature 1010.

In some embodiments, the removal of the dummy gate structure and formation of the gate structure and source/drain contact may be substantially similar to those discussed above with reference to block 122, gate structures 1202A, 1202B, 1202C, and source/drain contacts 1204A, 1204B, and 1204C of FIGS. 12A and 12B.

While the exemplary FIGS. 24A and 24B illustrate two fin elements in the FinFET 2402, in various embodiments, the FinFET 2402 may include any number of fin elements. Furthermore, while the exemplary FIGS. 24A and 24B illustrate that two single-fin FinFETs 1210 and 1212 include the fin element 306c and 306d respectively, in some embodiments, a multiple-fin FinFET may include both the fin elements 306c and 306d, and in some embodiments, a first multiple-fin FinFET may include the fin element 306c, and a second multiple-fin FinFET may include the fin element 306d.

In some embodiments, the first region 206 is a core region including various logic devices. In one example, the FinFET 2402 may be used to form a logic device, for example, a logic gate such as NAND, NOR, and/or inverter in the core region. In some embodiments, the second region 208 is an SRAM region including SRAM cells, and the FinFETs 1210 and 1212 may be transistors (e.g., PMOS pull-up transistor, NMOS pull-down transistor, and/or NMOS pass-gate transistor) of the same SRAM cell or different SRAM cells.

Referring now to FIGS. 1A and 1D, in an exemplary embodiment of the method 100, after block 112, the method 100 proceeds to the branch C, where a protective layer covering the first region but not the second region may be used to protect the first region during a subsequent implantation process. A second spacer layer may also be formed over the first region and second region. In such embodiments, the growth of the source/drain features in the first region is not laterally constrained by any spacers along sidewalls of the fin elements, while the growth of the source/drain features in the second region is laterally constrained by spacers including two layers disposed along sidewalls of the fin elements in the second region. This is illustrated by the semiconductor structure 200D as illustrated in FIGS. 25A, 25B, 26, 27A, 27B, 28, 29, 30, 31A, 31B, 32A, 32B, 33, 34A, and 34B.

Figure 25A:
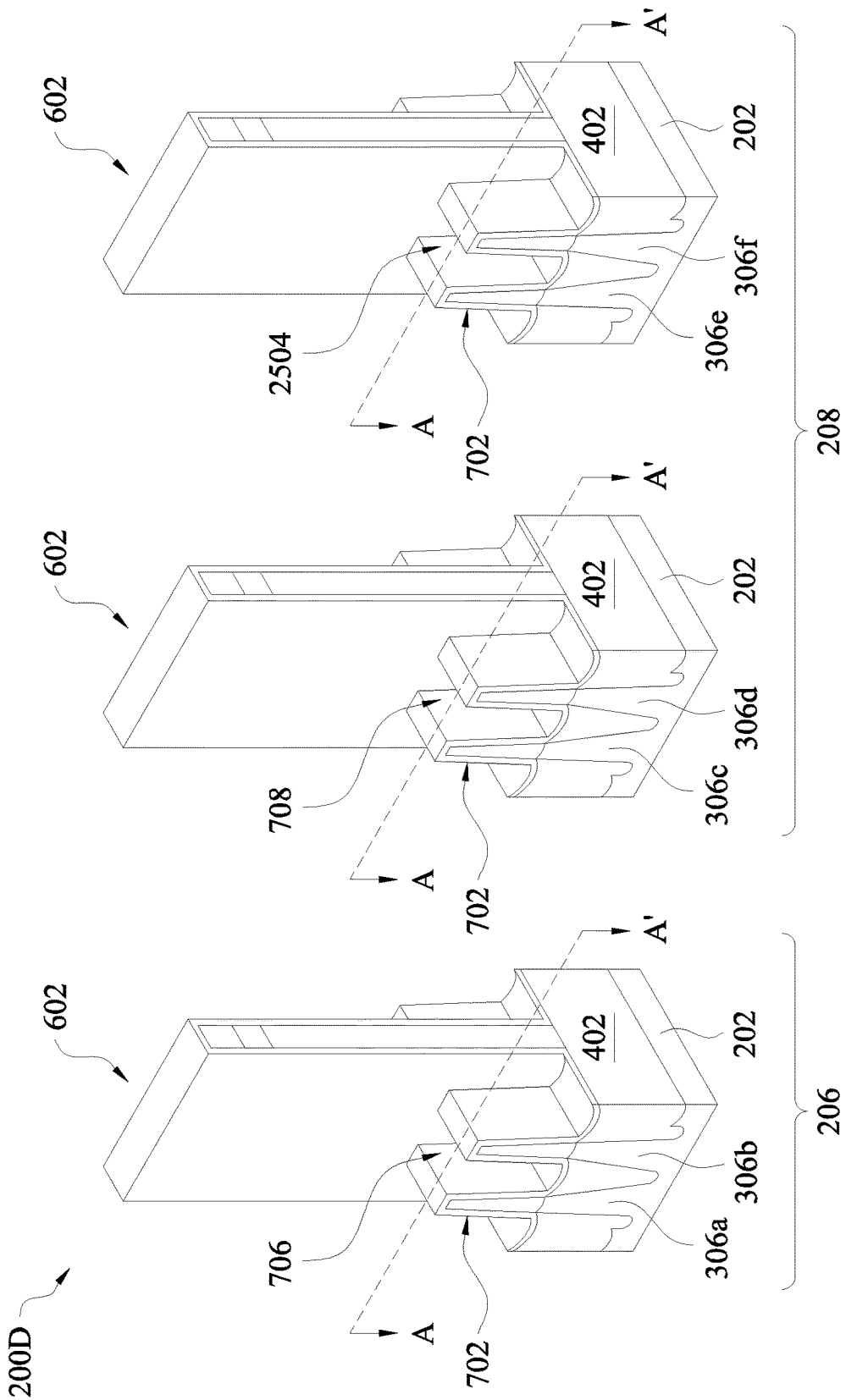
FIGS. 25A, 26, 27A, 28, 29, 30, 31A, 32A, 33, 34A are isometric views of an embodiment of the semiconductor structure 200D according to aspects of the method of FIGS. 1A, 1B, 1C, and 1D.
Figure 25B:
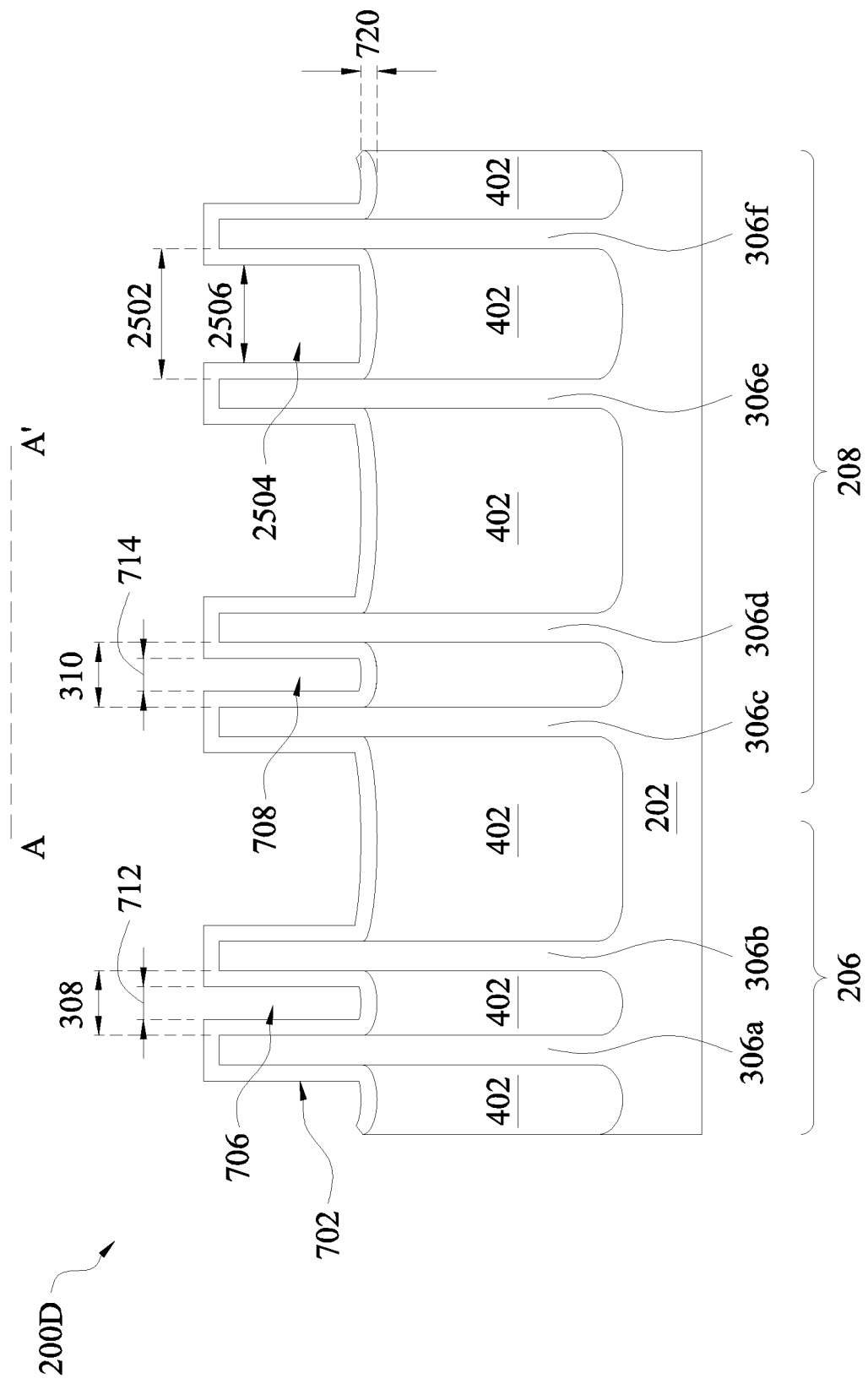
FIG. 25B is a cross-sectional view corresponding to the isometric view of FIG. 25A of an embodiment of the semiconductor structure 200D according to aspects of the method of FIGS. 1A, 1B, 1C, and 1D.

Referring now to the example of FIGS. 25A and 25B, illustrated therein is a semiconductor structure 200D after block 112 is completed according to an exemplary embodiment of the method 100. As illustrated in FIGS. 25A and 25B, in some embodiments, the semiconductor structure 200D includes a first region 206 and a second region 208. The first region 206 includes two adjacent fin elements 306a and 306b. The second region 208 includes four fin elements 306c, 306d, 306e, and 306f. At this stage of fabrication, a first spacer layer 702 is disposed over the fin elements 306a, 306b, 306c, 306d, 306e, and 306f. In some embodiments, distances between adjacent fin elements (also referred to as fin distance) are controlled so as to result in a desired fin distance 308 of fin elements 306a and 306b, a desired fin distance 310 of fin elements 306c and 306d, and a desired fin distance 2502 of fin elements 306e and 306f. In an embodiment, the fin distance 308 is between approximately 30 nanometers (nm) and approximately 60 nm. In an embodiment, the fin distance 310 is between approximately 30 nm and approximately 60 nm. In an embodiment, the fin distance 2502 is between approximately 30 nm and approximately 60 nm. In an embodiment, the fin distance 310 is substantially equal to the fin distance 308. In an embodiment, the fin distance 310 is greater than the fin distance 308 (e.g., by more than about 20%). In an embodiment, the fin distance 2502 is greater than the fin distance 310 (e.g., by more than about 20%).

In some embodiments, a trench 706 is formed between the fin elements 306a and 306b, and has a trench width 712. A trench 708 is formed between the fin elements 306c and 306d, and has a trench width 714. A trench 2504 is formed between the fin elements 306e and 306f, and has a trench width 2506. In some embodiments, the trench widths 712, 714, and 2506 may be affected by the fin distances 308, 310, 2504, and a thickness 720 of the first spacer layer 702.

Figure 26:
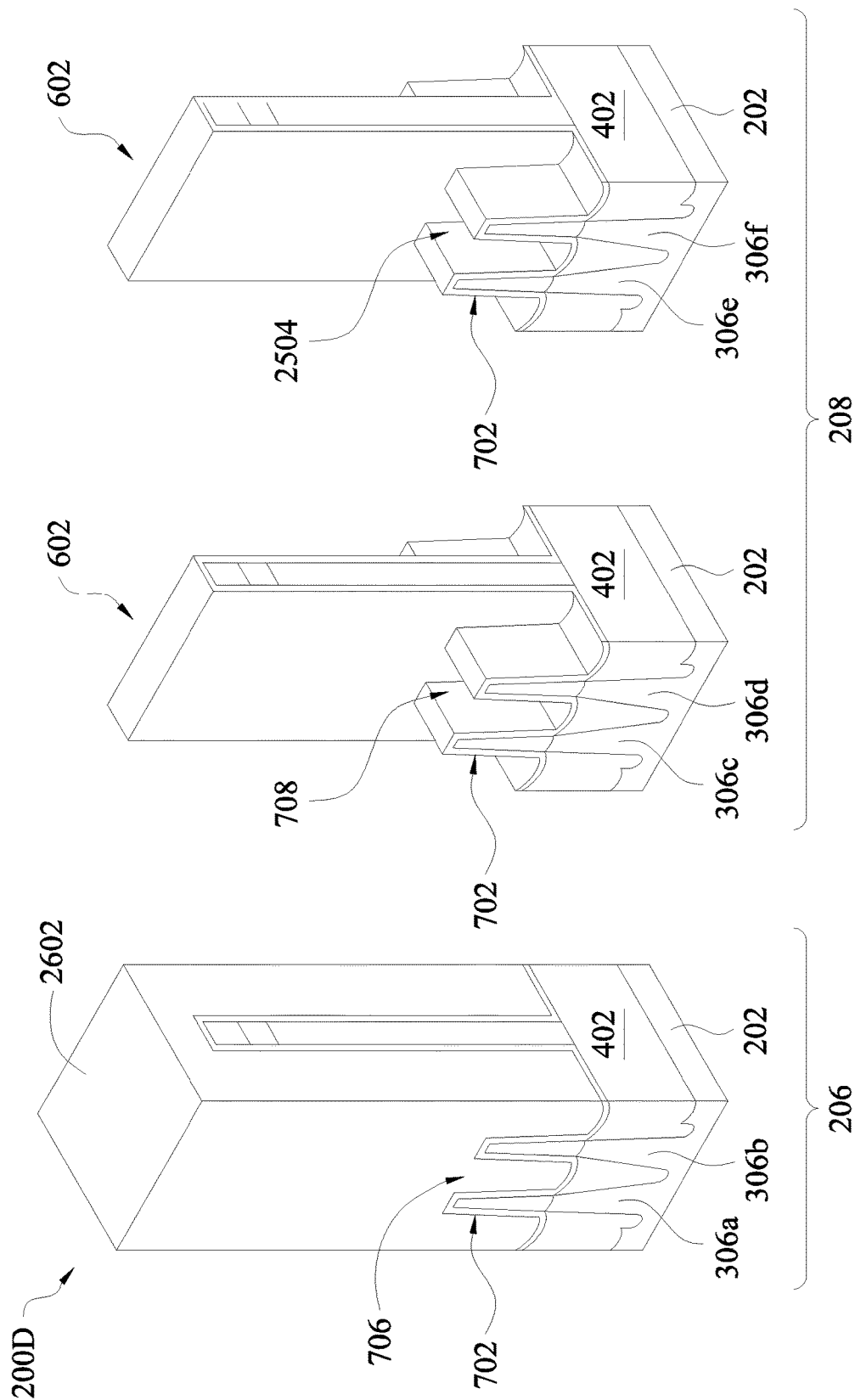

Referring now to FIGS. 1D and 26, the method 100 proceeds to block 140, where a protective layer is formed in the first region, while the second region is exposed. Referring to the example of FIG. 26, a protective layer 2602 may be formed in the first region 206, covering the fin elements 306a and 306b. In some embodiments, the protective layer 2602 includes a photoresist material, and may be formed by a lithography process over the substrate 202. The protective layer 2602 may include an opening exposing the second region 208 while protecting the first region 206.

Figure 27A:
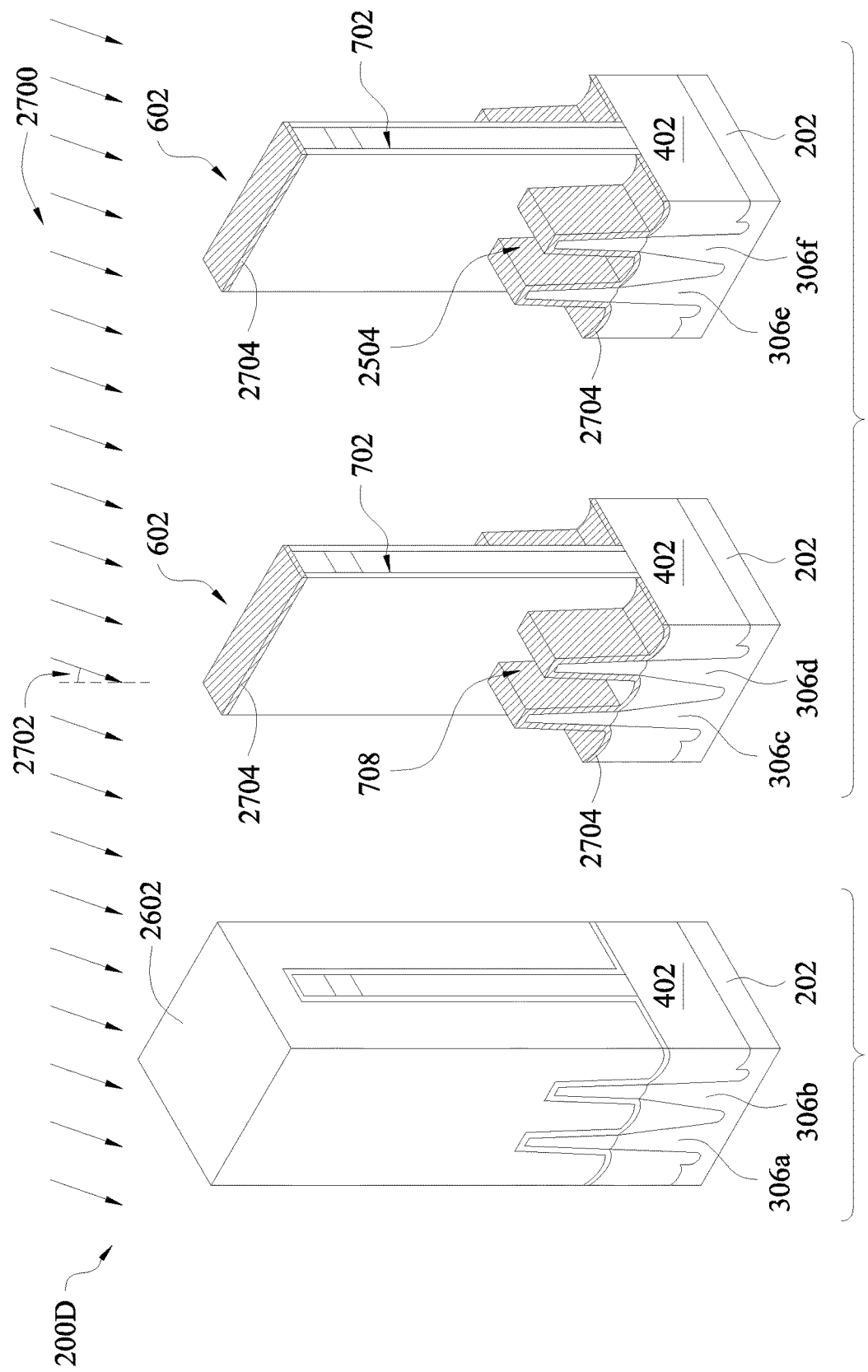

Referring now to FIGS. 1D, 27A, and 27B, the method 100 proceeds to block 142, an implantation process is performed so that the first spacer layer includes an implanted portion. Referring to the example of FIGS. 27A and 27B, an implantation process 2700 is performed to the semiconductor structure 200D. In some embodiments, the implantation process 800 includes an ion implantation process implanting ions (e.g., carbon ions) to a portion of the first spacer layer 702, and form an implanted portion 2704 of the first spacer layer 702 in the second region 208. In some embodiments, the implanted portion 2704 may include portions of the first spacer layer 702 covering the top surfaces of dummy gate structure 602, the fin elements 306a, 306b, 306c, and 306d, and the STI features 302 in the source/drain region in the second region 208.

In some embodiments, the implantation process 2700 is a tilted implantation applied to the first spacer layer 702 with a tilt angle 2702. In some embodiments, the tilt angle 2702 of the implantation process is controlled so that in the source/drain regions of the fin elements 306a, 306b, 306c, and 306d, all of the first spacer layer 702 in the source/drain regions in the second region 208 (e.g., including the portions defining the trenches 708 and 2504) are implanted. In some embodiments, the tilt angel 2702 may be in a range of between about 10 degrees to about 45 degrees.

In some embodiments, the implantation process 2700 includes two steps: the first step is an ion implantation with the tilt angle 2702 toward the left, so that the ion beam is toward the left sidewalls of the trenches 708 and 2504, and the second step is another ion implantation with the tilt angle 2702 toward the right, so that the ion beam is toward the right sidewalls of the trenches 708 and 2504.

In some embodiments, the first spacer layer 702 (e.g., portions disposed along sidewalls of the dummy gate structure 602) in the second region 208 are substantially unaffected by the implantation process 800. To the extent that any ions are implanted into these portions, they are sufficiently low in quantity and concentration so as to be negligible for the purposes of the present disclosure.

Referring now to FIG. 27B, illustrated therein is a simplified top view of the semiconductor structure 200D, where only the fin elements 306a, 306b, 306c, 306d, 306e, and 306f and the dummy gate structure 602 are illustrated. In some embodiments, the implantation process 2700 is controlled (e.g., by controlling a twist angle) so that the first spacer layer 702 along the sidewalls of the dummy gate structure 602 is not implanted by the implantation process 2700. As illustrated in FIG. 27B, in some embodiments, this may be achieved by applying the implantation process 2700 in a direction parallel to the sidewalls of the dummy gate structure 602, so that the first spacer layer 702 along the sidewalls of the dummy gate structure 602 remain substantially the same.

In some embodiments, the dopant concentration in the implanted portion 2704 is controlled (e.g., by controlling dopant species, ion beam energy, implantation dose of the implantation process 2700) so as to result in desired etch characteristics (e.g., a desired etch rate) of the implanted portion 2704. In some embodiments, the implanted portion 2704 may include a dopant concentration greater than the dopant concentration of the other portion of the first spacer layer 702 (e.g., by more than 10% by weight). In one example, the difference between the dopant concentrations in the implanted portion 2704 and the other portion of the first spacer layer 702 is between about 10% to about 50%. In some examples, an etch rate of the other portion of the first spacer layer 702 is greater than the etch rate of the implanted portion 2704 (e.g., by more than three times) in the subsequent etching process.

Meanwhile, the protective layer 2700 protects the various layers (including the first spacer layer 702) underneath in the first region 206 from being implanted by the ions in the implantation process 2700. In other words, while ions are implanted into portions of the first spacer layer 702 in the second region 208, no ions are implanted into the first spacer layer 702 in the first region 206 due to the presence of the protective layer 2602.

Figure 28:
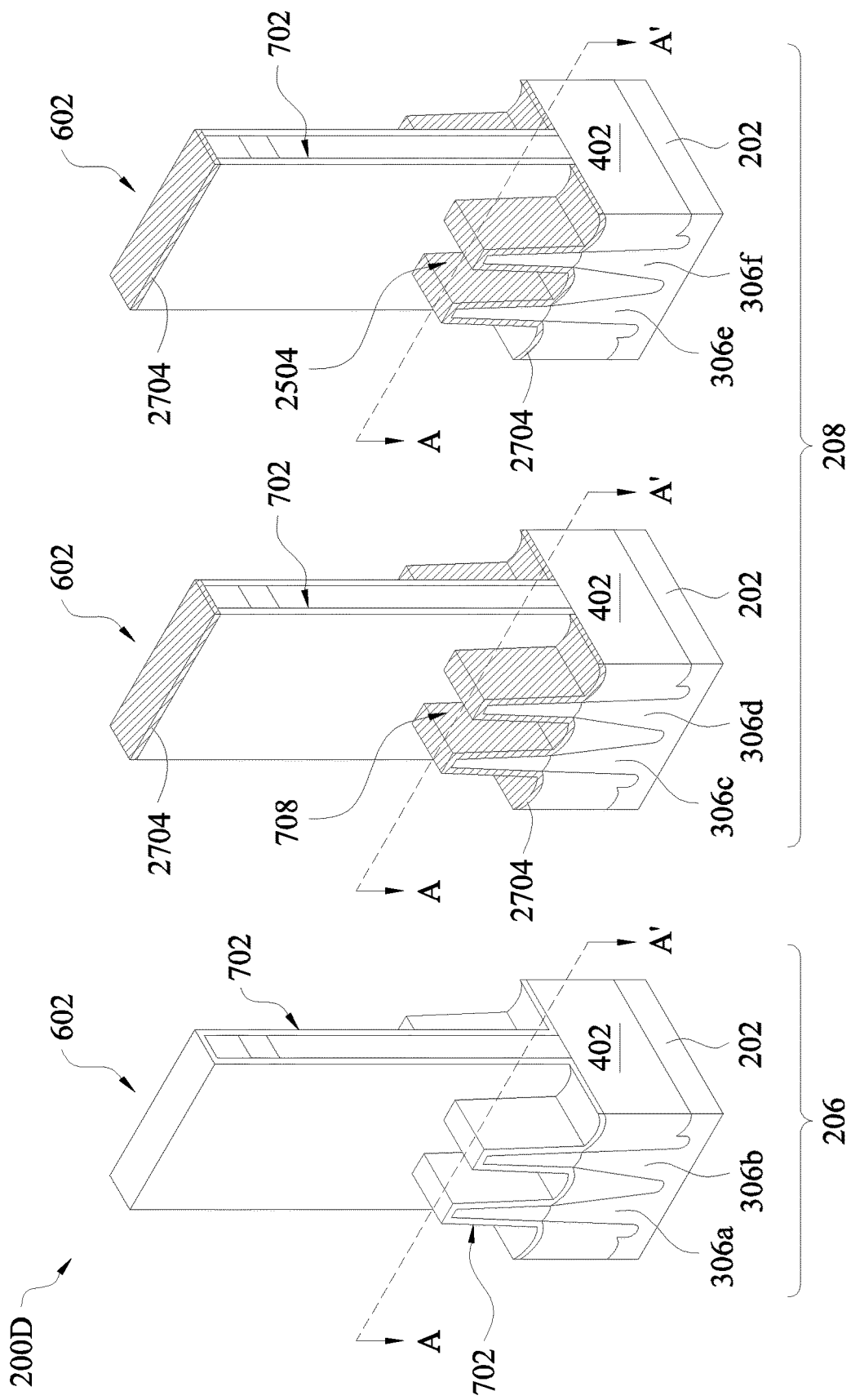

Referring now to FIGS. 1D and 28, the method 100 proceeds to block 144, where the protective layer in the first region is removed. Referring to the example of FIG. 28, in the first region 206, the protective layer 2602 is removed to expose the first spacer layer 702 in the first region 206. In some embodiments, the protective layer 2602 may be removed by a photoresist stripping or ashing process.

Figure 29:
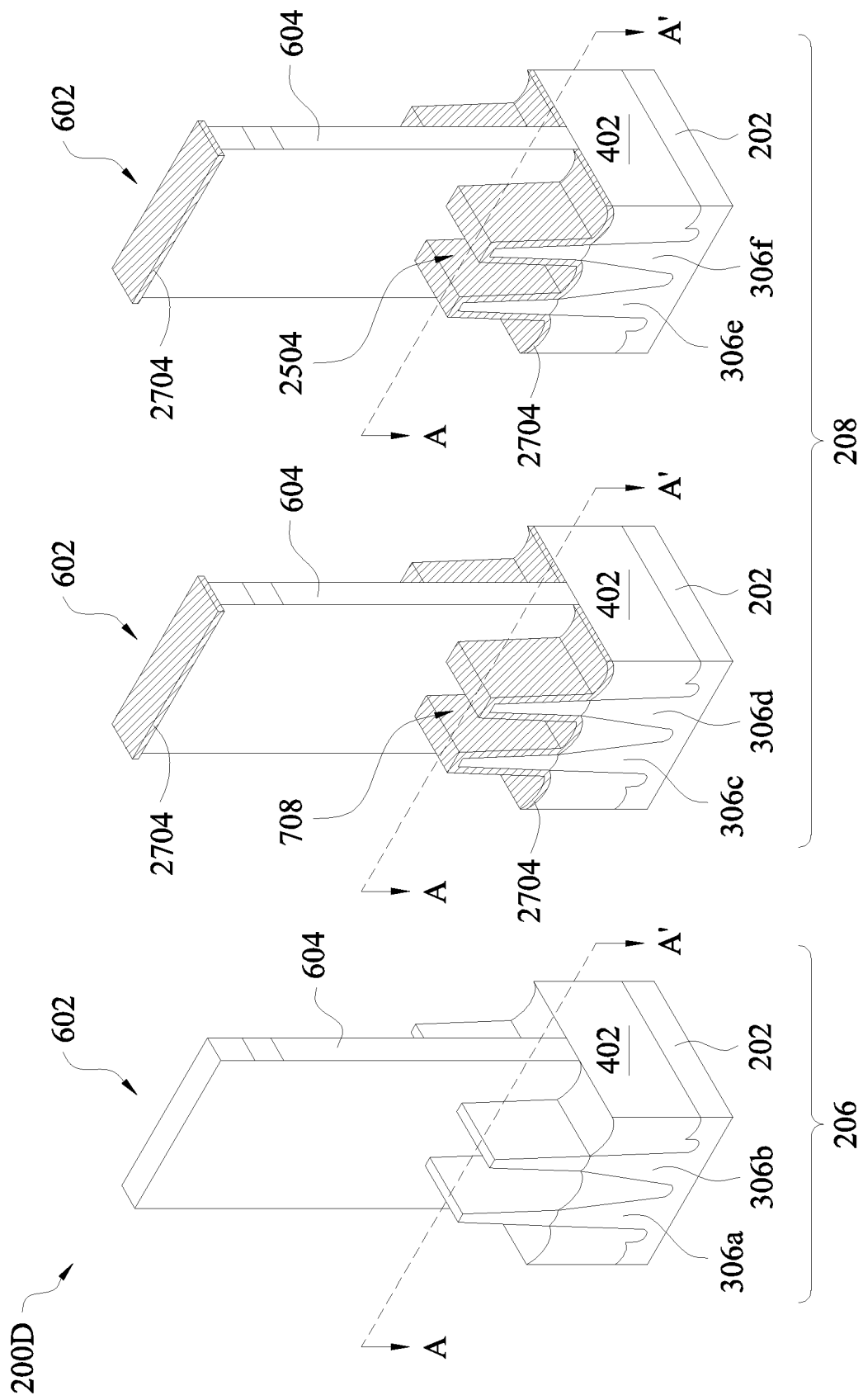

Referring now to FIGS. 1D and 29, the method 100 proceeds to block 146, where an etching process is performed to remove the first spacer layer excluding the implanted portion 2704. Referring to the example of FIG. 29, in an exemplary embodiment of block 146, an etching process is performed on remove the first spacer layer 702 excluding the implanted portion 2704 in both the first region 206 and second region 208. In some embodiments, the etching process includes a dry etching process using an etchant including a fluorine-containing gas, a chlorine-containing gas, other etching gas, or a combination thereof, such as $CF_4$, $SF_6$, $NF_3$, or $Cl_2$. In some embodiment, the etching conditions are controlled (e.g., by controlling an etchant, and/or an etching time) so as to completely remove the first spacer layer 702 in the first region 206, while the implanted portion 2704 of the first spacer layer 702 in the source/drain region in the second region 208 remain substantially un-etched. In some embodiments, the etchant may be chosen to achieve desired etch selectivity for the implanted portion 2704 and the other portion of the first spacer layer 702. In one example, where carbon ions are implanted during the implantation process 2700, the etchant may be oxygen free or has an oxygen concentration less than about 10% by weight.

In some embodiments, because of the different etching characteristics of the implanted portion 2704 and the other portion of the first spacer layer 702, after the etching process is performed, in the first region 206, the first spacer layer 702 is removed, exposing the fin elements 306a and 306b, the dummy gate structure 602, and the STI features 402. In some embodiments, after the etching process is performed, in the second region 208, the implanted portion 2704 remains in the source/drain region, while the first spacer layer 702 disposed along sidewalls of the dummy gate structure 602 are removed, exposing the sidewalls of the dummy gate structure 602.

Figure 30:
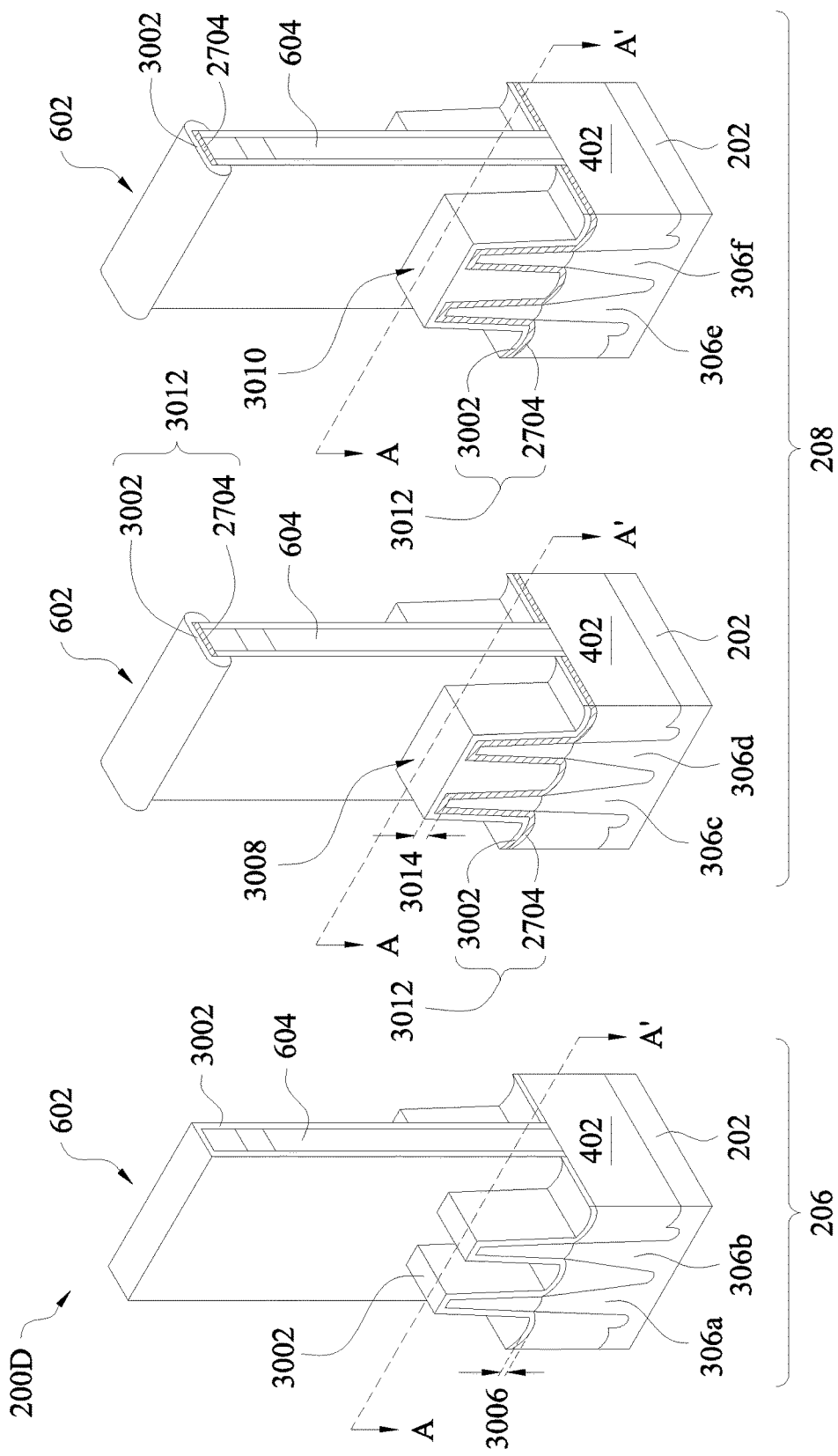

Referring to the example of FIG. 30, a second spacer layer 3002 is formed conformably over the substrate 202 including the sidewalls of the dummy gate structure. The second spacer layer may be a conformal dielectric layer formed on the substrate 202. By way of example, the spacer material of the second spacer layer 3002 may include a dielectric material such as silicon oxide, silicon nitride, silicon carbide, silicon oxynitride, SiCN films, silicon oxycarbide, SiOCN films, and/or combinations thereof. In some embodiments, the second spacer layer 3002 may include multiple layers, such as main spacer walls, liner layers, and the like. In some embodiments, the spacer material of the second spacer layer 3002 may be the same material as the spacer material of the first spacer layer 702. In some embodiments, the spacer materials of the second spacer layer 3002 and the first spacer layer 702 are different. By way of example, the second spacer layer 3002 may be formed by depositing a dielectric material using processes such as, CVD process, a subatmospheric CVD (SACVD) process, a flowable CVD process, an ALD process, a PVD process, or other suitable process. In some embodiments, the second spacer layer 3002 has a thickness 3006 between about 5 nm and about 10 nm.

In some embodiments, in the first region 206, because the first layer 702 has been removed from the first region 206, the second spacer layer 3002 may directly contact the fin elements 306a and 306b in the source/drain region, and/or the sidewalls of the dummy gate structure 602. In some embodiments, in the second region 208, the second spacer layer 3002 is formed over the implanted portion 2704 of the first spacer layer 702 in the source/drain regions, along the sidewalls of the dummy gate structure 602, and over the implanted portion 2704 of the first spacer layer 702 over the top surface of the dummy gate structure 6002.

In some embodiments, in the second region 208, the second spacer layer 3002 completely fills the trench 708 between the fin elements 306c and 306d, and forms a substantially planar surface 3008 over the fin elements 306c and 306d in the source/drain region. In some embodiments, the second spacer layer 3002 partially fills the trench 2504 between the fin elements 306e and 306f, and forms a trench 3010 between the fin elements 306e and 306f.

In some embodiments, at this fabrication stage, in the first region 206, a second spacer layer 3002 having a thickness 3006 is disposed over the fin elements 306a and 306b in the source/drain region. In contrast, in the second region 208, a combined spacer layer 3012 having a thickness 3014 greater than the thickness 3006 is disposed over the fin elements 306c, 306d, 306e, and 306f in the source/drain region, where the spacer layer 3012 includes implanted portions 2704 of the first spacer layer 702 and the second spacer layer 3002.

Figure 31A:
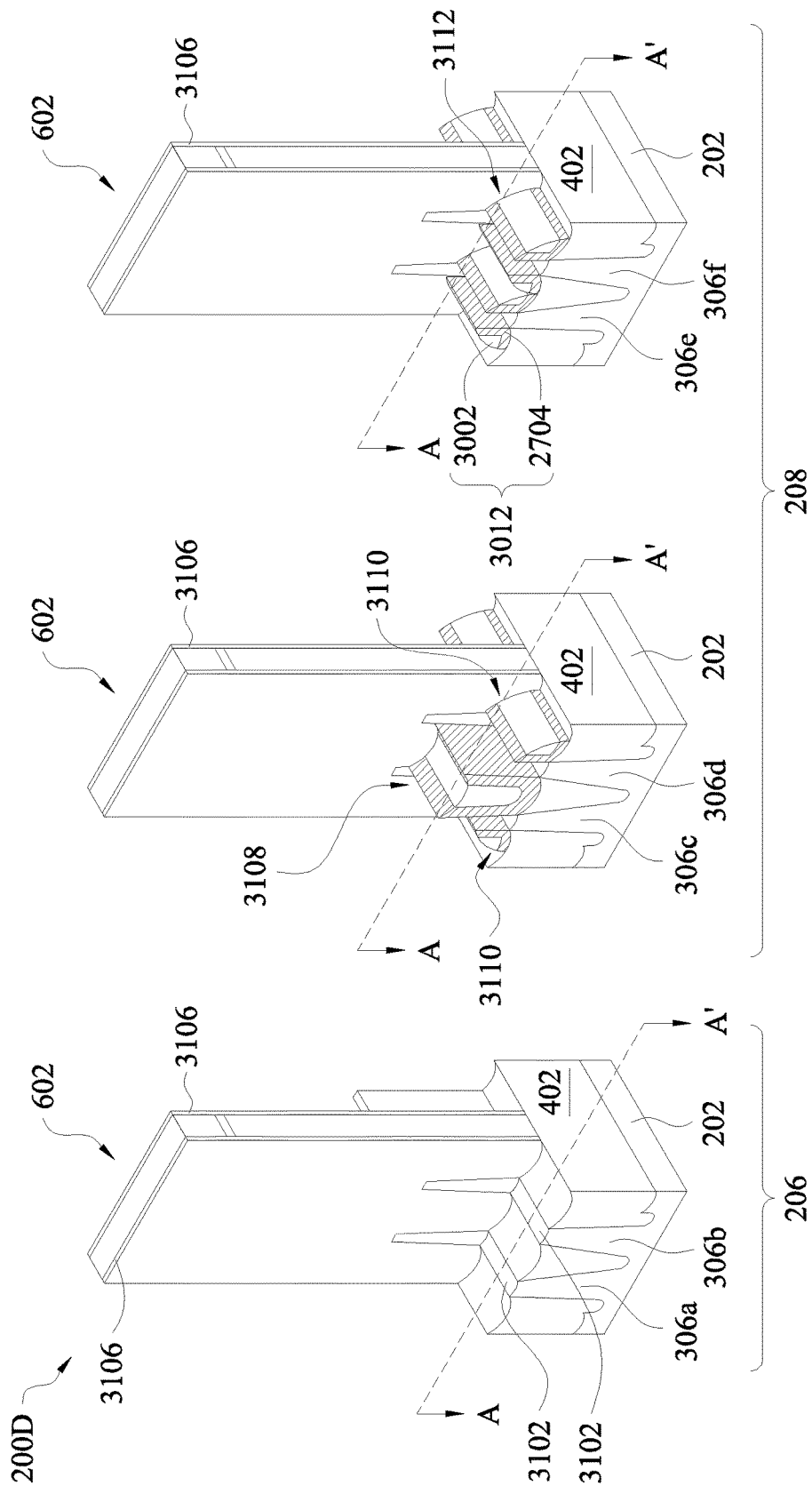
Figure 31B:
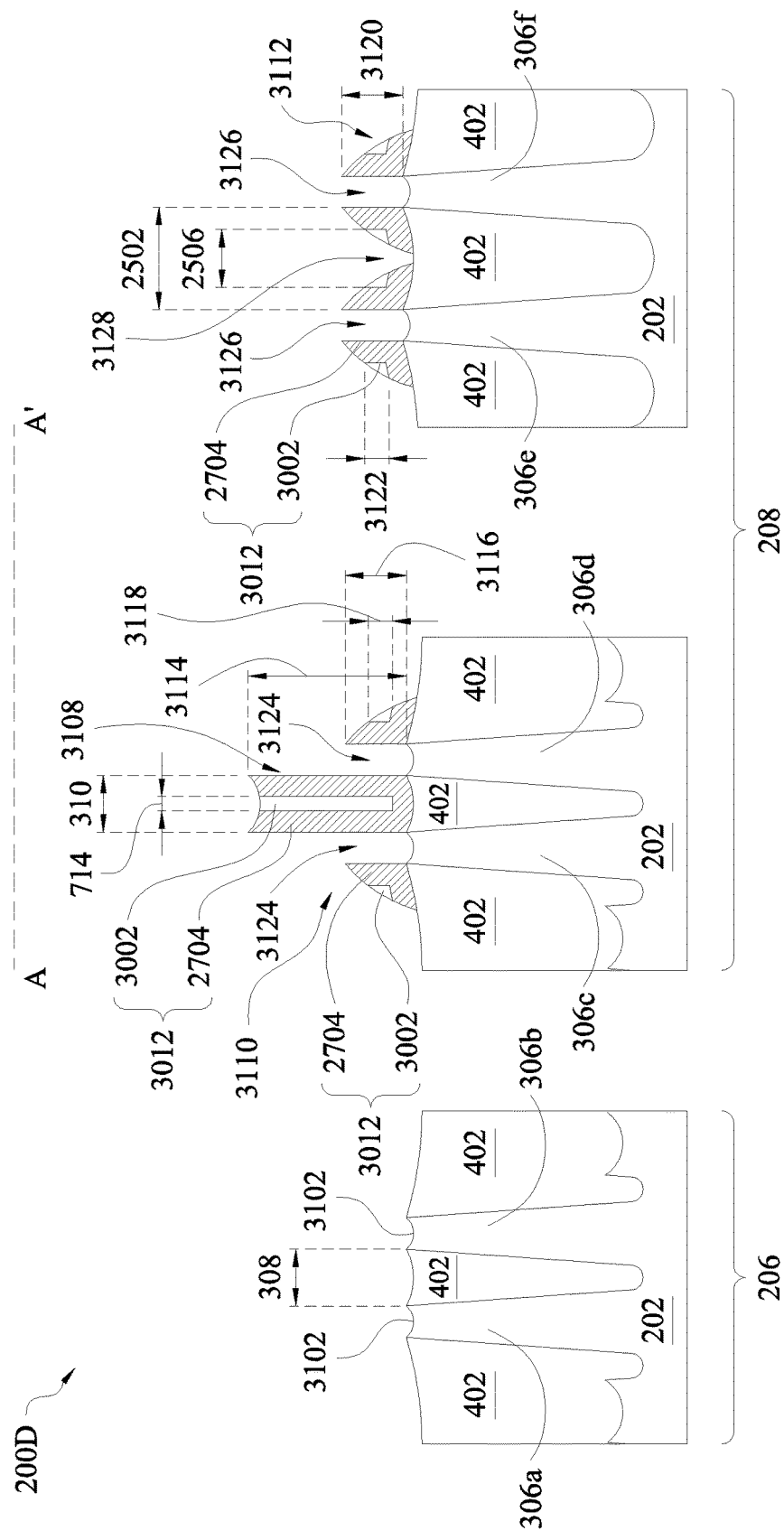
FIGS. 31B, 32B and 34B are cross-sectional views, corresponding to the isometric views of FIGS. 31A, 32A, and 34A, of an embodiment of the semiconductor structure 200D according to aspects of the method of FIGS. 1A, 1B, 1C, and 1D.

Referring now to FIGS. 1D, 31A, and 31B, the method 100 proceeds to block 150, where an etching process is performed to both the first and second regions, so that the first region does not include any spacers along sidewalls of the fin elements, while the second region includes spacers along sidewalls of the fin elements.

Referring to the example of FIGS. 31A and 31B, in an exemplary embodiment of block 150, an etching process is performed on both the first and second regions of the semiconductor structure 200D. Because of the different etching characteristics of the single second spacer layer 3002 disposed over the fin elements 306a and 306b in the first region 206 and the combined spacer layer 3012 disposed over the fin elements 306c, 306d, 306e, and 306f in the second region 208, different spacer configurations in the first region 206 and the second region 208 may be achieved by the etching process. In some embodiments, the etching process includes a dry etching process using an etchant including a fluorine-containing gas, a chlorine-containing gas, other etching gas, or a combination thereof, such as $CF_4$, $SF_6$, $NF_3$, or $Cl_2$.

In some embodiments, in the first region 206, the etching process removes all of the second spacer layer 3002 over the fin elements 306a and 306b and the STI features 402 in the source/drain region, so that the first region 206 does not include any spacers along the sidewalls of the fin elements 306a and 306b.

In some embodiments, in the second region 208, the etching process removes top portions of the combined spacer layer 3012 (e.g., portions over the fin elements 306c, 306d, 306e, and 306f, and the STI features 402) in the source/drain region to form spacers along sidewalls of the fin elements 306c, 306d, 306e, and 306f. Because the fin distance 310 of the adjacent fin elements 306c and 306d may be different from the fin distance 2502 of the adjacent fin elements 306e and 306f, different spacer configurations for the adjacent fin elements fin elements 306c and 306d and for the adjacent fin elements fin elements 306e and 306f in the second region 208 may be realized.

In some embodiments, for the adjacent fin elements 306c and 306d, a spacer 3108 (also referred to as an inner spacer 3108) is formed along the inner sidewalls of the fin elements 306c and 306d, and two spacers 3110 (also referred to as outer spacers 3110) are formed along the outer sidewalls of the fin elements 306c and 306d. In some embodiments, the etching process is controlled (e.g., by controlling an etching time) so as to result in desired heights of the inner spacer 3108 and outer spacers 3110. In some embodiments, the inner spacer has a desired height 3114 in a range of between about 15 nm to about 70 nm. In some embodiments, the outer spacers 3110 have a desired height 3116 in a range of between about 10 nm to about 40 nm. In some embodiments, the height 3114 is greater than the height 3116 (e.g., by at least about 30%). In one example, the height 3114 is greater than the height 3116 by a distance in a range of between about 5 nm to about 30 nm.

In some embodiments, each of the inner spacer 3108 and the outer spacers 3110 includes a combined spacer layer 3012, which includes the implanted portion 2704 of the first spacer layer 702 and a second spacer layer 3002. In some embodiments, in the outer spacers 3110, the second spacer layer 3002 may have a height 3118. In some embodiments, the height 3118 is less than the height 3116. In some embodiments, the height 3118 is in a range of between about 5 nm to about 30 nm.

In some embodiments, for the adjacent fin elements 306e and 306f, spacers 3112 having are formed along the inner sidewalls and outer sidewalls of the fin elements 306e and 306f. In some embodiments, the spacers 3112 disposed along inner sidewalls of the fin elements 306e and 306f are separated by a gap 3128. In some embodiments, the etching process is controlled (e.g., by controlling an etching time) so as to result in a desired height of the spacers 3112. In some embodiments, the spacers 3112 have a desired height 3110 substantially the same as the height 3116. In some embodiments, the height 3120 is in a range of between about 10 nm to about 40 nm. In some embodiments, each spacer 3112 includes a combined spacer layer 3012, which includes an implanted portion 704 of the first spacer layer 702 and a second spacer layer 3002. In some embodiments, in the spacer 3112, the second spacer layer 3002 may have a height 3122. In some embodiments, the height 3122 is substantially the same as the height 3118. In some embodiments, the height 3122 is in a range of between about 5 nm to about 30 nm.

In some embodiments, in both the first region 206 and the second region 208, the etching process does not substantially affect the second spacer layer 3002 disposed along the sidewalls of the dummy gate structure 602. In some embodiments, upper portions of the spacer layer (e.g., the second spacer layer 3002 in the first region 206, the combined spacer layer 3012 in the second region 208) disposed over the top dummy gate structure 602 are removed by the etching process, and spacers 3106 are formed along sidewalls of the dummy gate structure 602.

In some embodiments, top portions of the fin elements 306a, 306b, 306c, 306d, 306e, and 306f over the STI 402 are removed using the same etching process or a separate subsequent etching process. After removing the top portions of the fin elements, in the first region 206, top surfaces 3102 of the fin elements 306a and 306b substantially coplanar with a top surface of the STI features 402 are exposed in the source and drain region. In the second region 208, two trenches 3124 are formed between the inner spacer 3108 and outer spacers 3118, exposing top surfaces of the fin elements 306c and 306d respectively. Two trenches 3126 are formed between the spacers 3112, exposing top surfaces of the fin elements 306e and 306f respectively.

In some embodiments, the fin elements 306a, 306b, 306c, 306d, 306e, and 306f below the top surface of the STI features 402 are not exposed and thus, not etched during the etching process. Similarly, in some embodiments, the fin elements 306a, 306b, 306c, 306d, 306e, and 306f are not etched in the channel regions, which underlie the dummy gate structure 602.

Figure 32A:
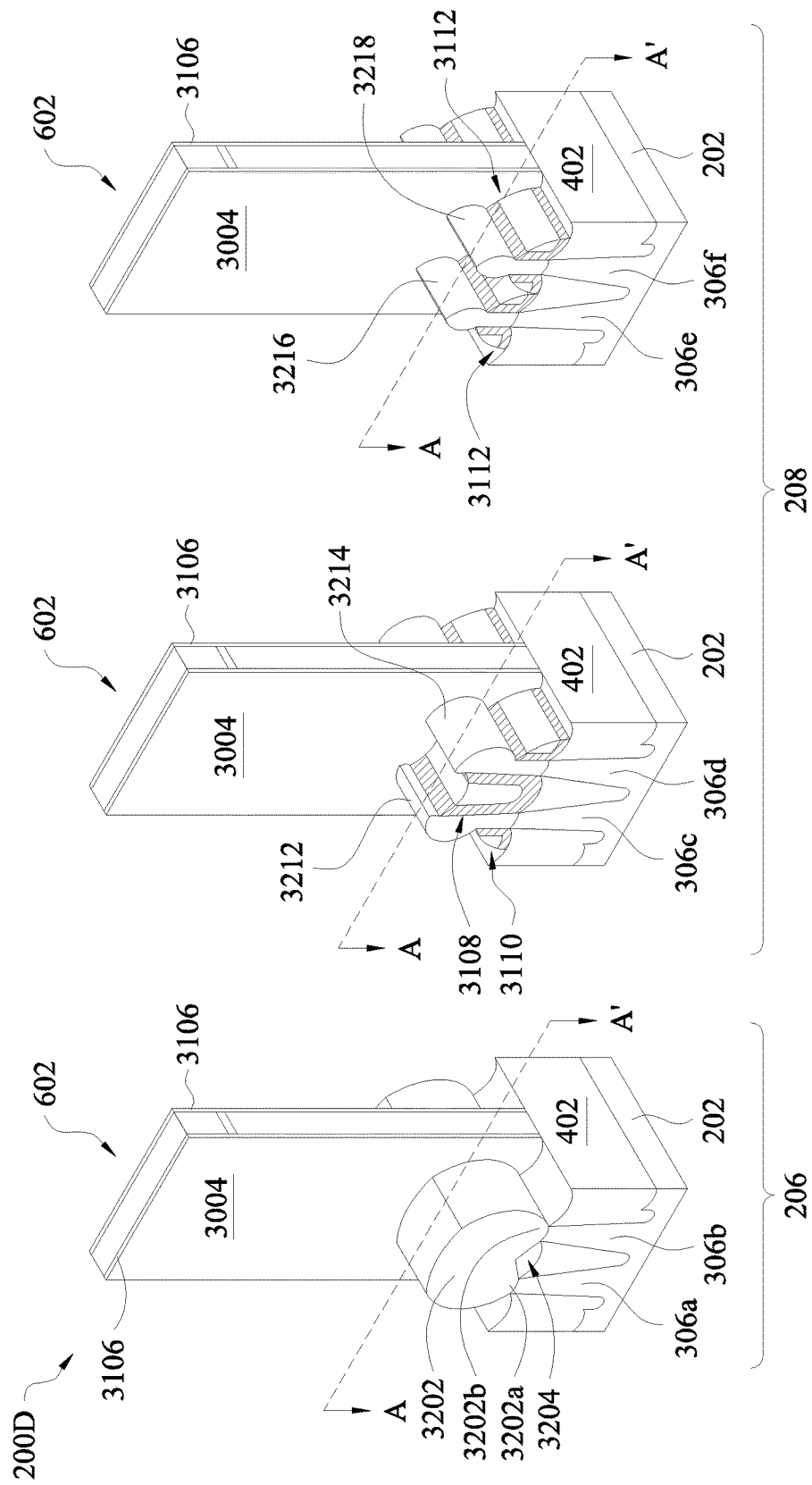
Figure 32B:
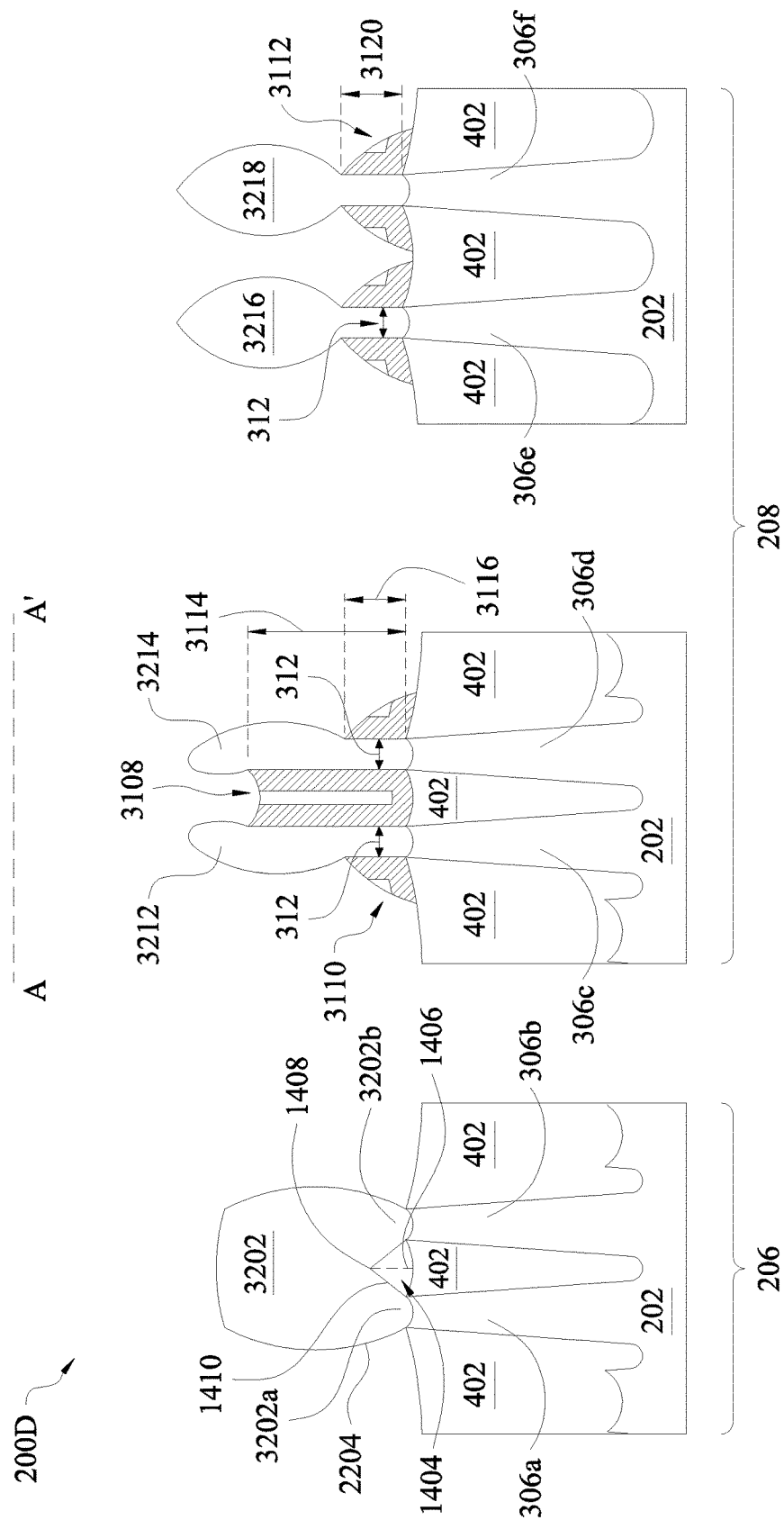

Referring to FIGS. 1D, 32A, and 32B, the method 100 proceeds to block 152, where source/drain features are formed in the first and second regions of the semiconductor structure 200D. Referring to the examples of FIGS. 32A and 32B, in some embodiments, in the first region 206, a source/drain feature 3202 is formed over the fin elements 306a and 306b. The growth of the source/drain feature 3202 is not laterally constrained any spacers. Specifically, the source/drain feature 3202 includes a source/drain feature 3202a and a source/drain feature 3202b formed by epitaxially growing a semiconductor material on the exposed surfaces of fin elements 306a and 306b respectively. The growth of each of the source/drain features 3202a and 3202b is not laterally constrained by any spacers. In some embodiments, the source/drain features 3202a and 3202b may include sidewalls 1410 and 2204 extending from inner sidewalls and outer sidewalls of the fin elements 306a and 306b in directions not perpendicular to a top surface of the STI features 402.

In some embodiments, the source/drain features 3202a and 3202b merge at a merge point 1408, and then grow into the source/drain feature 3202. A distance 1406 extends between the merge point 1408 and a top surface of the STI feature 402. In some embodiments, the distance 1406 is less than the height of the spacers 904. In some embodiments, the distance 1406 may be in a range of between about 1 nm and 5 nm. An air-gap 1404 between the source/drain feature 3202 and a top surface of the STI 402 may be formed. The air-gap 1404 has a substantially triangular-shape in the cross-section defined by the sidewalls 1410 of the respective epitaxial features 3202a and 3202b and a top surface of the STI features 402. In some embodiments, the air-gap 1404 has a height 1406.

In some embodiments, the sidewalls 1410 and 2204 may be facets facing toward the substrate 202. Alternatively, in some embodiments, upon completion of the growth process, the epitaxially grown material 3202 may have a curvilinear surface. The curvilinear surface may be formed by using a plurality of epitaxial growth processes to form the source/drain feature 3202, where each deposition is followed by an etching process. In an exemplary process, an etchant precursor (e.g., HCl) is provided in an epitaxially growth tool to provide the etching process in-situ with the epitaxial growth.

In some embodiments, in the second region 208, two source/drain features 3212 and 3214 include a material formed by epitaxially growing a semiconductor material on the fin elements 306c and 306d respectively. The growth of each of the source/drain features 3212 and 3214 may be laterally constrained on opposing sides by the outer spacer 3110 and the inner spacer 3108. In some embodiments, because the outer spacer 3110 and the inner spacer 3108 may have different heights, each of the source/drain features 3212 and 3215 may have a first sidewall defined by the outer spacer 3110 having a height 3116, and a second sidewall opposing the first sidewall defined by the inner spacer 3108 having a height 3114. In an example, after filling the trenches 3124 over the fin elements 306c and 306d respectively, the source/drain features 3212 and 3214 may protrude out of the trenches 3124. In some embodiments, the protruding portions of the source/drain features 3212 and 3214 do not merge.

In some embodiments, in the second region 208, two source/drain features 3216 and 3218 include a material formed by epitaxially growing a semiconductor material on the fin elements 306e and 306f respectively. The growth of each of the source/drain features 3216 and 3218 may be laterally constrained on opposing sides by the two spacers 3112 disposed along the respective fin element. Each of the source/drain features 3216 and 3218 may have two sidewalls defined by the spacers 3112 having a height 3120. In an example, after filling the trenches 3126 over the fin elements 306e and 306f respectively, the source/drain features 3216 and 3218 may protrude out of the trenches 3126. In some embodiments, the protruding portions of the source/drain features 3216 and 3218 do not merge.

In various embodiments, the grown semiconductor material of source/drain features 3202, 3212, 3214, 3216, and 3218 may be substantially similar to the semiconductor material of source/drain features 1002, 1008, and/or 1010 discussed above with reference to FIGS. 10A and 10B.

Figure 33:
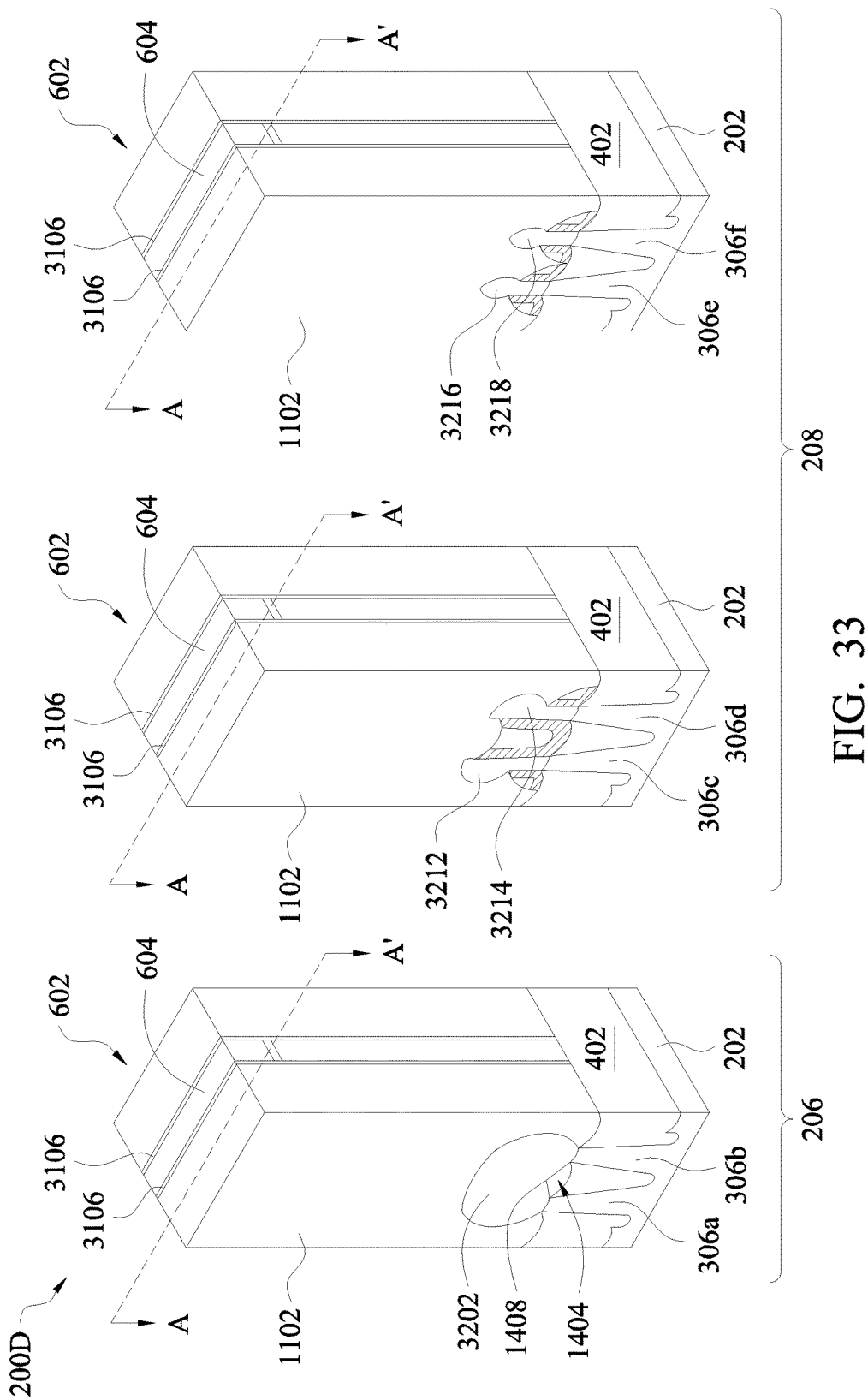

Referring to FIGS. 1D and 33, the method 100 proceeds to block 154, where an inter-layer dielectric (ILD) layer is formed. Block 154 may be substantially similar to block 120 of the method 100. Referring to the example of FIG. 33, in an embodiment of block 154, an ILD layer 1102 is formed over the substrate 202. In some embodiments, a contact etch stop layer (CESL) is also formed over the substrate 202 prior to forming the ILD layer 1102. The ILD layer 1102 may be substantially similar to the ILD layer 1102 discussed above with reference to FIGS. 11A and 11B. In some examples, after depositing the ILD layer 1102, a planarization process (e.g., CMP) may be performed to expose a top surface of the dummy gate structure 602, including, for example, removing the hard mask 606.

Figure 34A:
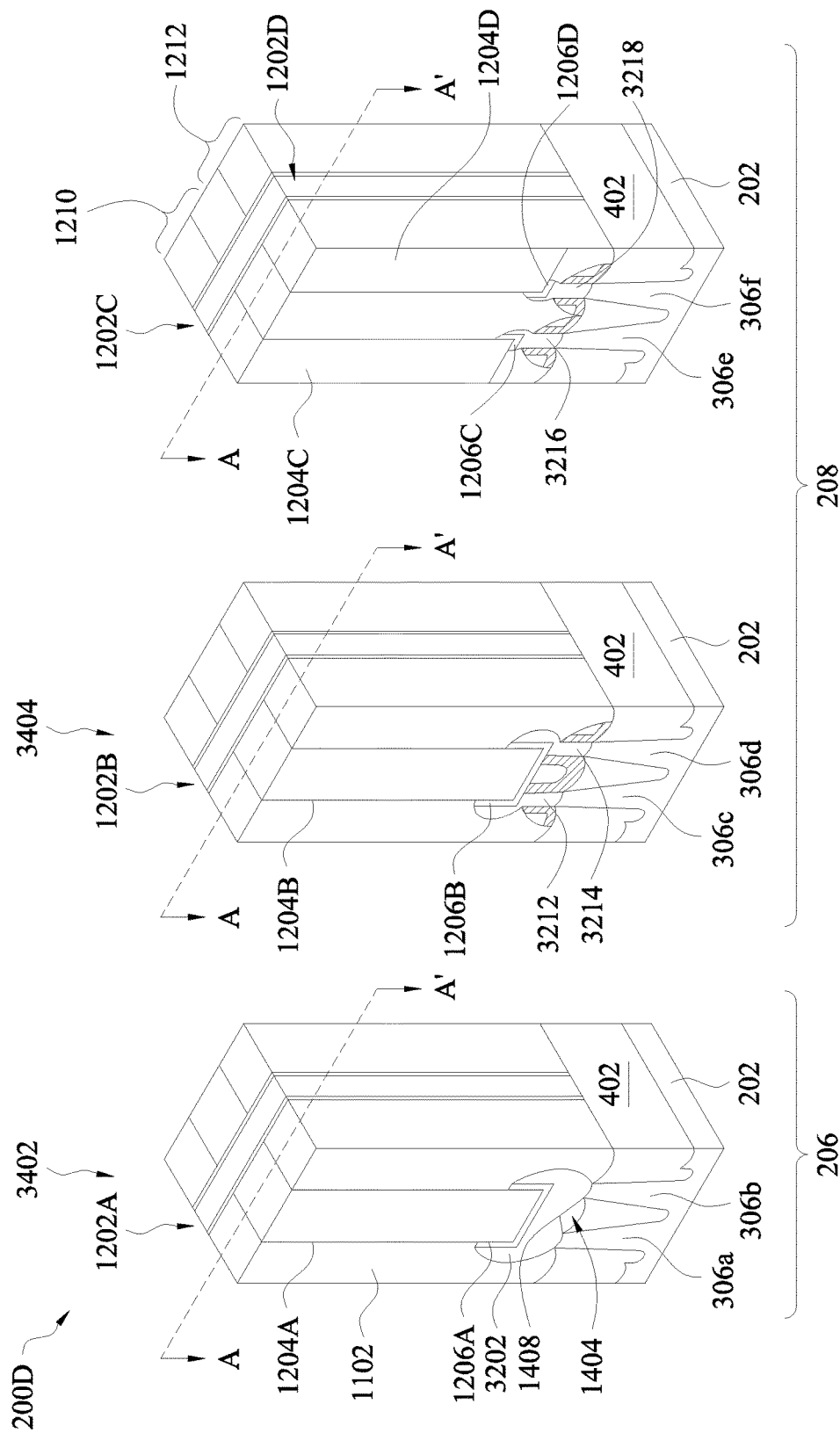
Figure 34B:
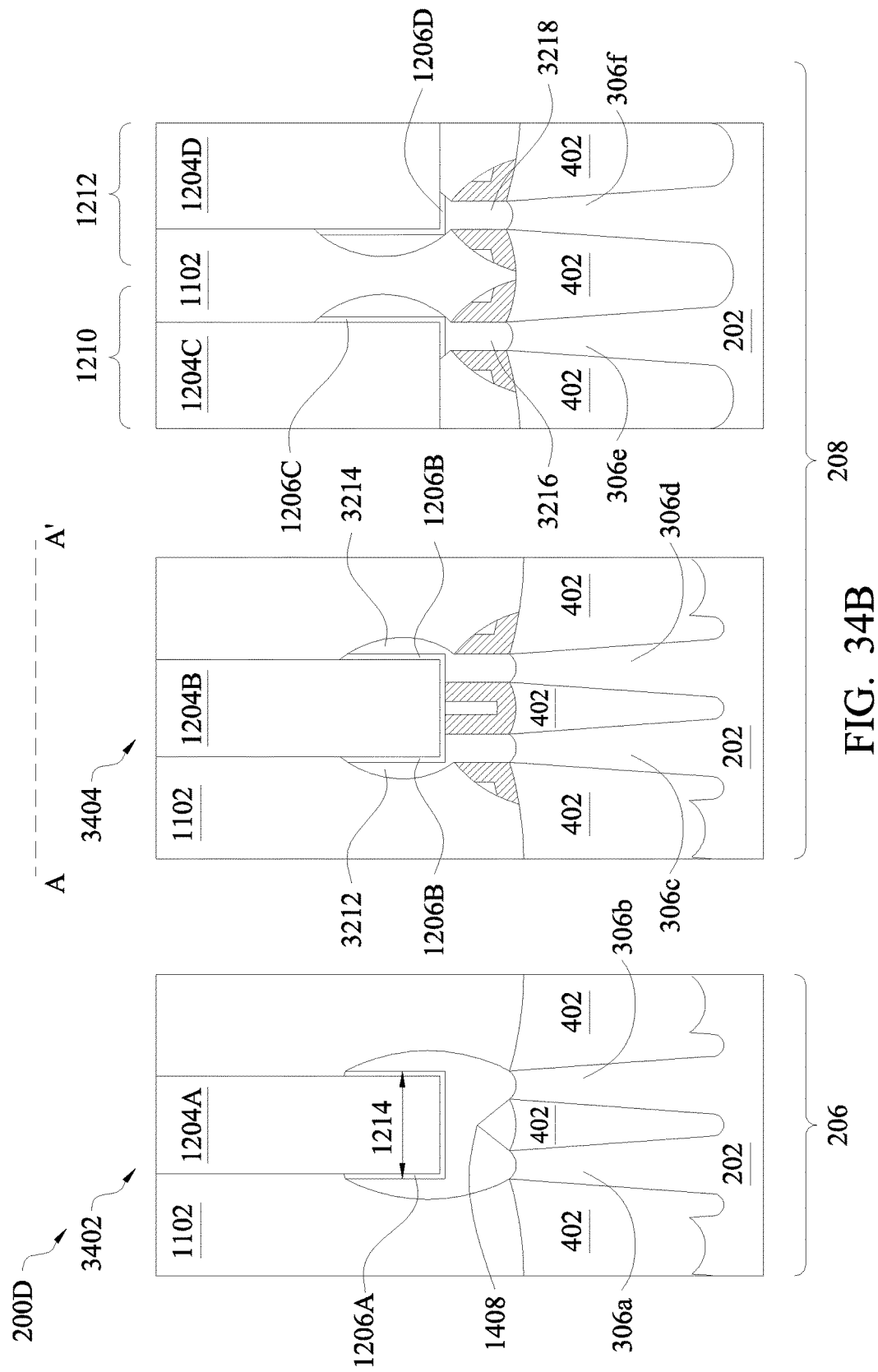

Referring now to FIGS. 1D, 34A, and 34B, the method 100 proceeds to block 156, where a replacement gate and source/drain contacts are formed. Block 156 includes removing the dummy gate structure or portion thereof and replacing it with a functional gate, for example, a high-k/metal gate stack. Block 156 may be substantially similar to block 122 of the method 100. Referring now to the examples of FIGS. 34A and 34B, the previously formed dummy gate structure 602 is removed from the substrate 202. The removal of the dummy gate structure 602 results in an opening or trench.

In some embodiments, in the first region 206, a final gate structure 1202A may be subsequently formed in the trench or opening over the fin elements 306a and 306b in the channel region, so that the fin elements 306a and 306b become the fins of a FinFET 3402.

In some embodiments, in the second region 208, a final gate structure 1202B may be subsequently formed in the trench or opening over the fin elements 306c and 306d in the channel region, so that the fin elements 306c and 306d become the fins of a FinFET 3404.

In some embodiments, in the second region 208, a final gate structure 1202C may be formed over the fin element 306e in the channel region, so that the fin element 306e becomes the fin of a FinFET 1210. Similarly, a final gate structure 1202D may be formed over the fin element 306f in the channel region, so that the fin element 306f becomes the fin of a FinFET 1212.

In some embodiments, block 156 continues to include forming of source/drain contacts. In some embodiments, in the first region 206, a source/drain contact 1204A is formed over the source/drain feature 3202 in the source/drain region of the FinFET 3402. The source/drain contact 1204A may include a silicidation feature 1206A having a U-shaped cross-section. In some embodiments, the silicidation feature 1206A may include a bottom surface having a width 1214 contacting the source/drain feature 3202, and two sidewalls contacting the source/drain feature 3202. In some embodiments, the width 1214 may be equal to or greater than a width 318 between outer sidewalls of the adjacent fin elements 306a and 306b. In some embodiments, the width 1214 is between about 40 nm and 100 nm.

In some embodiments, in the second region 208, a source/drain contact 1204B is formed over the source/drain features 3212 and 3214 in the source/drain region of the FinFET 3404. The source/drain contact 1204B may include a silicidation feature 1206B. A first portion of the silicidation feature 1206B may have an L-shaped cross-section interfacing the source/drain feature 3212. A second portion of the silicidation feature 1206B may have a reverse-L-shaped cross-section interfacing the source/drain feature 3214.

In some embodiments, in the second region 208, a source/drain contact 1204C may be formed over the source/drain feature 3216 in the source/drain region of the FinFET 1210. The source/drain contact 1204C may include a silicidation feature 1206C having a reverse-L-shaped cross-section interfacing the source/drain feature 3216. In some embodiments, a source/drain contact 1204D may be formed over the source/drain feature 3218 in the source/drain region of the FinFET 1212. The source/drain contact 1204D may include a silicidation feature 1206D having an L-shaped cross-section interfacing the source/drain feature 3216.

While the exemplary FIGS. 34A and 34B illustrate two fin elements in each of the FinFETs 3402 and 3404, in various embodiments, each of the FinFETs 3402 and 3404 may include any number of fin elements. Furthermore, while the exemplary FIGS. 34A and 34B illustrate that two single-fin FinFETs 1210 and 1212 include the fin element 306e and 306f respectively, in some embodiments, a multiple-fin FinFET may include both the fin elements 306e and 306f, and in some embodiments, a first multiple-fin FinFET may include the fin element 306e, and a second multiple-fin FinFET may include the fin element 306f.

In some embodiments, the first region 206 is a core region including various logic devices. In one example, the FinFET 3402 may be used to form a logic device, for example, a logic gate such as a NAND gate, a NOR gate, and/or an inverter in the core region. In some embodiments, the second region 208 is an SRAM region including SRAM cells, and the FinFETs 3404, 1210 and 1212 may be transistors (e.g., PMOS pull-up transistor, NMOS pull-down transistor, and/or NMOS pass-gate transistor) of the same SRAM cell or different SRAM cells.

Each of the semiconductor structures 200A, 200B, 200C, and/or 200D may undergo further processing to form various features and regions known in the art. For example, subsequent processing may form contact openings, contact metal, as well as various contacts, vias, wires, and multilayer interconnect features (e.g., metal layers and interlayer dielectrics) on the substrate 202, configured to connect the various features to form a functional circuit that may include one or more multi-gate devices. In furtherance of the example, a multilayer interconnection may include vertical interconnects, such as vias and contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 100, and some process steps described above may be replaced or eliminated in accordance with various embodiments of the method 100.

The embodiments of the present disclosure offer advantages over existing art, though it is understood that other embodiments may offer different advantages, not all advantages are necessarily discussed herein, and that no particular advantage is required for all embodiments. By using different fin sidewall spacer configurations for FinFETs in different regions of the same substrate, epitaxial growth of source/drain features of the FinFETs in a particular region may be controlled based on device performance and/or density requirements for the particular region. In some examples, a first region of the substrate includes outer spacers higher than inner spacers for neighboring fins of a same device, so that the epitaxial growth of source/drain features of neighboring fins of the same device are allowed to merge at a merge point lower than a height of the outer spacers. Accordingly, the volume of epitaxial source/drain feature of that device may be increased to achieve lower resistance and higher SiGe source/drain strain. In some examples, the first region of the substrate does not include any inner spacers for neighboring fins of a same device, which may further lower the merge point and increase the volume of the merged source/drain feature. In some examples, a first region of the substrate does not include any outer spacers, so that the lateral growth of the outer sidewalls of the source/drain feature of that device is not constrained by any spacers, which further increases the volume of the source/drain feature. In some examples, a second region of the substrate includes spacers along each sidewall of the fins, so that an epitaxial source/drain feature of a fin does not excessively protrude out of the fin and merge with epitaxial source/drain features of neighboring fins, thereby avoiding shortening with the neighboring devices and ensuring device density.

Thus, in an embodiment provided is a semiconductor device includes a substrate including first, second, and third fin elements. A first source/drain epitaxial feature is disposed over the first and second fin elements. A first portion of the first source/drain epitaxial feature disposed on the first fin element and a second portion of the first source/drain epitaxial feature disposed on the second fin element merge at a merge point. A second source/drain epitaxial feature is disposed over the third fin element. A first sidewall of the second source/drain epitaxial feature interfaces a first third-fin spacer disposed along a first sidewall of the third fin element. A second sidewall of the second source/drain epitaxial feature interfaces a second third-fin spacer disposed along a second sidewall of the third fin element. The merge point has a first height less than a second height of the first third-fin spacer.

In another embodiment, a semiconductor device includes a substrate including a first fin element, and a second fin element adjacent to the first fin element, and a shallow trench isolation (STI) feature disposed between the first and second fin elements. A first source/drain epitaxial feature is disposed on the first and second fin elements. A first sidewall of the source/drain epitaxial feature interfaces a first spacer disposed along a first first-fin sidewall of the first fin element facing away from the second fin element. A second sidewall of the source/drain epitaxial feature interfaces a second spacer disposed along a first second-fin sidewall of the second fin element facing away from the first fin element. An air-gap interposes the first source/drain epitaxial feature and the STI feature. The air-gap has a height less than a height of the first spacer, and is at least partially defined by a third sidewall and a fourth sidewall of the first source/drain epitaxial feature and a top surface of the STI feature.

In another embodiment, a method of semiconductor device fabrication includes providing a plurality of adjacent first fins extending from a substrate. The plurality of adjacent first fins include at least two adjacent inner first-fin sidewalls facing each other. A second fin extending from the substrate is provided. A first spacer layer of a first material is deposited over the substrate. An implantation process is performed to transform the first material in a first portion of the first spacer layer to a second material. The first material in a second portion of the first spacer layer remains substantially the same. A first etching process is performed to form two second-fin spacers along sidewalls of the second fin. A first epitaxial layer is deposited over the plurality of adjacent first fins. The first epitaxial layer has a plurality of first surfaces. Each of the plurality of first surfaces is disposed on one of the plurality of neighboring first fins. A second epitaxial layer is grown over the second fin. The growth of the second epitaxial layer is laterally constrained by the two second-fin spacers. The second epitaxial layer has a second surface disposed on the second fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a substrate including a first fin element, a second fin element, and a third fin element;
    a first source/drain epitaxial feature disposed over the first and second fin elements, wherein a first portion of the first source/drain epitaxial feature disposed on the first fin element and a second portion of the first source/drain epitaxial feature disposed on the second fin element merge at a merge point;
    a second source/drain epitaxial feature disposed over the third fin element,
    wherein a first sidewall of the second source/drain epitaxial feature interfaces a first third-fin spacer disposed along a first sidewall of the third fin element, and
    wherein a second sidewall of the second source/drain epitaxial feature interfaces a second third-fin spacer disposed along a second sidewall of the third fin element;
    wherein the merge point has a first height less than a second height of the first third-fin spacer.

2. The semiconductor device of claim 1, further comprising:
    a shallow trench isolation (STI) feature disposed between the first and second fin elements;
    an air-gap interposing the first source/drain epitaxial feature and the STI feature, wherein the air-gap is defined by at least a first sidewall of the first portion of the first source/drain feature, a second sidewall of the second portion of the first source/drain epitaxial feature, and a top surface of the STI feature, wherein the merge point is defined by the air-gap.

3. The semiconductor device of claim 1, wherein a third sidewall of the first source/drain epitaxial feature interfaces a first-fin spacer disposed along a second first-fin sidewall of the first fin element, and
    wherein a fourth sidewall of the first source/drain epitaxial feature interfaces a second-fin spacer disposed along a second second-fin sidewall of the second fin element.

4. The semiconductor device of claim 1, further comprising:
    a third source/drain epitaxial feature disposed over a fourth fin element disposed over the substrate,
    wherein the fourth fin element is adjacent to the third fin element,
    wherein a first distance between the first and second fin elements is less than a second distance between the third and fourth fin elements,
    wherein a first sidewall of the third source/drain epitaxial feature interfaces a first fourth-fin spacer disposed along a first sidewall of the fourth fin element, and
    wherein a second sidewall of the third source/drain epitaxial feature interfaces a second fourth-fin spacer disposed along a second sidewall of the fourth fin element.

5. The semiconductor device of claim 1, wherein each of the first and second third-fin spacers further includes:
    a first spacer layer disposed over the substrate; and
    a second spacer layer disposed over the first spacer layer.

6. The semiconductor device of claim 1, further comprising:
    a third spacer disposed between a fourth fin element and a fifth fin element disposed over the substrate,
    wherein a first sidewall of the third spacer interfaces a first fourth-fin sidewall of the fourth fin element, and
    wherein a second sidewall of the third spacer interfaces a first fifth-fin sidewall of the fifth fin element;
    a fourth spacer disposed along a second fourth-fin sidewall of the fourth fin element; and
    a fifth spacer disposed along a second fifth-fin sidewall of the fifth fin element;
    wherein a first height of the third spacer is greater than a second height of the fourth spacer.

7. The semiconductor device of claim 6, wherein each of the third, fourth, and fifth spacers includes:
    a first spacer layer disposed over the substrate; and
    a second spacer layer disposed over the first spacer layer.

8. The semiconductor device of claim 6, wherein the first height is at least about 30% greater than the second height.

9. A semiconductor device, comprising:
    a substrate including a first fin element, a second fin element adjacent to the first fin element, and a shallow trench isolation (STI) feature disposed between the first and second fin elements;
    a first source/drain epitaxial feature disposed on the first and second fin elements,
    wherein a first sidewall of the first source/drain epitaxial feature interfaces a first spacer disposed along a first first-fin sidewall of the first fin element facing away from the second fin element, and
    wherein a second sidewall of the first source/drain epitaxial feature interfaces a second spacer disposed along a first second-fin sidewall of the second fin element facing away from the first fin element;

an air-gap interposing the first source/drain epitaxial feature and the STI feature,
wherein the air-gap has a first height less than a second height of the first spacer, and is at least partially defined by a third sidewall and a fourth sidewall of the first source/drain epitaxial feature and a top surface of the STI feature.

10. The semiconductor device of claim 9, wherein the first height is less than about 30% of the second height.

11. The semiconductor device of claim 9, further comprising:
a third spacer disposed along a second first-fin sidewall of the first fin element facing toward the second fin element;
a fourth spacer disposed along a second second-fin sidewall of the second fin element facing toward the first fin element;
wherein a third height of the third spacer is less than the first height of the air-gap.

12. The semiconductor device of claim 9, wherein a first material of the third and fourth spacers has a first dopant concentration, and
wherein a second material of the first and second spacers has a second dopant concentration greater than the first dopant concentration.

13. The semiconductor device of claim 9, further comprising:
the difference between the second dopant concentration and the first dopant concentration is greater than about 10%.

14. The semiconductor device of claim 13, further comprising:
a second source/drain epitaxial feature disposed on a third fin element disposed over the substrate, wherein the second source/drain epitaxial feature interfaces two third-fin spacers disposed along sidewalls of the third fin element; and
a third source/drain epitaxial feature disposed on a fourth fin element adjacent to the third fin element, wherein the third source/drain epitaxial feature interfaces two third-fin spacers disposed along sidewalls of the third fin element;
wherein a first distance between the first and second fin elements is less than a second distance between the third and fourth fin elements.

15. A semiconductor device, comprising:
a substrate including a first fin element, a second fin element adjacent to the first fin element, a third fin element;
a first source/drain epitaxial feature disposed over the first and second fin elements, wherein a first portion of the first source/drain epitaxial feature disposed on the first fin element and a second portion of the first source/drain epitaxial feature disposed on the second fin element merge at a merge point;
a second source/drain epitaxial feature disposed over the third fin element;
wherein a first sidewall of the second source/drain epitaxial feature interfaces a first third-fin spacer disposed along a first sidewall of the third fin element, and
wherein the merge point has a first height less than a second height of the first third-fin spacer.

16. A semiconductor device of claim 15, further comprising:
a shallow trench isolation (STI) feature disposed between the first and second fin elements;
an air-gap interposing the first source/drain epitaxial feature and the STI feature, wherein the air-gap is defined by at least a first sidewall of the first portion of the first source/drain feature, a second sidewall of the second portion of the first source/drain epitaxial feature, and a top surface of the STI feature, wherein the merge point is defined by the air-gap.

17. The semiconductor device of claim 15, wherein a third sidewall of the first source/drain epitaxial feature interfaces a first-fin spacer disposed along a second first-fin sidewall of the first fin element, and
wherein a fourth sidewall of the first source/drain epitaxial feature interfaces a second-fin spacer disposed along a second second-fin sidewall of the second fin element.

18. The semiconductor device of claim 15, further comprising:
a fourth fin element adjacent to the third fin element;
a third source/drain epitaxial feature disposed over the fourth fin element,
wherein a second sidewall of the third source/drain epitaxial feature interfaces a first fourth-fin spacer disposed along a first sidewall of the fourth fin element, and
wherein the first height of the merge point is less than a third height of the first fourth-fin spacer.

19. The semiconductor device of claim 18,
wherein a first distance between the first and second fin elements is less than a second distance between the third and fourth fin elements,
wherein a first sidewall of the third source/drain epitaxial feature interfaces the first fourth-fin spacer disposed, and
wherein a second sidewall of the third source/drain epitaxial feature interfaces a second fourth-fin spacer disposed along a second sidewall of the fourth fin element.

20. The semiconductor device of claim 18, wherein each of the first third-fin spacer and the first fourth-fin spacer further includes:
a first spacer layer disposed over the substrate; and
a second spacer layer disposed over the first spacer layer.

* * * * *